US008394706B2

(12) United States Patent
Nuzzo et al.

(10) Patent No.: US 8,394,706 B2
(45) Date of Patent: Mar. 12, 2013

(54) PRINTABLE SEMICONDUCTOR STRUCTURES AND RELATED METHODS OF MAKING AND ASSEMBLING

(75) Inventors: Ralph G. Nuzzo, Champaign, IL (US); John A. Rogers, Champaign, IL (US); Etienne Menard, Durham, NC (US); Keon Jae Lee, Tokyo (JP); Dahl-Young Khang, Urbana, IL (US); Yugang Sun, Westmont, IL (US); Matthew Meitl, Raleigh, NC (US); Zhengtao Zhu, Rapid City, SD (US); Heung Cho Ko, Urbana, IL (US); Shawn Mack, Goleta, CA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 13/270,954

(22) Filed: Oct. 11, 2011

(65) Prior Publication Data
US 2012/0083099 A1    Apr. 5, 2012

Related U.S. Application Data

(63) Continuation of application No. 12/844,492, filed on Jul. 27, 2010, now Pat. No. 8,039,847, which is a continuation of application No. 11/421,654, filed on Jun. 1, 2006, now Pat. No. 7,799,699, which is a continuation-in-part of application No. 11/145,574, filed on Jun. 2, 2005, now Pat. No. 7,622,367.

(60) Provisional application No. 60/577,077, filed on Jun. 4, 2004, provisional application No. 60/601,061, filed
(Continued)

(51) Int. Cl.
H01L 21/30      (2006.01)
H01L 21/46      (2006.01)

(52) U.S. Cl. .................. 438/458; 257/E21.599

(58) Field of Classification Search .................. 438/458; 257/E21.599
See application file for complete search history.

(56) References Cited

U.S. PATENT DOCUMENTS

| | | |
|---|---|---|
| 3,949,410 A | 4/1976 | Bassous |
| 4,058,418 A | 11/1977 | Lindmayer |
| 4,392,451 A | 7/1983 | Mickelsen et al. |
| 4,471,003 A | 9/1984 | Cann |
| 4,487,162 A | 12/1984 | Cann |
| 4,663,828 A | 5/1987 | Hanak |

(Continued)

FOREIGN PATENT DOCUMENTS

| | | |
|---|---|---|
| CN | 1222758 | 7/1999 |
| CN | 1454045 | 11/2003 |

(Continued)

OTHER PUBLICATIONS

Notice of Reasons for Rejection corresponding to Japanese Patent Application No. P2008-514820, Dispatched May 8, 2012—includes English translation.

(Continued)

Primary Examiner — William D Coleman
(74) Attorney, Agent, or Firm — Greenlee Sullivan P.C.

(57) ABSTRACT

The present invention provides a high yield pathway for the fabrication, transfer and assembly of high quality printable semiconductor elements having selected physical dimensions, shapes, compositions and spatial orientations. The compositions and methods of the present invention provide high precision registered transfer and integration of arrays of microsized and/or nanosized semiconductor structures onto substrates, including large area substrates and/or flexible substrates. In addition, the present invention provides methods of making printable semiconductor elements from low cost bulk materials, such as bulk silicon wafers, and smart-materials processing strategies that enable a versatile and commercially attractive printing-based fabrication platform for making a broad range of functional semiconductor devices.

24 Claims, 25 Drawing Sheets

Related U.S. Application Data on Aug. 11, 2004, provisional application No. 60/650,305, filed on Feb. 4, 2005, provisional application No. 60/663,391, filed on Mar. 18, 2005, provisional application No. 60/677,617, filed on May 4, 2005, provisional application No. 60/790,104, filed on Apr. 7, 2006.

(56) References Cited

U.S. PATENT DOCUMENTS

| | | |
|---|---|---|
| 4,761,335 A | 8/1988 | Aurichio et al. |
| 4,766,670 A | 8/1988 | Gazdik et al. |
| 4,784,720 A | 11/1988 | Douglas |
| 4,855,017 A | 8/1989 | Douglas |
| 5,204,144 A | 4/1993 | Cann et al. |
| 5,313,094 A | 5/1994 | Beyer et al. |
| 5,427,096 A | 6/1995 | Bogusiewicz et al. |
| 5,434,751 A | 7/1995 | Cole, Jr. et al. |
| 5,455,178 A | 10/1995 | Fattinger |
| 5,469,845 A | 11/1995 | Delonzor et al. |
| 5,501,893 A | 3/1996 | Laermer et al. |
| 5,525,815 A | 6/1996 | Einset |
| 5,545,291 A | 8/1996 | Smith et al. |
| 5,625,471 A | 4/1997 | Smith |
| 5,648,148 A | 7/1997 | Simpson |
| 5,691,245 A | 11/1997 | Bakhit |
| 5,753,529 A | 5/1998 | Chang et al. |
| 5,757,081 A | 5/1998 | Chang et al. |
| 5,767,578 A | 6/1998 | Chang et al. |
| 5,772,905 A | 6/1998 | Chou |
| 5,783,856 A | 7/1998 | Smith et al. |
| 5,790,151 A | 8/1998 | Mills |
| 5,817,242 A | 10/1998 | Biebuyck et al. |
| 5,824,186 A | 10/1998 | Smith et al. |
| 5,904,545 A | 5/1999 | Smith et al. |
| 5,907,189 A | 5/1999 | Mertol |
| 5,915,180 A | 6/1999 | Hara et al. |
| 5,928,001 A | 7/1999 | Gilette et al. |
| 5,955,781 A | 9/1999 | Joshi et al. |
| 5,976,683 A | 11/1999 | Liehrr et al. |
| 5,998,291 A | 12/1999 | Bakhit et al. |
| 6,057,212 A | 5/2000 | Chan et al. |
| 6,080,608 A | 6/2000 | Nowak |
| 6,121,110 A | 9/2000 | Hong et al. |
| 6,165,391 A | 12/2000 | Vedamuttu |
| 6,171,730 B1 | 1/2001 | Kuroda et al. |
| 6,225,149 B1 | 5/2001 | Gan et al. |
| 6,265,326 B1 | 7/2001 | Ueno |
| 6,274,508 B1 | 8/2001 | Jacobsen et al. |
| 6,276,775 B1 | 8/2001 | Schulte |
| 6,277,712 B1 | 8/2001 | Kang et al. |
| 6,281,038 B1 | 8/2001 | Jacobsen et al. |
| 6,291,896 B1 | 9/2001 | Smith |
| 6,316,278 B1 | 11/2001 | Jacobsen et al. |
| 6,316,283 B1 | 11/2001 | Saurer |
| 6,317,175 B1 | 11/2001 | Salerno et al. |
| 6,334,960 B1 | 1/2002 | Willson et al. |
| 6,380,729 B1 | 4/2002 | Smith |
| 6,403,397 B1 | 6/2002 | Katz |
| 6,413,790 B1 | 7/2002 | Duthaler et al. |
| 6,417,025 B1 | 7/2002 | Gengel |
| 6,420,266 B1 | 7/2002 | Smith et al. |
| 6,433,401 B1 | 8/2002 | Clark et al. |
| 6,451,191 B1 | 9/2002 | Bentsen et al. |
| 6,459,418 B1 | 10/2002 | Comiskey et al. |
| 6,468,638 B2 | 10/2002 | Jacobsen et al. |
| 6,479,395 B1 | 11/2002 | Smith et al. |
| 6,517,995 B1 | 2/2003 | Jacobson et al. |
| 6,527,964 B1 | 3/2003 | Smith et al. |
| 6,555,408 B1 | 4/2003 | Jacobsen et al. |
| 6,566,744 B2 | 5/2003 | Gengel |
| 6,580,151 B2 | 6/2003 | Vandeputte et al. |
| 6,586,338 B2 | 7/2003 | Smith et al. |
| 6,590,346 B1 | 7/2003 | Hadley et al. |
| 6,606,079 B1 | 8/2003 | Smith |
| 6,606,247 B2 | 8/2003 | Credelle et al. |
| 6,608,370 B1 | 8/2003 | Chen et al. |
| 6,623,579 B1 | 9/2003 | Smith et al. |
| 6,639,578 B1 | 10/2003 | Comiskey et al. |
| 6,655,286 B2 | 12/2003 | Rogers |
| 6,657,289 B1 | 12/2003 | Craig et al. |
| 6,661,037 B2 | 12/2003 | Pan et al. |
| 6,665,044 B1 | 12/2003 | Jacobsen et al. |
| 6,666,821 B2 | 12/2003 | Keimel |
| 6,683,663 B1 | 1/2004 | Hadley et al. |
| 6,693,384 B1 | 2/2004 | Vicentini et al. |
| 6,706,402 B2 | 3/2004 | Rueckes et al. |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,743,982 B2 | 6/2004 | Biegelsen et al. |
| 6,780,696 B1 | 8/2004 | Schatz |
| 6,784,450 B2 | 8/2004 | Pan et al. |
| 6,787,052 B1 | 9/2004 | Vaganov |
| 6,814,898 B1 | 11/2004 | Deeman et al. |
| 6,816,380 B2 | 11/2004 | Credelle et al. |
| 6,844,673 B1 | 1/2005 | Bernkopf |
| 6,848,162 B2 | 2/2005 | Arneson et al. |
| 6,850,312 B2 | 2/2005 | Jacobsen et al. |
| 6,863,219 B1 | 3/2005 | Jacobsen et al. |
| 6,864,435 B2 | 3/2005 | Hermanns et al. |
| 6,864,570 B2 | 3/2005 | Smith |
| 6,872,645 B2 | 3/2005 | Duan et al. |
| 6,878,871 B2 | 4/2005 | Scher et al. |
| 6,887,450 B2 | 5/2005 | Chen et al. |
| 6,900,094 B2 | 5/2005 | Hammond et al. |
| 6,917,061 B2 | 7/2005 | Pan et al. |
| 6,936,181 B2 | 8/2005 | Bulthaup et al. |
| 6,949,199 B1 | 9/2005 | Gauzner et al. |
| 6,949,206 B2 | 9/2005 | Whiteford |
| 6,950,220 B2 | 9/2005 | Abramson et al. |
| 6,984,934 B2 | 1/2006 | Moller et al. |
| 6,989,285 B2 | 1/2006 | Ball |
| 7,029,951 B2 | 4/2006 | Chen et al. |
| 7,033,961 B1 | 4/2006 | Smart et al. |
| 7,067,903 B2 | 6/2006 | Tachibana et al. |
| 7,116,318 B2 | 10/2006 | Amundson et al. |
| 7,132,313 B2 | 11/2006 | O'Connor et al. |
| 7,148,512 B2 | 12/2006 | Leu et al. |
| 7,158,277 B2 | 1/2007 | Berggren et al. |
| 7,169,546 B2 | 1/2007 | Suzuki et al. |
| 7,169,669 B2 | 1/2007 | Blakers et al. |
| 7,170,164 B2 | 1/2007 | Chen et al. |
| 7,186,624 B2 | 3/2007 | Welser et al. |
| 7,195,733 B2 | 3/2007 | Rogers et al. |
| 7,253,442 B2 | 8/2007 | Huang et al. |
| 7,255,919 B2 | 8/2007 | Sakata et al. |
| 7,374,968 B2 | 5/2008 | Kornilovich et al. |
| 7,425,523 B2 | 9/2008 | Ikemizu et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,700,402 B2 | 4/2010 | Wild et al. |
| 7,704,684 B2 | 4/2010 | Rogers et al. |
| 7,705,280 B2 | 4/2010 | Nuzzo et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,039,847 B2 | 10/2011 | Nuzzo et al. |
| 2002/0021445 A1 | 2/2002 | Boxhevolnyi et al. |
| 2002/0110766 A1 | 8/2002 | Tsai et al. |
| 2003/0003759 A1 | 1/2003 | Kudelka |
| 2003/0006527 A1 | 1/2003 | Rabolt et al. |
| 2003/0082889 A1 | 5/2003 | Maruyama et al. |
| 2003/0087476 A1 | 5/2003 | Oohata et al. |
| 2003/0138704 A1 | 7/2003 | Mei et al. |
| 2003/0178316 A1 | 9/2003 | Jacobs et al. |
| 2003/0227116 A1 | 12/2003 | Halik et al. |
| 2004/0005723 A1 | 1/2004 | Empedocles et al. |
| 2004/0026684 A1 | 2/2004 | Empedocles et al. |
| 2004/0079464 A1 | 4/2004 | Kumakura |
| 2004/0095658 A1 | 5/2004 | Buretea et al. |

| | | | | | | |
|---|---|---|---|---|---|---|
| 2004/0112964 | A1 | 6/2004 | Empedocles et al. | WO | WO 00/49658 | 8/2000 |
| 2004/0136866 | A1 | 7/2004 | Pontis et al. | WO | WO 00/55915 | 9/2000 |
| 2004/0146560 | A1 | 7/2004 | Whiteford et al. | WO | WO 00/55916 | 9/2000 |
| 2004/0178390 | A1 | 9/2004 | Whiteford | WO | WO 01/31082 | 5/2001 |
| 2004/0192062 | A1 | 9/2004 | Mikelson | WO | WO 01/33621 | 5/2001 |
| 2004/0192082 | A1 | 9/2004 | Wagner et al. | WO | WO 01/66833 | 9/2001 |
| 2004/0206448 | A1 | 10/2004 | Dubrow | WO | WO 01/98838 | 12/2001 |
| 2004/0211458 | A1 | 10/2004 | Gui et al. | WO | WO 02/27701 | 4/2002 |
| 2004/0211459 | A1 | 10/2004 | Suenaga et al. | WO | WO 02/43032 | 5/2002 |
| 2004/0250950 | A1 | 12/2004 | Dubrow | WO | WO 02/073699 | 9/2002 |
| 2004/0252559 | A1 | 12/2004 | Gupta | WO | WO 02/092778 | 11/2002 |
| 2005/0020094 | A1 | 1/2005 | Forbes et al. | WO | WO 02/097708 | 12/2002 |
| 2005/0038498 | A1 | 2/2005 | Dubrow et al. | WO | WO 02/097724 | 12/2002 |
| 2005/0082526 | A1 | 4/2005 | Bedell et al. | WO | WO 02/099068 | 12/2002 |
| 2005/0124712 | A1 | 6/2005 | Anderson et al. | WO | WO 03/032240 | 4/2003 |
| 2005/0133954 | A1 | 6/2005 | Homola | WO | WO 03/049201 | 6/2003 |
| 2005/0214962 | A1 | 9/2005 | Daniels et al. | WO | WO 03/063211 | 7/2003 |
| 2005/0227389 | A1 | 10/2005 | Bhattacharya et al. | WO | WO 03/085700 | 10/2003 |
| 2005/0233546 | A1 | 10/2005 | Oohata et al. | WO | WO 03/085701 | 10/2003 |
| 2005/0238967 | A1 | 10/2005 | Rogers et al. | WO | WO 03/092073 | 11/2003 |
| 2005/0255686 | A1 | 11/2005 | Yamano et al. | WO | WO 2004/003535 | 1/2004 |
| 2006/0038182 | A1 | 2/2006 | Rogers et al. | WO | WO 2004/022637 | 3/2004 |
| 2006/0049485 | A1 | 3/2006 | Pan et al. | WO | WO 2004/022714 | 3/2004 |
| 2006/0084012 | A1 | 4/2006 | Nuzzo et al. | WO | WO 2004/023527 | 3/2004 |
| 2006/0085976 | A1 | 4/2006 | Eldridge et al. | WO | WO 2004/024407 | 3/2004 |
| 2006/0102525 | A1 | 5/2006 | Volkel et al. | WO | WO 2004/027822 | 4/2004 |
| 2006/0119853 | A1 | 6/2006 | Baumberg et al. | WO | WO 2004/032190 | 4/2004 |
| 2006/0127817 | A1 | 6/2006 | Ramanujan et al. | WO | WO 2004/032191 | 4/2004 |
| 2006/0132025 | A1 | 6/2006 | Gao et al. | WO | WO 2004/032193 | 4/2004 |
| 2006/0134893 | A1 | 6/2006 | Savage et al. | WO | WO 2004/034025 | 4/2004 |
| 2006/0244105 | A1 | 11/2006 | Forbes et al. | WO | WO 2004/086289 | 10/2004 |
| 2006/0255341 | A1 | 11/2006 | Pinnington et al. | WO | WO 2004/094303 | 11/2004 |
| 2006/0279191 | A1 | 12/2006 | Gehegan et al. | WO | WO 2004/100252 | 11/2004 |
| 2006/0286488 | A1 | 12/2006 | Rogers et al. | WO | WO 2004/105456 | 12/2004 |
| 2006/0286785 | A1 | 12/2006 | Rogers et al. | WO | WO 2005/005679 | 1/2005 |
| 2007/0031607 | A1 | 2/2007 | Dubson et al. | WO | WO 2005/015480 | 2/2005 |
| 2007/0032089 | A1 | 2/2007 | Nuzzo et al. | WO | WO 2005/017962 | 2/2005 |
| 2007/0073130 | A1 | 3/2007 | Finch et al. | WO | WO 2005/022120 | 3/2005 |
| 2007/0227586 | A1 | 10/2007 | Zapalac | WO | WO 2005/029578 | 3/2005 |
| 2008/0000871 | A1 | 1/2008 | Suh et al. | WO | WO 2005/054119 | 6/2005 |
| 2008/0055581 | A1 | 3/2008 | Rogers et al. | WO | WO 2005/099310 | 10/2005 |
| 2008/0108171 | A1 | 5/2008 | Rogers et al. | WO | WO 2005/104756 | 11/2005 |
| 2008/0157235 | A1 | 7/2008 | Rogers et al. | WO | WO 2005/122285 | 12/2005 |
| 2008/0212102 | A1 | 9/2008 | Nuzzo et al. | WO | WO 2006/130721 | 12/2006 |
| 2009/0149930 | A1 | 6/2009 | Schecnk | WO | WO 2007/000037 | 1/2007 |
| 2009/0199960 | A1 | 8/2009 | Nuzzo et al. | WO | WO 2007/126412 | 11/2007 |
| 2009/0289246 | A1 | 11/2009 | Schneider et al. | WO | WO 2008/030666 | 3/2008 |
| 2009/0294803 | A1 | 12/2009 | Nuzzo et al. | WO | WO 2008/030690 | 3/2008 |
| 2010/0002402 | A1 | 1/2010 | Rogers et al. | WO | WO 2008/036837 | 3/2008 |
| 2010/0052112 | A1 | 3/2010 | Rogers et al. | WO | WO 2008/055054 | 5/2008 |
| 2010/0059863 | A1 | 3/2010 | Rogers et al. | WO | WO 2008/143635 | 11/2008 |
| 2010/0072577 | A1 | 3/2010 | Nuzzo et al. | WO | WO 2009/011709 | 1/2009 |
| 2010/0283069 | A1 | 11/2010 | Rogers et al. | WO | WO 2009/111641 | 9/2009 |
| 2010/0289124 | A1 | 11/2010 | Nuzzo et al. | WO | WO 2009/114689 | 9/2009 |
| 2010/0317132 | A1 | 12/2010 | Rogers et al. | WO | WO 2010/005707 | 1/2010 |
| 2011/0147715 | A1 | 6/2011 | Rogers et al. | WO | WO 2010/036807 | 4/2010 |
| 2011/0170225 | A1 | 7/2011 | Rogers et al. | WO | WO 2010/132552 | 11/2010 |
| 2011/0171813 | A1 | 7/2011 | Rogers et al. | WO | WO 2011/084450 | 7/2011 |
| 2011/0187798 | A1 | 8/2011 | Rogers et al. | WO | WO 2011/112931 | 9/2011 |
| 2011/0220890 | A1 | 9/2011 | Nuzzo et al. | WO | WO 2011/115643 | 9/2011 |
| 2011/0230747 | A1 | 9/2011 | Rogers et al. | | | |
| 2011/0266561 | A1 | 11/2011 | Rogers et al. | | | |
| 2011/0277813 | A1 | 11/2011 | Rogers et al. | | | |
| 2011/0316120 | A1 | 12/2011 | Rogers et al. | | | |

FOREIGN PATENT DOCUMENTS

| | | |
|---|---|---|
| DE | 4241045 C1 | 5/1994 |
| EP | 0 929 097 | 7/1999 |
| EP | 1 357 773 | 10/2003 |
| EP | 1 477 230 | 11/2004 |
| JP | 6-118441 | 4/1994 |
| JP | 6-163365 | 6/1994 |
| JP | 11-026344 | 1/1999 |
| JP | 2002092984 | 3/2002 |
| TW | 367570 | 8/1999 |
| TW | 494257 | 7/2002 |
| TW | 200836353 | 9/2008 |
| WO | WO 00/46854 | 8/2000 |
| WO | WO 00/49421 | 8/2000 |

OTHER PUBLICATIONS

Notice of Reasons for Rejection corresponding to Japanese Patent Application No. P2006-165159, Dispatched Apr. 24, 2012—includes English translation.

Notice of Reasons for Rejection corresponding to Japanese Patent Application No. P2009-546361, Dispatched Jul. 3, 2012—includes English translation.

Abbaschian et al. (Dec. 2005) "High Pressure-High Temperature Growth of Diamond Crystals Using Split Sphere Apparatus," *Diamond Relat. Mater.* 14(11-12):1916-1919.

Adachi et al (1982) "Chemical Etching of InGaAsP/InP DH Wafer," *J. Electrochem. Soc.* 129:1053-1062.

Adachi et al. (1983) "Chemical Etching Characteristics of (001)GaAs," *J. Electrochem. Soc.* 130:2427-2435.

Ago et al. (2005) "Aligned Growth of Isolated Single-Walled Carbon Nanotubes Programmed vby Atomic Arrangement of Substrate Surface," *Chem. Phys. Lett.* 408:433-438.

Ago et al. (2006) "Synthesis of Horizontally-Aligned Single-Walled Carbon Nanotubes with Controllable Density on Sapphire Surface and Polarized Raman Spectroscopy," *Chem. Phys. Lett.* 421:399-403.

Ahmed et al. (Web Release Oct. 11, 2005) "Extending the 3ω-Method to the MHz Range for Thermal Conductivity Measurements of Diamond Thin Films," *Diamond Relat. Mater.* 15(2-3):389-393.

Ahn et al. (2007) "Bendable Integrated Circuits on Plastic Substrates by Use of Printed Ribbons of Single-Crystalline Silicon," *Appl. Phys. Lett.* 90:213501.

Ahn et al. (Dec. 15, 2006) "Heterogeneous Three-Dimensional Electronics by Use of Printed Semiconductor Nanomaterials," *Science* 314:1754-1757.

Ahn et al. (Jun. 2006) "High-Speed Mechanically Flexible Single-Crystal Silicon Thin-Film Transistors on Plastic Substrates," *IEEE Electron Dev. Lett.* 27(6):460-462.

Alivisatos et al. (1996) "Semiconductor Clusters, Nanocrystals, and Quantum Dots," *Science* 271:933-937.

Alivisatos et al. (1998) "From Molecules to Materials: Current Trends and Future Directions," *Adv. Mater.* 10:1297-1336.

Allen et al. (Feb. 20, 2006) "Nanomaterial Transfer Using Hot Embossing for Flexible Electronic Devices," *Appl. Phys. Lett.* 88:083112.

Al-Sarawi et al. (Feb. 1998) "A Review of 3-D Packaging Technology," *IEEE Trans. Comp. Packag. Manufac. Technol. B* 21(1):2-14.

Amano et al. (Feb. 3, 1986) "Metalorganic Vapor Phase Epitaxial Growth of a High Quality GaN Film Using an AlN Buffer Layer," *Appl. Phys. Lett.* 48(5):353-355.

Ambrosy et al. (1996) "Silicon Motherboards for Multichannel Optical Modules," *IEEE Trans. Compon. Pack. A* 19:34-40.

Andersson et al. (Oct. 16, 2002) "Active Matrix Displays Based on All-Organic Electrochemical Smart Pixels Printed on Paper," *Adv. Mater.* 14:1460-1464.

Ando et al. (2004) "Self-Aligned Self-Assembly Process for Fabricating Organic Thin-Film Transistors," *Appl. Phys. Lett.* 85:1849-1851.

Angadi et al. (Web Release Jun. 1, 2006) "Thermal Transport and Grain Boundary Conductance in Ultrananocrystalline Diamond Thin Films," *J. Appl. Phys.* 99:114301.

Aoki et al. (2003) "Microassembly of Semiconductor Three Dimensional Photonic Crystals," *Nat. Mater.* 2:117-121.

Arnold et al. (2003) "Field-Effect Transistors Based on Single Semiconducting Oxide Nanobelts," *J. Phys. Chem. B* 107(3):659-663.

Ayón et al. (Jan. 1999) "Characterization of a Time Multiplexed Inductively Coupled Plasma Etcher," *J. Electrochem. Soc.* 146(1):339-349.

Baca et al. (2008) "Semiconductor Wires and Ribbons for High-Performance Flexible Electronics," *Angew. Chem. Int. Ed.* 47:5524-5542.

Bachtold et al. (Nov. 9, 2001) "Logic Circuits with Carbon Nanotube Transistors," *Science* 294:1317-1320.

Bae et al. (Jul. 1, 2002) "Single-Crystalline Gallium Nitride Nanobelts," *Appl. Phys. Lett.* 81(1):126-128.

Balmer et al. (2005) "Diffusion of Alkanethiols in PDMS and Its Implications on Microcontact Printing (μCP)," *Langmuir* 21(2):622-632.

Banerjee et al. (May 2001) "3-D ICs: A Novel Chip Design for Improving Deep-Submicrometerinterconnect Performance and Systems-on-Chip Integration," *Proc. IEEE* 89(5):602-633.

Bao et al. (1997) "High-Performance Plastic Transistors Fabricated by Printing Techniques," *Chem. Mater.* 9:1299-1301.

Bao et al. (1999) "Printable Organic and Polymeric Semiconducting Materials and Devices," *J. Mater. Chem.* 9:1895-1904.

Barquins, M. (1992) "Adherence, Friction and Wear of Rubber-Like Materials," *Wear* 158:87-117.

Bates, F.S. (1991) "Polymer-Polymer Phase Behavior," *Science* 251:898-905.

Battaglia et al. (2003) "Colloidal Two-Dimensional Systems: CdSe Quantum Shells and Wells," Angew. Chem. Int. Ed. 442:5035-5039.

Bauer et al. (2004) "Biological Applications of High Aspect Ratio Nanoparticles," *J. Mater. Chem.* 14:517-526.

Berg et al. (2003) "Tailored Micropatters Through Weak Polyelectrolyte Stamping," *Langmuir* 19:2231-2237.

Bernard et al. (1998) "Printing Patterns of Proteins," *Langmuir* 14(9):2225-2229.

Bett et al. (Aug. 1999) "III-V Compounds for Solar Cell Applications," *Appl. Phys. A. Mater. Sci.* 69(2):119-129.

Bhunia et al. (2004) "Free-Standing and Vertically Aligned InP Nanowires Grown by Metalorganic Vapor Phase Epitaxy," *Physica E* 21:583-587.

Bhushan et al. (Nov. 2004) "Multiwalled Carbon Nanotube AFM Probes for Surface Characterization of Micro/Nanostructures," *Microsyst. Technol.* 10(8-9):633-639.

Bietsch et al. (Oct. 1, 2000) "Conformal Contact and Pattern Stability of Stamps Used for Soft Lithography," *J. Appl. Phys.* 88(7):4310-4318.

Bishay et al. (2000) "Temperature Coefficient of the Surface Resistivity of Two-Dimensional Island Gold Films," *J. Phys. D. Appl. Phys.* 33(18):2218-2222.

Blanchet et al. (2003) "Large Area, High Resolution, Dry Printing of Conducting Polymers for Organic Electronics," *Appl. Phys. Lett.* 82:463-465.

Blanchet et al. (2003) "Printing Techniques for Plastic Electronics," *J. Imag. Sci. Tech.* 47(4):296-303.

Blazdell et al. (Nov. 1999) "Preparation of Ceramic Inks for Solid Freeforming Using a Continuous Jet Printer," *J. Mat. Syn. Process.* 7(6):349-356.

Boltau et al. (1998) "Surface-Induced Structure Formation of Polymer Blends on Patterned Substrates," *Nature* 391:877-879.

Boncheva et al. (Mar. 15, 2005) "Magnetic Self-Assembly of Three-Dimensional Surfaces from Planar Sheets," *Proc. Natl. Acad. Sci. USA* 102(11):3924-3929.

Boncheva et al. (Mar. 8, 2005) "Templated Self-Assembly: Formation of Folded Structures by Relaxation of Pre-Stressed, Planar Tapes. The Path to Ubiquitous and Low-cost Organic Electronic Appliances on Plastic," *Adv. Mater.* 17(5):553-557.

Bowden et al. (1997) "Self Assembly of Mesoscale Objects into Ordered Two-Dimensional Arrays," *Science* 276:233-235.

Bowden et al. (1998) "Spontaneous Formation of Ordered Structures in Thin Films of Metals Supported on an Elastomeric Polymer," *Nature* 393:146-149.

Bowden et al. (2001) "Molecule-Mimetic Chemistry and Mesoscale Self-Assembly," *Acc. Chem. Res.* 34:231-238.

Bracher et al. (2009) "Shaped Films of Ionotropic Hydrogels Fabricated Using Templates of Patterns Paper," *Adv. Mater.* 21:445-450.

Bradley et al. (2003) "Flexible Nanotube Electronics," *Nano Lett.*, vol. 3, No. 10, pp. 1353-1355.

Braun et al. (1999) "Electrochemically Grown Photonic Crystals," *Nature* 402:603-604.

Britton et al. (Web Release Oct. 25, 2005) "Microstructural Defect Characterization of a Si:H Deposited by Low Temperature HW-CVD on Paper Substrates," *Thin Solid Films* 501(1-2):79-83.

Brown et al. (Dec. 19, 2001) "Heterogeneous Materials Integration: Compliant Substrates to Active Device and Materials Packaging," *Mater. Sci. Eng. B* 87(3):317-322.

Brown, H.R. (1991) "The Adhesion Between Polymers," *Ann. Rev. Mater. Sci.* 21:463-489.

Bruschi et al. (2001) "Micromachined Silicon Suspended Wires With Submicrometric Dimensions," *Microelectron. Eng.* 57-58:959-965.

Buma et al. (2001) "High-Frequency Ultrasound Array Element Using Thermoelastic Expansion in an Elastomeric Film," *Appl. Phys. Lett.* 79:548-550.

Burdinski et al. (2005) "Single Etch Patterning of Stacked Silver and Molybdenum Alloy Layers on Glass Using Microcontat Wave Printing," *J. Am. Chem. Soc.* 127(31):10786-10787.

Burdinski, D. (non-dated) "Soft Lithography and Microcontact Wave Printing," http://www.research.philips.com/technologies/light_dev_microsys/softlitho/index.html , Downloaded May 23, 2007.

Burge et al. (Jun. 25, 1997) "X-Ray Holography for VLSI Using Synthetic Bilevel Holograms," *Proc. Int. Soc. Opt. Eng.* 3183:2-13.

Burgin et al. (2000) "Large Area Submicrometer Contact Printing Using a Contact Aligner," *Langmuir* 16:5371-5375.

Burns et al. (2003) "Printing of Polymer Thin-Film Transistors for Active-Matrix-Display Applications," *J. Soc. Inf. Display* 11:599-604.

Campbell et al. (2000) "Fabrication of Photonic Crystals for the Visible Spectrum by Holographic Lithography," *Nature* 404:53-56.

Cao et al. (2006) "Bilayer Organic-Inorganic Gate Dielectrics for High-Performance, Low-Voltage, Single-Walled Carbon Nanotube Thin-Film Transistors, Complementary Logic Gates, and p-n Diodes on Plastic Substrates," *Adv. Funct. Mater.* 16:2355-2362.

Cao et al. (2006) "Highly Bendable,Transparent Thin-Film Transistors That Use Carbon-Nanotube-Based Conductors and Semiconductors with Elastomeric Delectrics," *Adv. Mater.* 18(3):304-309.

Cao et al. (2006) "Transparent flexible organic thin-film transistors that use printed single-walled carbon nanotube electrodes," *Applied Physics Letters* 88:113511.

Cao et al. (Jul. 24, 2008) "Medium-Scale Carbon Nanotube Thin-Film Integrated Circuits on Flexible Plastic Substrates," *Nature* 454:495-500.

Carr et al. (1998) "Measurement of Nanomechanical Resonant Structures in Single-Crystal Silicon," *J. Vac. Sci. Technol. B* 16:3821-3824.

Chadhury et al. (1991) "Direct Measurement of Interfacial Interactions Between Semispherical Lenses and Flat Sheets of Poly(dimethylsiloxane) and their Chemical Derivatives," *Langmuir* 7:1013-1025.

Chang et al. (1994) "Process Techniques," "Lithography," and "Device-Related Physics and Principles," In; *GaAs High-Speed Devices: Physics, Technology and Circuit Application*, John Wiley and Sons, New York, pp. 115-278.

Chen et al. (2003) "Characterization of Pd-GaAs Schottly Diodes Prepared by the Electrodes Plating Technique," *Semiconductor. Sci. Technol.* 18:620-626.

Chen et al. (2003) "Electronic Paper: Flexible Active-Matrix Electronics Ink Display," *Nature* 423:136.

Chen et al. (2005) "InGaN Nanorings and Nanodots by Selective Area Epitaxy," *Appl. Phys. Lett.* 87:143111.

Chen et al. (2005) "The Role of Metal-Nanotube Caontact in the Performance of Carbon Nanotube Field-Effect Transistors," *Nano Lett.* 5(7):1497-1502.

Chen et al. (Feb. 27, 2006) "Complementary Carbon Nanotube-Gated Carbon Nanotube Thin-Fim Transistor," *Appl. Phys. Lett.* 88:093502.

Chen et al. (Jun. 2002) Effect of Process Parameters on the Surface Morphology and Mechanical Performance of Silicon Structures After Deep Reactive Ion Etching (DRIE) *J. Microelectromech. Syst.* 11(3):264-275.

Chen et al. (Mar. 2004) "A Family of Herringbone Patterns in Thin Films," *Scr. Mater.* 50(6):797-801.

Chen et al. (Mar. 24, 2006) "An Integrated Logic Crcuit Assembled on a Single Carbon Nanotube," *Science* 311:1735.

Chen et al. (Sep. 2004) "Herringbone Buckling Patterns of Compressed Thin Films on Compliant Substrates," *J. Appl. Mech.* 71:597-603.

Cheng et al. (2005) "Ink-Jet Printing, Self-Assembled Polyelectrolytes, and Electroless Plating: Low Cost Fabrication of Circuits on a Flexible Substrate at Room Temperature," *Macromol. Rapid Commun.* 26:247-264.

Childs et al. (2002) "Decal Transfer Microlithography: A New Soft-Lithographic Patterning Method," *J. Am. Chem. Soc.* 124:13583-13596.

Childs et al. (2005) "Masterless Soft-Lithography: Patterning UV/Ozone-Induced Adhesion on Poly(dimethylsiloxane) Surfaces," *Langmuir* 21:10096-10105.

Childs et al. (Aug. 14, 2004) "Patterning of Thin-Film Microstructures on Non-Planar Substrate Surfaces Using Decal Transfer Lithography," *Adv. Mater.* 16(15):1323-1327.

Choi et al. (2007) "Biaxially Stretchable 'Wavy' Silicon Nanomembranes," *Nano Lett.* 7(6):1655-1663.

Choi et al. (Web Release Jan. 25, 2005) "Simple Detachment Patterning of Organic Layers and Its Applications to Organic Light-Emitting Diodes," *Adv. Mater.* 17(2):166-171.

Chou et al. (2004) "An Orientation-Controlled Pentacene Film Aligned by Photoaligned Polyimide for Organic Thin-Film Transistor Applications," *Adv. Func. Mater.* 14:811-815.

Chou et al. (Jun. 8, 1999) "Micromachining on (111)-Oriented Silicon," *Sens. Actuators A.* 75(3):271-277.

Chu et al. (2005) "High-Performance Organic Thin-Film Transistors with Metal Oxide/Metal Bilayer Electrode," *Appl. Phys. Lett.* 87:193508.

Chung et al. (2000) Silicon Nanowire Devices *Appl. Phys. Lett.* 76(15):2068-2070.

Chung et al. (Jul. 1, 2003) "A Study on Formation of Al and $Al_2O_3$ on the Porous Paper by DC Magnetron Sputtering," *Surf. Coat. Technol.* 171(1-3):65-70.

Collins et al. (Apr. 27, 2001) "Engineering Carbon Nanotubes and Nanotube Circuits Using Electrical Breakdown," *Science* 292:706-709.

Creagh et al. (2003) "Design and Performance of Inkjet Print Heads for Non-Graphic-Arts Applications," *MRS Bull.* 28:807-811.

Crone et al. (Feb. 3, 2000) "Large-Scale Complementary Integrated Circuits Based on Organic Transistors," *Nature* 403:521-523.

Crowder et al. (1998) "Low-Temperature Single-Crystal Si TFTs Fabricated on Si Films Processed via Sequential Lateral Solidification," *IEEE Electron. Dev. Lett.* 19:306-308.

Cui et al. (2001) "Nanowire Nanosensors for Highly Sensitive and Selective Detection of Biological and Chemical Species," *Science* 293:1289-1292.

Dai et al. (2002) "Gallium Oxide Nanoribbons and Nanosheets," *J. Phys. Chem. B* 106(5):902-904.

Dai et al. (2003) "Novel Nanostructures of Functional Oxides Synthesized by Thermal Evaporation," *Adv. Funct. Mater.* 13:9-24.

Davidson et al. (2004) "Supercritical Fluid-Liquid-Solid Synthesis of Gallium Arsenide Nanowires Seeded by Alkanethiol-Stabilized Gold Nanocrystals," *Adv. Mater.* 16:646-649.

de Gans (2004) "Inkjet Printing of Polymers: State of the Art and Future Developments," *Adv. Mater.* 16(3):203-213.

De Sio et al. (Web Release May 18, 2005) "Electro-Optical Response of a Single-Crystal Diamond Ultraviolet Photoconductor in Transverse Configuration," *Appl. Phys. Lett.* 86:213504.

DeBoer et al. (2004) "Organic Single-Crystal Field-Effect Transistors," *Phys. Stat. Sol.* 201:1302-1331.

Deen et al. (2004) "Electrical Characterization of Polymer-Based FETs Fabricated by Spin-Coating Poly(3-alkylthiophene)s," *IEEE Trans. Electron Devices* 51:1892-1901.

Delmerche et al. (1997) "Stability of Molded Polydimethylsiloxane Microstructures," *Adv. Mat.* 9:741-746.

Deruelle et al. (1995) "Adhesion at the Solid-Elastomer Interface: Influence of Interfacial Chains," *Macromol.* 28:7419-7428.

Derycke et al. (Sep. 2001) "Carbon Nanotube Inter- and Intramolecular Logic Gates," *Nano Lett.* 1(9):453-456.

Desai et al. (Feb. 1999) "Nanopore Technology for Biomedical Applications," *Biomed. Microdevices* 2(1):11-40.

Dick et al. (Jun. 2004) "Synthesis of Branched 'Nanotrees' by Controlled Seeding of Multiples Branching Events," *Nat. Mater.* 3:380-384.

Dimroth et al. (Mar. 2007) "High Efficiency Multijunction Solar Cells," *MRS Bull.* 32:230-235.

Ding et al. (Oct. 4, 2004) "Self Catalysis and Phase Transformation in the Formation of CdSe Nanosaws," *Adv. Mater.* 16(19):1740-1743.

Dinsmore et al. (2002) "Colloidosomes: Selectively Permeable Capsules Composed of Colloidal Particles," *Science* 298:1006-1009.

Divliansky et al. (2003) "Fabrication of Three-Dimensional Polymer Photonic Crystal Structures Using Single Diffraction Element Interference Lithography," *Appl. Phys. Lett.* 82(11):1667-1669.

Dodabalapur A. (Apr. 2006) "Organic and Polymer Transistors for Electronics," *Mater Today* 9(4):24-30.

Dodabalapur et al. (1995) "Organic Transistors: Two-Dimensional Transport and Improved Electrical Characteristics," *Science* 268:270-271.

Duan et al. (2000) "General Synthesis of Compound Semiconductor Nanowires," *Adv. Mater.* 12:298-302.

Duan et al. (2003) "High-performance Thin-Film Transistors Using Semiconductor Nanowires and Nanoribbons," *Nature* 425:274-278.

Duan X, (2003) "Semiconductor Nanowires: From Nanoelectronics to Macroelectronics," Abstract from a presentation given at the 11th Foresight Conference on Molecular Nanotechnology, Oct. 10-20, Burlingame, CA.

Duboz et al. (1998) "Transistors and Detectors Based on GaN-Related Materials," In; *Group III Nitride Semiconductor Compounds*, Gill, B. ed., Clarendon, Oxford, pp. 343-387.

Duesberg et al. (2000) "Polarized Raman Spectroscopy on Isolated Single-Wall Carbon Nanotubes," *Phys. Rev. Lett.*, vol. 85, No. 25, pp. 5436-5439.

Duffy et al. (1998) "Rapid Prototyping of Microfluidic Systems in Poly(dimethylsiloxane)," *Anal. Chem.* 70:4974-4984.

Durkop et al. (2004) "Extraordinary Mobility in Semiconducting Carbon Nanotube," *Nano Lett.* 4(1):35-39.

Eder et al. (Apr. 5, 2004) "Organic Electronics on Paper," *Appl. Phys. Lett.* 84(14):2673-2675.

Edrington et al. (2001) "Polymer-Based Photonic Crystals," *Adv. Mater.* 13:421-425.

Efimenko et al. (Oct. 15, 2002) "Surface Modification of Sylgard-184 Poly(dimethyl Siloxane) Networks by Ultraviolet and Ultraviolet/Ozone Treatment," *J. Colloid Interface Sci.* 254(2):306-315.

Eftekhari, G. (1993) "Variation in the Effective Richardson Constant of Metal—GaAs and Metal—InP Contacta Due to the Effect of Processing Parameters," *Phys. Status Solid A-Appl. Res.* 140:189-194.

Ensell, G. (1995) "Free Standing Single-Crystal Silicon Microstructures," *J. Micromech. Microeng.* 5:1-4.

Exam Report, Written Opinion and Response to Written Opinion, Corresponding to Singapore Patent Application No. 2007/18082-1, Mailed Beginning Aug. 26, 2009.

Examination Report and Response, Corresponding to Malaysian Patent Application No. PI 20062672, Mailed Aug. 28, 2009.

Examination Report, Corresponding to European Application No. EP 05 756 327.2, Dated Jan. 20, 2010.

Examination Report, Corresponding to Malaysian Patent Application No. PI 20092343, Mailed Jun. 15, 2010.

Examination Report, Corresponding to Malaysian Patent Publication No. PI 20052553, Mailed Mar. 13, 2009.

Examination Report, Corresponding to Singapore Patent Application No. 200608359-6, Completed on Aug. 27, 2008.

Examination Report, Response and Search Report, Corresponding to Malaysian Patent Application No. PI 20062537, Nov. 20, 2009.

Examination Report, Written Opinion and Response, Corresponding to Singapore Patent Application No. 2007/18082-1, Mailed beginning Feb. 26, 2009.

Faez et al. (1999) "An Elastomeric Conductor Based on Poluaniline Prepared by Mechanical Mixing," *Polymer* 40:5497-5503.

Feigner et al. (1996) "Flexural Rigidity of Microtubules Measured with the Use of Optical Tweezers," *J. Cell Sci.* 109:509-516.

Fink et al. (1999) "Block Copolymers as Photonic Bandgap Materials," *J. Lightwave Tech.* 17:1963-1969.

First Office Action, Corresponding to Chinese Patent Application No. 201110077508.8, issued Feb. 17, 2012.

Flewitt et al. (2005) "Low-Temperature Deposition of Hydrogenated Amorphous Silicon in an Electron Cyclotron Resonance Reactor for Flexible Displays," *Proc. IEEE* 93:1364-1373.

Folch et al. (1999) "Wafer-Level In-Registry Microstamping," *J. Microelectromech. Syst.* 8:85-89.

Forment et al. (2004) "Influence of Hydrogen Treatment and Annealing Processes Upon the Schottky Barrier Height of Au/n-GaAs and Ti/n-GaAs Diodes," *Semicond. Sci. Technol.* 19:1391-1396.

Forrest et al. (2004) "The Path to Ubiquitous and Low-Cost Organic Electronic Appliances on Plastic," *Nature* 428:911-918.

Fortunato et al. (2005) "Flexible a-Si: H Position-Sensitive Detectors," *Proc. IEEE* 93:1281-1286.

Fortunato et al. (Sep. 2008) "High-Performance Flexible Hybrid Field-Effect Transistors Based on Cellulose Fiber Paper," *IEEE Electron. Dev. Lett.* 29(9):988-990.

Freire et al. (1999) "Thermal Stability of Polyethylene Terephthalate (PET): Oligomer Distribution and Formation of Volatiles," *Packag. Technol. Sci.* 12:29-36.

Freund, L.B. (2000) "The Mechanics of Electronic Materials," *Int. J. Solids Struct.* 37:185-196.

Friedman et al. (2005) "High-Speed Integrated Nanowire Circuits," *Nature* 434:1085-.

Fu et al. (Jan. 10, 2003) "Patterning of Diamond Microstructures on Si Substrate by Bulk and Surface Micromachining," *J. Mater. Process. Technol.* 132(1-3):73-81.

Furneaux et al. (1989) "The Formation of Controlled-Porosity Membranes from Anodically Oxidized Aluminum," *Nature* 337:147-149.

Gan et al. (2002) "Preparation of Thin-Film Transostros With Chemical Bath Deposited CdSe and CdS Thin Films," *IEEE Trans. Electron. Dev.* 49:15-18.

Gao et al. (Sep. 9, 2005) "Conversion of Zinc Oxide Nanobelts into Superlattice-Structures Nanohelices," *Science* 309:1700-1704.

Garcia et al. (2004) "Etchant Anisotropy Controls the Step Bunching Instability in KOH Etching of Silicon," *Phys. Rev. Lett.* 93(16):166102.

Garnier et al. (1994) "All-Polymer Field-Effect Transistor Realized by Printing Techniques," *Science* 265:1684-1686.

Geim et al. (Mar. 2007) "The Rise of Graphene," *Nature Mater.* 6:183-191.

Geissler et al. (2003) "Fabrication of Metal Nanowires Using Microcontact Printing," *Langmuir* 19(15):6301-6311.

Geissler et al. (Jun. 2003) "Selective Wet-Etching of Microcontact-Printed Cu Substrates with Control Over the Etch Profile," *Microelec. Eng.* 67-68:326-332.

Gelinck et al. (2000) "High-Performance All-Polymer Integrated Circuits," *Appl. Phys. Lett.* 77:1487-1489.

Gelinck et al. (2004) "Fleible Active-Matrix Displays and Shift Registers Based on Solution-Processed Organic Transistors," *Nat. Mater.* 3:106-110.

Georgakilas et al. (2002) "Wafer-Scale Integration of GaAs Optoelectronic Devices with Standard Si Integrated Circuits Using a Low-Temperature Bonding Procedure," *Appl. Phys. Lett.* 81:5099-5101.

Givargizov, E.I. (1991) "Applications," In; *Oriented Crystallization on Amorphous Substrates*, Plenum Press, New York, pp. 341-363.

Goetting et al. (1999) "Microcontact Printing of Alkanephosphonic Acids on Aluminum: Pattern Transfer by Wet Chemical Etching," *Langmuir* 15:1182-1191.

Goldman et al. (1996) "Correlation of Buffer Strain Relaxation Modes with Transport Properties of Two-Dimensional Electron Gases," *J. Apple. Phys.* 80:6849-6854.

Goldmann et al. (2004) "Hole Mobility in Organic Single Crystals Measured by a "Flip-Crystal" Field-Effect Technique," *J. Appl. Phys.* 96:2080-2086.

Goldsmith, T.H. (Sep. 1990) "Optimization, Constraint, and History in the Evolution of Eyes," *Quart. Rev. Biol.* 65(3):281-322.

Gratz et al. (1991) "Atomic Force Microscopy of Atomic-Scale Ledges and Etch Pits Formed During Dissolution of Quartz," *Science*, 251:1343-1346.

Gray et al. (Dec. 2001) "Screen Printed Organic Thin Film Transistors (OTFTs) on a Flexible Substrate," *Proc. SPIE* 4466:89-94.

Gray et al. (Mar. 5, 2004) "High-Conductivity Elastomeric Electronics," *Adv. Mater.* 16(5):393-397.

Grayson, T. (2002) "Curved Focal Plane Wide Field of View Telescope Design," *Proc. SPIE* 4849:269-274.

Gruen et al. (Mar. 21, 1994) "Fullerenes as Precursors for Diamond Film Growth Without Hydrogen or Oxygen Additions," *Appl. Phys. Lett.* 65(12):1502-1504.

Gudiksen et al. (Web Release Apr. 18, 2001) "Synthetic Control of the Diameter and Length of Single Crystal Semiconductor Nanowires," *J. Phys. Chem. B* 105:4062-4064.

Guo et al. (Aug. 19, 2002) "Metal-Insulator-Semiconductor Electrostatics of Carbon Nanotubes," *Appl. Phys. Lett.* 81(8):1486-1488.

Gur et al. (2005) "Air-Stable All-Inorganic Nanocrystal Solar Cells Processed from Solution," *Science* 310:462-465.

Gurbuz et al. (Jul. 2005) "Diamond Semiconductor Technology for RF Device Applications." *Solid State Electron.* 49(7):1055-1070.

Haisma et al. (2002) "Contact Bonding, Including Direct-Bonding in a Historical and Recent Context of Materials Science and Technology, Physics and Chemistry," *Mater. Sci Eng.* 37:1-60.

Halik et al. (2004) "Low-Voltage Organic Transistors with an Amorphous Molecular Gate Dielectric," *Nature* 431:963-966.

Hamedi et al. (May 2007) "Towards Woven Logic from Organic Electronic Fibres," *Nat. Mater.* 6:357-362.

Hamilton et al. (2004) "Field-Effect Mobility of Organic Polymer Thin-Film Transistors," *Chem. Mater.* 16:4699-4704.
Han et al. (2005) "Template-Free Directional Growth of Single-Walled Carbon Nanotues on a- and r-Plane Sapphire," *J. Am. Chem. Soc.* 127:5294-5295.
Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc.* 123:8709-8717.
Harkonen et al. (Jun. 8, 2006) "4 W Single-Transverse Mode VECSEL Utilizing Intra-Cavity Diamond Heat Spreader," *Electron Lett.* 42(12):693-694.
He et al. (2005) "Si Nanowire Bridges in Microtrenches: Integration of Growth into Device Fabrication," *Adv. Mater.* 17:2098-2102.
Heffelfinger et al. (1997) "Steps and the structure of the (0001) α-alumina surface,"*Surf. Sci.*, 370:L168-L172.
Hillbrog et al. (Web Release Dec. 30, 2003) "Nanoscale Hydrophobic Recovery: A Chemical Force Microscopy Study of UV/Ozone-Treated Cross-Linker Poly(dimethylsiloxane)," *Langmuir* 20(3):785-794.
Hines et al. (2005) "Nanotransfer Printing of Organic and Carbon Nanotube Thin-Film Transistors on Plastic Substrates," *Appl. Phys. Lett.* 86:163101.
Holmes et al. (Feb. 25, 2000) "Control of Thickness and Orientation of Solution-Grown Silicon Nanowires," *Science* 287:1471-1473.
Horn et al. (1992) "Contact Electrification and Adhesion Between Dissimilar Materials," *Science* 256:362-364.
Hoyer, P. (1996) "Semiconductor Nanotube Formation by a Two-Step Template Process," *Adv. Mater.* 8:857-859.
Hsia et al. (2005) "Collapse of Stamps for Soft Lithography Due to Interfacial Adhesion," *Appl. Phys. Lett.* 86:154106.
Hsu et al. (2002) "Amorphous Si TFTs on Plastically Deformed Spherical Domes," *J. Non-Crystalline Solids* 299-302:1355-1359.
Hsu et al. (2003) "Nature of Electrical Contacts in a Metal—Molecule—Semiconductor System," *J. Vac. Sci. Technol. B* 21(4):1928-1935.
Hsu et al. (Jan. 15, 2004) "Spherical Deformation of Compliant Substrates with Semiconductor Device Islands," *J. Appl. Phys.* 95(2):705-712.
Hsu et al. (Mar. 2004) "Effects of Mechanical Strain on TFT's on Spherical Domes," *IEEE Trans. Electron Dev.* 51(3):371-377.
Hu et al. (1997) "Using Soft Lithography to Fabricate GaAs/AlGaAs Heterostructure Field Effect Transistors," *Appl. Phys. Lett.* 71:2020-2022.
Hu et al. (1999) Chemistry and Physics in One Dimension: Synthesis and Properties of Nanowires and Nanotubes, *Acc. Chem. Res.* 32:435-445.
Hu et al. (2004) "Percolation in Transparent and Conducting Carbon Nanotube Networks," *Nano Lett.*, vol. 4, No. 12, pp. 2513-2517.
Huang et al. (2001) "Directed Assembly of One-Dimensional Nanostructures into Functional Networks," *Science* 291:630-633.
Huang et al. (2001) "Room-Temperature Ultraviolet Nanowire Nanolasers," *Science* 292:1897-1899.
Huang et al. (2003) "Growth of Millimeter-Long and Horizontally Aligned Single-Walled Carbon Nanotubes on Flat Substrates,"*J. Am. Chem. Soc.*, 125:5636-5637.
Huang et al. (2004) "Long and Oriented Single-Walled Carbon Nanotubes Grown by Ethanol Chemical Vapor Deposition," *J. Phys. Chem. B.* 108:16451-16456.
Huang et al. (2004) "Self-Organizing High-Density Single-Walled Carbon Nanotube Arrays from Surfactant Suspensions," *Nanotechnol.* 15:1450-1454.
Huang et al. (2005) "Nanomechanical Architecture of Strained Bilayer Thin Films: From Design Principles to Experimental Fabrication," *Adv. Mater.* 17(23):2860-2864.
Huang et al. (2005) "Nanowires for Integrated Multicolor Nanophotonics," *Small* 1(1):142-147.
Huang et al. (2005) "Nonlinear Analyses of Wrinkles in a Film Bonded to a Compliant Substrate," *J. Mech. Phys. Solids* 53:2101-2118.
Huang et al. (2005) "Stamp Collapse in Soft Lithography," *Langmuir* 21:8058-8068.

Huang et al. (Jan. 16, 2001) "Catalytic Growth of Zinc Oxide Nanowires by Vapor Transport," *Adv. Mater.* 13(2):113-116.
Huck et al. (2000) "Ordering of Spontaneously Formed Buckles on Planar Surfaces," *Langmuir* 16:3497-3501.
Huie, J.C. (2003) "Guided Molecular Self Assembly: A review of Recent Efforts," *Smart Mater. Struct.* 12:264-271.
Huitema et al. (2001) "Plastic Transistors in Active-Matrix Displays," *Nature* 414:599.
Hur et al. (2005) "Printed thin-film transistors and complementary logic gates that use polymer-coated single-walled carbon nanotube networks," *J. Appl. Phys.*, 98, 114302.
Hur et al. (205) "Organic Nanodelectrics for Low Voltage Carbon Nanotube Thin Film Transistors and Complementary Logc Gates,"*J. Am. Chem. Soc.* 127:13808-13809.
Hur et al. (Dec. 2004) "Nanotransfer Printing by Use of Noncovalent Surface Forces: Applications to Thin-Film Transistors that Use Single-Walled Carbon Nanotube Networks and Semiconducting Polymers," *Appl. Phys. Lett.* 85(23):5730-5732.
Hur etal. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.
Hutchinson et al. (1992) "Mixed Mode Cracking in Layered Materials," *Adv. Appl. Mech.* 29:63-191.
Imparato et al. (2005) "Excimer Laser Induced Crystallization of Amorphous Silicon on Flexible Polymer Substrates," *Thin Solid Films* 487:58-62.
International Search Report and Written Opinion, Corresponding to International Application No. PCT/US2006/032125, Mailed Mar. 21, 2008.
International Search Report and Written Opinion, Corresponding to International Application No. PCT/US2009/058231, Mailed Nov. 17, 2009.
International Search Report and Written Opinion, Corresponding to International Application No. PCT/2005/014449, Mailed Jul. 3, 2008.
International Search Report and Written Opinion, Corresponding to International PCT Application No. PCT/US05/19354, Dated Apr. 18, 2007.
International Search Report and Written Opinion, Corresponding to International PCT Application No. PCT/US2007/079070, Mailed Apr. 23, 2008.
International Search Report and Written Opinion, Corresponding to International PCT Application No. PCT/US2007/077759, Mailed Apr. 11, 2008.
International Search Report and Written Opinion, Corresponding to International PCT Application No. PCT/US2007/022959, Mailed Oct. 14, 2008.
International Search Report and Written Opinion, Corresponding to International PCT Application No. PCT/US2006/021161, Mailed Feb. 28, 2008.
International Search Report and Written Opinion, Corresponding to International Application No. PCT/US2009/036192, Mailed Jul. 6, 2009.
Isberg et al. (Sep. 6, 2002) "High Carrier Mobility in Single-Crystal Plasma-Deposited Diamond," *Science* 297:1670-1672.
Islam et al. (Jan. 16, 2003) "High Weight Fraction Surfactant Solubilization of Single-Wall Carbon Nanotubes in Water," *Nano Lett.* 3(2):269-273.
Ismach et al. (2004) "Atomic-Step-Templated Formation of Single Wall Carbon Nanotube Patters," *Angew. Chem. Int. Ed.* 43:6140-6143.
Rah et al. (1991) "Cathodoluminescence Properties of Undoped and Zn-Doped $Al_xGa_{1-x}N$ Grown by Metaloganic Vapor Phase Epitaxy," *Jap. J. Appl. Phys.* 30:1604-1608.
Jabbour et al. (2001) "Screen Printing for the Fabrication of Organic Light-Emitting Devices," *IEEE J. Select. Top. Quantum. Electron.* 7:769-773.
Jackman et al. (Aug. 4, 1995) "Fabrication of Submicrometer Features on Curved Substrates by Microcontact Printing," *Science* 269:664-666.
Jacobs et al. (2002) "Fabrication of a Cylindrical Display by Patterned Assembly," *Science* 296:323-325.

Jain et al. (2000) "III-Nitrides: Growth, Characterization, and Properties," *J. Appl. Phys.* 87:965-1006.

Jain et al. (2005) "Flexible Electronics and Displays: High-Resolution, Roll-to-Roll, Projection Lithography and Photoblation processing Technologies for HioghThroughput Production," *Proc. IEEE* 93:1500-1510.

James et al. (1998) "Patterned Protein Layers on Solid Substrates by This Stamp Microcontact Printing," *Langmuir* 14:742-744.

Jang et al. (2003) "Lateral Growth of Aligned Multiwalled Carbon Nanotubes Under Electric Fiels," *Solid State Commun.* 126:305-308.

Jang et al. (2006) "Low-Voltage and High-Field-Effect Mobility Organic Transistors with a Polymer Insulator," *Appl. Phys. Lett.* 88:072101.

Javey et al. (2002) "High-K Dielectrics for Advanced Carbon-Nanotube Transistors and Logic Gates," *Nature Mater.* 1:241-246.

Javey et al. (2005) "High Performance n-Type Carbon Nanotube Field-Effect Transistors with Chemically Doped Contacts," *Nano Lett.*, vol. 5, No. 2, pp. 345-348.

Javey et al. (Aug. 7, 2003) "Ballistic Carbon Nanotube Field-Effect Transistors," *Nature* 424:654-657.

Jenkins et al. (1994) "Gallium Arsenide Transistors: Realization Through a Molecularly Designs Insulator," *Science* 263:1751-1753.

Jeon et al. (1995) "Patterning of Dielectric Oxide Thin Layers by Microcontact Printing of Self-Assembled Monolayers," *J. Mater. Res.* 10:2996-2999.

Jeon et al. (2004) "Fabricating Complex Three-Dimensional Nanostructures with High Resolution Conformable Phase Masks," *Proc. Natl. Acad. Sci. USA* 101:12428-12433.

Jeon et al. (2004) "Three Dimensional Nanofabrication with Arubber Stamps and Conformable Photomasks," *Adv. Mater.* 16:593-600.

Jeon et al. (Aug. 4, 2004) "Three Dimensional Nanofabrication with Rubber Stamps and Conformable Photomasks," *Adv. Mater.* 16(15):1369-1375.

Jiang et a. (Oct. 2, 2007) "Finite Deformation Mechanics in Buckled Thin Films on Compliant Supports," *Proc. Natl. Acad. Sci. USA* 104(40):15607-15612.

Jiang et al. (1999) "Preparation of Macroporous Metal Films from Colloidal Crystals," *J. Am. Chem. Soc.* 121:7957-7958.

Jiang et al. (2002) "Polymer-on-Polymer Stamping: Universal Approaches to Chemically Patterned Surfaces," *Langmuir* 18:2607-2615.

Jin et al. (2004) "Scalable Interconnection and Integration of Nanowire Devices Without Registration," *Nano Lett.* 4:915-919.

Jin et al. (2004) "Soft Lithographic Fabrication of an Image Sensor Array on a Curved Substrate," *J. Vac. Sci. Technol. B* 22(5):2548-2551.

Jiyun, C.H. (2003) "Guided Molecular Self-Assembly: A Review of Recent Efforts," *Smart Mater. Struct.* 12:264-271.

Joachim et al. (Nov. 30, 2000) "Electronics Using Hybrid-Molecular and Mono-Molecular Devices," *Nature* 408:541-548.

Johnson et al. (1999) "Ordered Mesoporous Polymers of Tunable Pore Size from Colloidal Silica Templates," *Science* 283:963-965.

Jones et al. (Jul./Aug. 2004) "Stretchable Wavy Metal Interconnects," *J. Vac. Sci. Technol. A* 22(4):1723-1725.

Joo et al. (2006) "Low-Temperature Solution-Phase Synthesis of Quantum Well Structures CdSe Nanoribbons," *J. Am. Chem. Soc.* 128(17):5632-5633.

Jortner et al. (2002) "Nanostructured Advanced Materials Perspectives and Directions," *Pure Appl. Chem.* 74(9):1491-1506.

Joselevich (2002) "Vectorial Growth of Metallic and Semiconducting Single-Wall Carbon Nanotubes," *Nano Lett.*, vol. 2, No. 10, pp. 1137-1141.

Kagan (1999) "Organic-Inorganic Hybrid Materials as Semiconducting Channels in Thin-Film Field-Effect Transistors," *Science* 286:945-947.

Kagan et al. (2001) "Patterning Organic—Inorganic Thin-Film Transistors Using Microcontact Printed Templates," *Appl. Phys Lett.* 79(21):3536-3538.

Kagan et al. (2003) *Thin Film Transistors*, Dekker, New York, pp. 1-34.

Kane et al. (2000) "Analog and Digital Circuits Using Organic Thin-Film Transistors on Polyester Substrates," *IEEE Electron. Dev. Lett.* 21:534-536.

Kang et al. (2007) "Printed Multilayer Superstructures of Aligned Single-Walled Carbon Nanotubes for Electronic Applications," *Nano Lett.* 7(11):3343-3348.

Kang et al. (Apr. 2007) "High-Performance Electronics Using Dnese, Perfectly aligned Arrays of Single-Walled Carbon Nanotubes," *Nat. Nanotechnol.* 2(4):230-236.

Kar et al. (2005) "Controlled Synthesis and Photoluminescence Properties of ZnS Nanowires and Nanoribbons," *J. Phys. Chem. B* 109(8):3298-3302.

Kar et al. (2005) "Synthesis and Optical Properties of CdS Nanoribbons," *J. Phys. Chem B.* 109(41):19134-19138.

Kar et al. (2006) "Shape Selective Growth of CdS One-Dimensional Nanostructures by a Thermal Evaporation Process," *J. Phys. Chem. B.* 110(10):4542-4547.

Karnik et al. (2003) "Lateral Polysilicon $p^+$-p-$n^+$ and $p^+$-n-$n^+$ Diodes," *Solid-State Electronics* 47:653-659.

Karnik et al. (2003) "Multiple Lateral Polysilicon Diodes as Temperature Sensors for Chemical Microreaction Systems," *Jpn. J. Appl. Phys.* 42:1200-1205.

Kato et al. (2004) The Characteristic Improvement of Si(111) Metal-Oxide-Semiconductor Field-Effect Transistor by Long-Time Hydrogen Annealing, *Jpn. J. Appl. Phys.* 43(10):6848-6853.

Katz et al. (2001) "Synthetic Chemistry for Ultrapure, Processable, and High-Mobility Organic Transistor Semiconductors," *Acc. Chem. Res.* 34:359-369.

Katz, H.E. (2004) "Recent Advances in Semiconductor Performance and Printing Processes for Organic Transistor-Based Electronics," *Chem. Mater.* 16:4748-4756.

Kawata et al. (2001) "Finer Features for Functional Microdevices," *Nature* 412:697-698.

Kendall, D.L. (1979) "Vertical Etching of Silicon at Very High Apect Ratios," *Ann. Rev. Mater. Sci.* 9:373-403.

Khakani et al. (2006) "Lateral Growth of Single Wall Carbon Nanotubes on Various Substrates by Means of an 'All-Laser' Synthesis Approach," *Diamond Relat. Mater.* 15:1064-1069.

Khan et al. (1993) "High Electron Mobility Transistor Based on a GaN—$Al_xGa_{1-x}$N Heterojunction," *Appl. Phys. Lett.* 63:1214-1215.

Khang et al. (2006) "A Stretchable Form of Single-Crystal Silicon for High-Performance Electronics on Rubber Substraights," *Science* 311:208-212.

Kilby, J.S. (1976) "Invention of the Integrated Circuit," *IEEE Trans. Electron. Dev.* 23:648-654.

Kim et al. (2000) "Field Emission from Carbon Nanotubes for Displays," *Diamond and Related Mater.* 9(3-6):1184-1189.

Kim et al. (2002) "Nanolithography Based on Patterned Metal Transfer and Its Application to Organic Electronic Devices," *Appl. Phys. Lett.* 80:4051-4053.

Kim et al. (2003) "Epitaxial Self-Assembly of Block Copolymers on Lithographically Defined Nanopatterned Substrates," *Nature* 424:411-414.

Kim et al. (2009) "Optimized Structural Designs for Stretchable Silicon Integrated Circuits," *Small* 5(24):2841-2847.

Kim et al. (Apr. 25, 2008) "Stretchable and Foldable Silicon Integrated Circuits," *Science* 320:507-511.

Kim et al. (Dec. 2, 2008) "Materials and Noncoplanar Mesh Designs for Integrated Circuits with Linear Elastic Responses to Extreme Mechanical Deformations," *Proc. Natl. Acad. Sci. USA* 105(48):18675-18680.

Kim et al. (Jan. 2008) "Complementary Logic Gates and Ring Oscillators Plastic Substrates by Use of Printed Ribbons Single-Crystalline Silicon," *IEEE Electron. Dev. Lett.* 29(1):73-76.

Kim et al. (Nov. 15, 1999) "Direct Observation of Electron Emission Site on Boron-Doped Polycrystalline Diamond Thin Films Using an Ultra-High-Vacuum Scanning Tunneling Microscope," *Appl. Phys. Lett.* 75(20):3219-3221.

Kim et al. (Oct. 2004) "Organic TFT Array on a Paper Substrate," *IEEE Electron. Dev. Lett.* 25(10):702-704.

Kim et al. (Web Release Feb. 29, 2008) "Highly Emissive Self-Assembled Organic Nanoparticles Having Dual Color Capacity for Targeted Immunofluorescence Labeling," *Adv. Mater.* 20(6):1117-1121.

Kim et al. (Web Release Jul. 6, 2009) "Ultrathin Silicon Circuits with Strain-Isolation Layers and Mesh Layouts for High-Performance Electronics on Fabric, Vinyl, Leather and Paper," *Adv. Mater.* 21(36):3703-3707.

Kim, Y.S. (Web Release Aug. 9, 2005) "Microheater-Integrated Single Gas Sensor Array Chip Fabricated on Flexible Polyirnide Substrate," *Sens. Actuators B* 114(1):410-417.

Klauk et al. (2002) "High-Mobility Polymer Gate Dielectric Pentacene Thin Film Transistors," *J. Appl. Phys.* 92:5259-5263.

Klein-Wiele et al. (2003) "Fabrication of Periodic Nanostructures by Phase-Controlled Multiple-Beam Interference," *Appl. Phys. Lett.* 83(23):4707-4709.

Knipp et al. (2003) "Pentacine Thin Film Transistors on Inorganic Dielectrics: Morphology, Structural Properties, and Electronic Transport," *Appl. Phys. Lett.* 93:347-355.

Ko et al. (2006) "Bulk Quantities of Single-Crystal Silicon Micro-/Nanoribbons Generated from Bulk Wafers," *Nano Lett.* 6(10):2318-2324.

Ko et al. (Aug. 7, 2008) "A Hemispherical Electronic Eye Camera Based on Compressible Silicon Optoelectronics," *Nature* 454:748-753.

Ko et al. (Web Release Oct. 28, 2009) "Curvilinear Electronics Formed Using Silicon Membrane Circuits and Elastomeric Transfer Elements," *Small* 5(23):2703-2709.

Kocabas et al. (2004) "Aligned Arrays of Single-Walled Carbon Nanotubes Generated from Random Networks by Orientationally Selective Laser Ablation," *Nano Lett.*, vol. 4, No. 12, pp. 2421-2426.

Kocabas et al. (2005) "Guided Growth of Large-Scale, Horizontally Aligned Arrays of Single-Walled Carbon Nanotubes and Their Use in Thin-Film Transstors," *Small* 1(11):1110-1116.

Kocabas et al. (2006) "Large Area Aligned Arrays of SWNTs for High Performance Thin Film Transistors," American Physical Society, APS March Meeting, Mar. 13-17, Abstract # W31.004.

Kocabas et al. (2006) "Spatially Selective Guided Growth of High-Coverage Arrays and Random Networks of Single-Walled Carbon Nanotbes and Thir Integration into Electronic Devices," *J. Am. Chem. Soc.* 128:4540-4541.

Kocabas et al. (2007) "Experimental and Theoretical Studies of Transport Through Large Scale, Partially Aligned Arrays of Single-Walled Carbon Nanotubes ni Thin Film Type Transistors," *Nano Lett.* 7(5):1195-1202.

Kocabas et al. (Feb. 5, 2008) "Radio Frequency Analog Electronics Based on Carbon Nanotube Transistors," *Proc. Natl. Acad. Sci. USA* 105(5):1405-1409.

Kodambaka et al. (2006) "Control of Si Nanowire Growth by Oxygen," *Nano Lett.* 6(6):1292-1296.

Koide et al. (2000) "Patterned Luminescence of Organic Light-Emitting Diodes by Hot Microcontact Printing (HμCP) of Self-Assembled Monolayers," *J. Am. Chem. Soc.* 122:11266-11267.

Konagai et al. (1978) "High Efficiency GaAs Thin Film Solar Cells by Peeled Film Technology," *J. Cryst. Growth* 45:277-280.

Kong et al. (2004) "Single-Crystal Nanorings Formed by Epitaxial SelfOCoating of Polar Nanobelts," *Science* 303:1348-1351.

Kong et al. (Jan. 28, 2000) "Nanotube Molecular Wires as Chemical Sensors," *Science* 287:622-625.

Kong et al. (Oct. 2003) "Structure of Indium Oxide Nanobelts," *Solid State Commun.* 128(1):1-4.

Kong et al. (Oct. 29, 1998) "Synthesis of Individual Single-Walled Carbon Nonotubes on Patterned Silicon Wafers," *Nature* 395:878-881.

Kudo et al. (Web Release Jun. 13, 2006) "A Flexible and Wearable Glucose Sensor Based on Functional Polymers with Soft-MEMS Techniques," *Biosens. Bioelectron.* 22:558-562.

Kulkarni et al. (2002) "Mesoscale Organization of Metal Nanocrystals," *Pure Appl. Chem* 74(9):1581-1591.

Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(4):2002-2004.

Kumar et al. (1994) "Patterning Self-Assembled Monolayers: Applications in Materials Science," *Langmuir* 10:1498-1511.

Kumar et al. (2002) "Thermally-Stable Low-Resistance Ti/Al/Mo/Au Multilayer Ohmic Contacts on n-GaN," *J. Appl. Phys.* 92:1712-1714.

Kumar et al. (2005) "Percolating in Finite Nanotube Networks," *Phys. Rev. Lett.*, 95, 066802.

Kuo et al. (1985) "Effect of Mismatch Strain on Band Gap in III-V Semiconductors," *J. Appl. Phys.* 57:5428-5432.

Kuykendall et al. (Aug. 2004) "Crystallographic Alignment of High Density Gallium Nitride Nanowire Arrays," *Nat. Mater.* 3:524-528.

Lacour et al. (2005) "Stretchable Interconnects for Elastic Electronic Surfaces," *Proc. IEEE* 93:1459-1467.

Lacour et al. (Apr. 14, 2003) "Stretchable Gold Conductors on Elastomeric Substrates," *Appl. Phys. Lett.* 82(15):2404-.

Lacour et al. (Apr. 2004) "Design and Performance of Thin Metal Film Interconnects for Skin-Like Electronic Circuits," *IEEE Electron. Dev. Lett.* 25(4):179-181.

Lacour et al. (Dec. 2004) "An Elastically Stretchable TFT Circuit," *IEEE Electron Dev. Lett.* 25(12):792-794.

Lacour et al. (Web Release Jul. 14, 2006) "Stiff Subcircuit Islands of Diamondlike Carbon for Stretchable Electronics," *J. Appl. Phys.* 100:014913.

Lacour et al. (Web Release May 16, 2006) "Mechanisms of Reversible Stretchability of Thin Metal Films on Elastomeric Substrates," *Appl. Phys. Lett.* 88:204103.

Laimer et al. (Mar. 1997) "Diamond Growth in a Direct-Current Low-Pressure Supersonic Plasmajet," *Diamond Relat. Mater.* 6:406-410.

Lambacher et al. (2004) "Electrical Imaging of Neuronal Activity by Multi-TransistorArray (MTA) Recording at 7.8 μm Resolution," *Appl. Phys. A* 79:1607-1611.

Landes et al. (2002) "Some Properties of Spherical and Rod-Shaped Semiconductor and Metal Nanocrystals," *Pure Appl. Chem.* 74(9):1675-1692.

Law et al. (2004) "Semiconductor Nanowires and Nanotubes," *Ann. Rev. Mater. Res.* 34:83-122.

Law et al. (Aug. 27, 2004) "Nanoribbon Waveguides for Subwavelength Photonics Integration," *Science* 305:1269-1273.

Lay et al. (2004) "Simple Route to Large-Scale Ordered Arrays of Liquid-Deposited Carbon Nanotubes," *Nano Lett.*, vol. 4, No. 4, pp. 603-606.

Leclercq et al. (1998) "III-V Micromachined Devices for Microsystems," *Microelectronics J.* 29:613-619.

Lecomte et al. (Apr. 2006) "Degradation Mechanism of Diethylene Glycol Units in a Terephthalate Polymer," *Polym. Degrade. Stab.* 91(4):681-689.

Lee et al. (2000) "Thin Film Transistors for Displays on Plastic Substrates," *Solid State Electron.* 44:1431-1434.

Lee et al. (2003) "High-Performance Poly-Si TFTs on Plastic Substrates Using a Nano-Structured Separation Layer Approach," *IEEE Elec. Dev. Lett.* 24:19-21.

Lee et al. (2004)"Organic Light-Emitting Diodes Formed by Soft Contact Lamination," *Proc. Natl. Acad. Sci. USA* 101(2):429-433.

Lee et al. (2005) "A Printable Form of Single-Crystalline Gallium Nitride for Flexable Optoelectronic Systems," *Small* 1:1164-1168.

Lee et al. (2005) "Large-Area, Selective Transfer of Microstructured Silicon (μs-Si): A Printing-Based Approach to High-Performance Thin0Film Transistors Supported on Flexible Substraights," *Adv. Mater.* 17:2332-2336.

Lee et al. (2006) "Micron and Submicron Patterning of Polydimethylsiloxane Resists on Electronic Materials by Decal Transfer Lithography and Reactive Ion-Beam Etching: Application to the Fabrication of High-Mobility, Thin-Film Transistors," *Appl. Phys. Lett.* 100:084907/1-7.

Lee et al. (Apr. 2005) "Fabrication of Stable Metallic Patterns Embedded in Poly(dimethylsiloxane) and Model Applications in Non-Planar Electronic and Lab-on-a-Chip Device Patterning," *Adv. Funct. Mater.* 15(4):557-566.

Lee et al. (Dec. 1999) "The Surface/Bulk Micromachining (SBM) Process: A New Method for Fabricating Released MEMS in Single Crystal Silicon," *J. Microelectromech. Syst.* 8(4):409-416.

Lee et al. (Feb. 2001) "Application of Carbon Nanotubes to Field Emission Displays," *Diamond and Related Mater.* 10(2):265-270.

Lee et al. (Feb. 2005) "Weave Patterned Organic Transistors on Fiber for E-Textiles," *IEEE Trans. Electron. Dev.* 52(2):269-275.

Letant et al. (Jun. 2003) "Functionalized Silicon Membranes for Selective Bio-Organisms Capture," *Nat. Mater.* 2:391-395.

Li et al. (2002) "High-Resolution Contact Printing with Dendrimers," *Nano Lett.* 2(4):347-349.

Li et al. (2003) "Ultrathin Single-Crystalline-Silicon Cantilever Resonators: Fabrication Technology and Significant Specimen Size effect on Young's Modulus," *Appl. Phys. Lett.* 83:3081-3083.

Li et al. (2004) "Electrospinning of Nanofibers: Reinventing the Wheel," *Adv. Mater.* 16(14):1151-1170.

Li et al. (2006) "Catalyst-Assisted Formation of Nanocantilever Arrays on ZnS Nanoribbons by Post-Annealing Treatment," *J. Phys. Chem. B* 110(13):6759-6762.

Li et al. (Dec. 2005) "Compliant Thin Film Patterns of Stiff Materials as Platforms for Stretchable Electronics," *J. Mater. Res.* 20(12):3274-3277.

Li et al. (Jul. 1, 2002) "ZnO Nanobelts Grown on Si Substrate," *Appl. Phys. Lett.* 81:144-146.

Lieber, C. (2001) "The Incredible Shrinking Circuit," *Sci. Am.* 285(3):58-64.

Lieber, C.M. (2003) "Nanoscale Science and Technology: Building a Bog Future from Small Things," *MRS. Bull.* 28:486-.

Lieber, C.M. (2003) "Nanoscale Science and Technology: Building a Bog Future from Small Things," *MRS. Bull.* 28:486-491.

Lim et al. (2005) "Flexible Membrane Pressure Sensor," *Sens. Act. A* 119:332-335.

Lima et al. (2007) "Creating Micro- and Nanostructures on Tubular and Spherical Surfaces," *J. Vac. Sci. Technol. B* 25(6):2412-2418.

Lin et al. (Sep. 2005) "High-Performance Carbon Nanotube Field-Effect Transistor With Tunable Polarities," *IEEE Trans. Nano* 4(5):481-489.

Linder et al. (1994) "Fabrication Technology for Wafer Through-Hole Interconnections and Three-Dimensional Stacks of Chips and Wafers," *Proc. IEEE Micro. Electro Mech. Syst.* 349-354.

Ling et al. (2004) "Thin Film Deposition, Patterning, and Printing in Organic Thin Film Transistors," *Chem. Mater.* 16:4824-4840.

Liu et al. (1999) "Controlled deposition of individual single-walled carbon nanotubes on chemically functionalized templates," *Chem. Phys. Lett.*, 303:125-129.

Long et al. (1990) "Heterostructure FETs and Bipolar Transistors," In; *Gallium Arsenide Digital Integrated Circuit Design*, McGraw-Hill, New York, pp. 58-69.

Loo et al. (2002) "Additive, Nanoscale Patterning of Metal Films with a Stamp and A Surface Chemistry Mediated Transfer Process: Applications in Plastic Electronics," *Appl. Phys. Lett.* 81:562-564.

Loo et al. (2002) "High-Resolution Transfer Printing on GaAs Surfaces Using Alkane Dithiol Monolayers," *J. Vac. Sci. Technol. B* 20(6):2853-2856.

Loo et al. (2002) "Interfacial Chemistries for Nanoscale Transfer Printing," *J. Am. Chem. Soc.* 124:7654-7655.

Loo et al. (2002) "Soft, Conformable Electrical Contacts for Organic Semiconductors: High-Resolution Plastic Circuits by Lamination," *Proc. Natl. Acad. Sci. USA* 99(16):10252-10256.

Loo et al. (2003) "Electrical Contacts to Molecular Layers by Nanotransfer Printing," *Nano Lett.* 3(7):913-917.

Lopes et al. (Sep. 2004) "Thermal Conductivity of PET/(LDPE/Al) Composites Determined by MDSC," *Polym. Test.* 23(6):637-643.

Lu et al. (Dec. 2006) "Electronic Materials-Buckling Down for Flexible Electronics," *Nat. Nanotechnol.* 1:163-164.

Lu et al. (Jul. 19, 2005) "One Dimensional Hole Gas in Germanium/Silicon Nanowire Heterostructures," *Proc. Nat. Acad. Sci. USA* 102(29):10046-10051.

Lu et al. (Nov. 2008) "Nanowire Transistor Performance Limits and Applications," *IEEE Trans Electron Dev.* 55(11):2859-2876.

Luan et al. (1992) "An Experimental Study of the Source/Drain Parasitic Resistance Effects in Amorphous Silicon Thin Film Transistors," *J. Appl. Phys.* 72:766-772.

Ma et al. (2004) "Single-Crystal CdSe Nanosaws," *J. Am. Chem. Soc.* 126(3):708-709.

Mack et al. (2006) "Mechanically Flexible Thin-Film Transistors that Use Ultrathin Ribbons of Silicon Derived from Bulk Wafers," *Appl. Phys. Lett.* 88:213101.

Madou, M. (1997) "Etch-Stop Techniques," In; *Fundamentals of Microfabrication*, CRC Press, New York, pp. 193-199.

Maikap et al. (2004) "Mechanically Strained-Si NMOSFETs," *IEEE Electron. Dev. Lett.* 25:40-42.

Maldovan et al. (2004) "Diamond-Structured Photonic Crystals," *Nature Materials* 3:593-600.

Mandlik et al. (Aug. 2006) "Fully Elastic Interconnects on Nanopatterned Elastomeric Substrates," *IEEE Electron Dev. Lett.* 27(8):650-652.

Manna et al. (Web Release May 25, 2003) "Controlled Growth of Tetrapod-Branched Inorganic Nanocrystals," *Nat. Mater.* 2:382-385.

Markovich et al. (1999) "Architectonic Quantum Dot Solids," *Acc. Chem. Res.* 32:415-423.

Marquette et al. (2004) "Conducting Elastomer Surface Texturing: A Path to Electrode Spotting Application to the Biochip Production," *Biosens. Bioelectron.* 20:197-203.

Martensson et al. (2004) "Nanowire Arrays Defined by Nanoimprint Lithography," *Nano Lett.* 4:699-702.

Martin, C.R. (1995) "Template Synthesis of Electronically Conductive Polymer Nanostructures,"*Acc. Chem. Res.* 28:61-68.

Mas-Torrent et al. (2006) "Large Photoresponsivity in High-Mobility Single-Crystal Organic Field-Effect Phototransistors," *ChemPhysChem* 7:86-88.

Masuda et al. (2000) "Fabrication of Ordered Diamonds/Metal Nanocomposite Structures," *Chem. Lett.* 10:1112-1113.

Matsunaga et al. (2003) "An Improved GaAs Device Model for the Simulation of Analog Integrated Circuit," *IEEE Trans. Elect. Dev.* 50:1194-1199.

McAlpine et al. (2003) "High-Performance Nanowire Electronics and Photonics on Glass and Plastic Substrates," *Nano Lett.* 3:1531-1535.

McAlpine et al. (2005) "High-Performance Nanowire Electronics and Photonics and Nanoscale Patterning on Flexible Plastic Substrates," *Proc. IEEE* 93:1357-1363.

McCaldin et al. (1971) "Diffusivity and Solubility of Si in the Al Metallization of Integrated Circuits," *Appl. Phys. Lett.* 19:524-517.

Meisel et al. (2004) "Three-Dimensional Photonic Crystals by Holographic Lithography Using the Umbrella Configuration: Symmetries and Complete Photonic Band Gaps," *Phys. Rev. B*. 70:165101:1-10.

Meitl et al. (2004) "Solution Casting and Transfer Printing Single-Walled Carbon Nanotube Films," *Nano Lett.* 4:1643-1947.

Meitl et al. (2006) "Transfer Printing by Kinetic Control of Adhesion to an Elastomeric Stamp," *Nat. Mater.* 5:33-38.

Meitl et al. (Web Release Feb. 22, 2007) "Stress Focusing for Controlled Fracture in Microelectromechanical Systems," *Appl. Phys. Lett.* 90:083110.

Melosh et al. (2003) "Ultrahigh-Density Nanowire Lattices and Circuits," *Science* 300:112-115.

Menard et al. (2004) "A Printable Form of Silicon for High Performance Thin Film Transistors on Plastic Substrates," *Appl. Phys. Lett.* 84:5398-5400.

Menard et al. (2004) "Improved Surface Chemistries, Thin Film Deposition Techniques, and Stamp Designs for Nanotransfer Printing," *Langmuir* 20:6871-6878.

Menard et al. (2004) "High-Performance n- and p-Type Single-Crystal Organic Transistors with Free-Space Gate Dielectrics," *Adv. Mat.* 16:2097-2101.

Menard et al. (2005) "Bendable Single Crystal Silicon Thin Film Transistors Formed by Printing on Plastic Substrates," *Appl. Phys. Lett.* 86(093507):1-3.

Miao et al. (2003) "Micromachining of Three-Dimensional GaAs Membrane Structures Using High-Energy Nitrogen Implantation," *J. Micromech. Microeng.* 13:35-39.

Michel et al. (2001) Printing Meets Lithography: Soft Approaches to High-Resolution Patterning, *IBM J. Res. Dev.* 45:697-719.

Miller et al. (2002) "Direct Printing of Polymer Microstructures on Flat and Spherical Surfaces Using a Letterpress Technique," *J. Vac. Sci. Technol. B* 20(6):2320-2327.

Milliron et al. (2004) "Colloidal Nanocrystal Heterostructures with Linear and Branched Topology," *Nature* 430:190-195.

Min, G. (Apr. 4, 2003) "Plastic Electronics and Their Packaging Technologies," *Syn. Metals.* 135:141-143.

Mirkin et al. (2001) "Emerging Methods for Micro- and Nanofabrication," *MRS Bulletin* 26(7):506-507.
Misewich et al. (May 2, 2003) "Electronically Induced Optical Emission from a Carbon Nanotube FET," *Science* 300:783-786.
Mishra et al. (2002) "AlGaN/GaN HEMTs—an Overview of Device Operation and Applications," *Proc. IEEE* 90:1022-1031.
Mitzi et al. (2004) "High-Mobility Ulltrathin Semiconducting Films Prepared by Spin Coating," *Nature* 428:299-303.
Moon et al. (2002) "Ink-Jet Printing of Binders for Ceramic Components," *J. Am. Ceram. Soc.* 85:755-762.
Moore et al. (Sep. 9, 2003) "Individually Suspended Single-Walled Carbon Nanotubes in Various Surfactants," *Nano Lett.* 3(10):1379-1382.
Morales et al. (Jan. 9, 1998) "A Laser Ablation Method for the Synthesis of Crystalline Semiconductor Nanowires," *Science* 279:208-211.
Morent et al. (2007) "Adhesion Enhancement by a Dielectric Barrier Discharge of PDMS used for Flexible and Stretchable Electronics," *J. Phys. D. Appl. Phys.* 40:7392-7401.
Mori et al. (1978) "A New Etching Solution System, $H_3PO_4$—$H_2O_2$—$H_2O$, for GaAs and Its Kinetics," *J. Electrochem. Soc.* 125:1510-1514.
Morkoc et al. (1995) "High-Luminosity Blue and Blue-Green Gallium Nitride Light-Emitting Diodes," *Science* 267:51-55.
Morkved et al. (1994) "Mesoscopic Self-Assembly of Gold Islands on Diblock-Copolymer Films," *Appl. Phys. Lett.* 64:422-424.
Morra et al. (1990) "On the Aging of Oxygen Plasma-Treated Polydimthylsiloxane Surfaces," *J. Colloid Interface Sci.* 137:11-24.
Murakami et al. (2005) "Polarization Dependence of the Optical Absorption of Single-Walled Carbon Nanotubes," *Phys. Rev. Lett.*, 94, 087402.
Namazu et al. (2000) "Evaluation of Size Effect on Mechanical Properties of Single Crystal Silicon by Nanoscale Bending Test Using AFM," *J. MEMS* 9:450-459.
Nath et al. (2002) "Nanotubes of the Disulfides of Groups 4 and 5 Metals," *Pure Appl. Chem.* 74(9):1545-1552.
Nathan et al. (2000) "Amorphous Silicon Detector and Thin Film Transistor Technology for Large-Area Imaging of X-Rays,." *Microelectron J.* 31:883-891.
Nathan et al. (2002) "Amorphous Silicon Technology for Large Area Digital X-Ray and Optical Imaging," *Microelectronics Reliability* 42:735-746.
Newman et al. (2004) "Introduction to Organic Thin Film Transistors and Design of n-Channel Organic Semiconductors," *Chem. Mater.* 16:4436-4451.
Nirmal et al. (1999) "Luminescence Photophysics in Semiconductor Nanocrystals," *Acc. Chem. Res.* 32:407-414.
Noda et al. (1996) "New Realization Method for Three-Dimensional Photonic Crystal in Optical Wavelength Region," *Jpn. J. Appl. Phys.* 35:L909-L912.
Nomura et al. (2004) "Room-Temperature Fabrication of Transparent Flexible Thin-Film Transistors Using Oxide Semiconductors," *Nature* 432:488-492.
Novoselov et al. (Oct. 22, 2004) "Electric Field Effect in Atomically Thin Carbon Films," *Science* 306:666-669.
O'Connell et al. (Jul. 26, 2002) "Bang Gap Fluorescence from Individual Single-Walled Caarbon Nanotubes," *Science* 297:593-596.
O'Riordan et al. (2004) "Field Configured Assembly: Programmed Manipulation and Self-Assembly at the Mesoscale," *Nano Lett.* 4:761-765.
Odom et al. (2002) "Improved Pattern Transfer in Soft Lithography Using Composite Stamps," *Langmuir* 18(13):5314-5320.
Office Action and Response, Corresponding to Malaysian Patent Publication No. PI 20052553, Mailed Mar. 13, 2009 and Dec. 8, 2009.
Office Action and Response, Corresponding to U.S. Appl. No. 11/423,287, Mailed Feb. 13, 2008.
Office Action and Response, Corresponding to U.S. Appl. No. 11/421,654, Mailed Sep. 29, 2009.
Office Action Corresponding to Chinese Patent Application No. 200780049982.1, Issued May 12, 2010.
Office Action Corresponding to U.S. Appl. No. 11/851,182, Mailed Apr. 1, 2010.
Office Action, Corresponding to Chinese Paten Application No. 200580013574.1, Issued May 11, 2010.
Office Action, Corresponding to Taiwan Patent Application No. 095121212, Issued May 7, 2010.
Office Action, Corresponding to U.S. Appl. No. 11/981,380, Mailed Sep. 23, 2010.
Office Actions and Responses, Corresponding to U.S. Appl. No. 11/145,542, Mailed between Apr. 5, 2007 and Dec. 23, 2008.
Office Actions, Corresponding to Chinese Patent Application No. 200580018159.5, Issued Jan. 23, 2009 and Feb. 12, 2010.
Office Action Corresponding to Chinese Patent Application No. 200680019640.0, Issues Nov. 3, 2010.
Office Action Corresponding to Japanese Patent Application No. P2007-515549, Dispatched Dec. 20, 2011.
Ohzono et al. (2004) "Ordering of Microwrinkle Patterns by Compressive Strain," *Phys. Rev. B* 69(13):132202.
Ohzono et al. (Web Release Jul. 7, 2005) "Geometry-Dependent Stripe Rearrangement Processes Induced by Strain on Preordered Microwrinkle Patterns," *Langmuir* 21(16):7230-7237.
Ong et al. (2004) "High-Performance Semiconducting Poolythiophenes for Organic Thin-Film Transistors," *J. Am. Chem. Soc.* 126:3378-3379.
Ong et al. (2005) "Design of High-Performance Regioreular Polythiophenes for Organic Thin-Film Transistors," *Proc. IEEE* 93:1412-1419.
Origin Energy (May 2004) "Fact Sheet—Sliver Cells," www.orginenergy.com.au/sliver.
Ouyang et al. (2002) "High-Performance, Flexible Polymer Light-Emitting Diodes Fabricated by a Continuous Polymer Coating Process," *Adv. Mat.* 14:915-918.
Ouyang et al. (2008) "High Frequency Properties of Electro-Textiles for Wearable Antenna Applications," *IEEE Trans. Antennas Propag.* 56(2):381-389.
Ouyang et al. (Web Release Mar. 20, 2000) "Conversion of Some Siloxane Polymers to Silicon Oxide by UV/Ozone Photochemical Processes," *Chem. Mater.* 12(6):1591-1596.
Pan et al. (2001) "Nanobelts of Semiconducting Oxides," *Science* 291:1947-1949.
Panev et al. (2003) "Sharp Excitation from Single InAs Quantum Dots in GaAs Nanowires," *Appl. Phys. Lett.* 83:2238-2240.
Pardo et al. (2000) "Application of Screen Printing in the Fabrication of Organic Ligh-Emitting Devices," *Adv. Mater.* 12(17):1249-1252.
Park et al. (1997) "Block Copolymer Lithography: Periodic Arrays of ~$10^{11}$ Holes in 1 Square Centimeter," *Science* 276:1401-1404.
Park et al. (1998) "Fabrication of Three-Dimensional Macroporous Membranes with Assemblies of Microspheres as templates," *Chem. Mater.* 10:1745-1747.
Park et al. (Aug. 21, 2009) "Printed Assemblies of Inorganic Light-Emitting Diodes for Deformable and Semitransparent Displays," *Science* 325:977-981.
Patton et al. (Mar. 1998) "Effect of Diamondlike Carbon Coating and Surface Topography on the Performance of Metal Evaporated Magnetic Tapes," *IEEE Trans Magn.* 34(2):575-587.
Paul et al. (Apr. 2003) "Patterning Spherical Surfaces at the Two Hundred Nanometer Scale Using Soft Lithography," *Adv. Func. Mater.* 13(4):259-263.
Pearton et al. (1999) "GaN: Processing, Defects, and Devices," *J. Appl. Phys.* 86:1-78.
Peng et al. (Mar. 2, 2000) "Shape Control of CdSe Nanocrystals," *Nature* 404:59-61.
Piazza et al. (2005) "Protective Diamond-Like Carbon Coatings for Future Optical Storage Disks," *Diamond Relat. Mater.* 14:994-999.
Pimparkar et al. (Feb. 2007) "Current-Voltage Characteristics of Long-Channel Nanobundle Thin-Film Transistors: A 'Bottom-Up' Perspective," *IEEE Electron Dev. Lett.* 28(2):157-160.
Podzorov et al. (2005) "Hall Effect in the Accumulation Layers on the Surface of Orgaic Semiconductors," *Phys. Rev. lett.* 95:226601.
Pushpa et al. (2002) "Stars and Stripes. Nanoscale Misfit Dislocation Patterns on Surfaces," *Pure Appl. Chem.* 74(9):1663-1671.
Quake et al (2000) "From Micro- to Nanofabrication with Soft Materials," *Science* 290:1536-1540.
Radtke et al. (Feb. 5, 2007) "Laser-Lithography on Non-Planar Surfaces," *Opt. Exp.* 15(3):1167-1174.

Raman et al. (1989) "Study of Mesa Undercuts Produced in GaAs with H₃PO₄-Based Etchants," *J. Electrochem. Soc.* 136:2405-2410.
Rao et al. (2003) "Large-scale assembly of carbon nanotubes," *Nature*, 425:36-37.
Razeghi et al. (1994) "High-Power Laser Diode Based on In GaAsP Alloys," *Nature* 369:631-633.
Razouk et al. (Sep. 1979) "Dependence of Interface State Density on Silicon Thermal Oxidation Process Variables," *J. Electrochem. Soc.* 126(9):1573-1581.
Reuss et al. (Jul. 2005) "Macroelectronics: Perspectives on Technology and Applications," *Proc. IEEE* 93(7):1239-1256.
Reuss et al. (Jun. 2006) "Macroelectronics," *MRS Bull.* 31:447-454.
Ribas et al. (1998) ,,Bulk Micromachining Characterization of 1.2 μm HEMT MMIC Technology for GaAs MEMS Design, *Mater. Sci. Eng. B* 51:267-273.
Ridley et al. (1999) "All-Inorganic Field Effect Transistors Fabricated by Printing," *Science* 286:746-749.
Roberts et al. (1979) "Looking at Rubber Adhesion," *Rubber Chem. Technol.* 52:23-42.
Roberts et al. (Mar. 2006) "Elastically Relaxed Free-Standing Strained-Silicon Nanomembranes," *Nat. Mater.* 5:388-393.
Robinson et al. (1983) "GaAs Readied for High-Speed Microcircuits," *Science* 219:275-277.
Roelkens et al. (Dec. 2005) "Integration of InP/InGaAsP Photodetectors onto Siliconon-Insulator Waveguide Circuits," *Optics Express* 13(25):10102-10108.
Rogers et al. (1997) "Using an Elastomeric Phase Mask for Sub-100 nm Photolithography in the Optical Near Field," *Appl. Phys. Lett.* 70:2658-2660.
Rogers et al. (1998) "Generating ~90 Nanometer Features Using Near Field Contact Mode Photolithography with an Elastomeric Phase Mask," *J. Vac. Sci. Technol.* 16(1):59-68.
Rogers et al. (1998) "Quantifying Distortions in Soft Lithography," *J. Vac. Sci. Technol.* 16:88-97.
Rogers et al. (1998) "Using Printing and Molding Techniques to Produce Distributed Feedback and Bragg Reflector Resonators for Plastic Lasers," *Appl. Phys. Lett.* 73:1766-1768.
Rogers et al. (1999) Printing Process Sutable for Reel-to-Reel Production of High-Performance Organic Transistors and Circuits, *Adv. Mater.* 11(9):741-745.
Rogers et al. (2002) "Paper-Like Electronic Displays: Large-Area Rubber-Stamped Plastic Sheets of Electronics and Microencazpsulated Electrophoretic Inks," *Proc. Nat. Acad. Sci. USA* 98:4835-4840.
Rogers et al. (2002) "Printed Plastic Electronics and Paperlike Displays," *J. Polym. Sci. Part A. Polym. Chem.* 40:3327-3334.
Rogers et al. (Mar. 2000) "Organic Smart Pixels and Complementary Inverter Circuits Formed on Plastic Substrates by Casting and Rubber Stamping," *IEEE Electron Dev. Lett.* 21(3):100-103.
Rogers, J.A. (2001) "Rubber Stamping for Plastic Electronics and Fiber Optics," *MRS Bulletin* 26(7):530-534.
Rogers, J.A. (2001) "Toward Paperlike Displays," *Science* 291:1502-1503.
Rosenblatt et al. (2002) "High Performance Electrolyte Gated Carbon Nanotube Transistors," *Nano Lett.* 2(8):869-872.
Rotkin et al. (2003) "Universal Description of Channel Conductivity for Nanotube and Nanowire Transistors," *Appl. Phys. Lett.* 83:1623-1625.
Roundy et al. (2003) "Photonic Crystal Structure with Square Symetry within Each Layer and a Three-Dimensional Band Gap," *Appl. Phys Lett.* 82:3835-3837.
Ruchehoeft et al. (2000) "Optimal Strategy for Controlling Linewidth on Spherical Focal Surface Arrays," *J. Vac. Sci. Technol. B* 18(6):3185-3189.
Samuelson et al. (2004) "Semiconductor Nanowires for Novel One-Dimensional Devices," *Physica E* 21:560-567.
Sangwal et al. (1997) "Nature of multilayer steps on the {100} cleavage planes of MgO single crystals," *Surf. Sci.*, 383:78-87.
Sanyal et al. (2002) "Morphology of Nanostructures Materials," *Pure Appl. Chem.* 74(9):1553-1570.
Sazonov et al. (2005) "Low-Temperature Materials and Thin-Film Transistors for Flexible Electronics," *Proc. IEEE* 93:1420-1428.

Schermer et al. (Web Release Apr. 28, 2005) "Thin-Film GaAs Epitaxial Lift-Off Solar Cells for Space Applications," *Prog. Photovoltaics: Res. Applic.* 13:587-596.
Schermer et al. (Web Release Jan. 19, 2006) "Photon Confinement in High-Efficiency, Thin-Film III-V Solar Cells Obtained by Epitaxial Lift-Off," *Thin Solid Films* 511-512:645-653.
Schlegel et al. (2002) "Structures of quartz (1010)- and (1011)-water interfaces determined by X-ray reflectivity and atomic force microscopy of natural growth surfaces," *Geochim. Cosmochim. Acta*, vol. 66, No. 17, pp. 3037-3054.
Schmid et al. (2003) "Preparation of metallic Films on Elastomeric Stamps and Their Application on Contact Processing and Contact Printing," *Adv. Funct. Mater.* 13:145-153.
Schmid et al. (Mar. 25, 2000) "Siloxane Polymers for High-Resolution, High-Accuracy Soft Lithography," *Macromolecules* 33(8):3042-3049.
Schmid et al. (May 11, 1998) "Light-Coupling Masks for Lensless, Sub-wavelength Optical Lithography," *Appl. Phys. Lett.* 72(19):2379-2381.
Schmidt et al. (Mar. 8, 2001) "Thin Solid Films Roll up into Nanotubes," *Nature* 410:168.
Schneider et al. (2008) "Mechanical Properties of Silicones for MEMS," *J. Micromech. Microeng.* 18:065008.
Schon et al. (1995) "Ambipolar Pentacene Field-Effect Transistors and Inverters," *Science* 287:1022-1023.
Schrieber et al. (1998) "The Effectiveness of Silane Adhesion Promotors in the Performance of Polyurethane Adhesives," *J. Adhesion* 68:31-44.
Scnable et al. (1969) "Aluminum Metallization; Advantages and Limitations for Integrated Circuit Applications," *IEEE* 57:1570-1580.
Scorzoni et al. (Oct. 4, 2004) "On the Relationship Between the Temperature coefficient of Resistance and the Thermal Conductance of Integrated Metal Resistors," *Sens Actuators A* 116(1):137-144.
Search Report and Examination Report Corresponding to Singapore Patent Application No. 200901178-4, Completed Mar. 13, 2010.
Search Report Corresponding to Singapore Patent Application No. SG 200607372-0, Mailer Oct. 17, 2007.
Search Report Corresponding to Taiwanese Patent Application No. 095121212, Completed Oct. 8, 2010.
Search Report, Corresponding to Republic of China (Taiwan) Patent Application No. 094118507, Dated Feb. 24, 2007.
Seidel et al. (2004) "High-Current Nanotube Transistors," *Nano Lett.*, vol. 4, No. 5, pp. 831-834.
Sekitani et al. (2005) "Bending Experiment on Pentacene Fiield-Effect Transistors on Plastic Films," *Appl. Phys. Lett.* 86:073511.
Sekitani et al. (Sep. 12, 2008) "A Rubberlike Stretchable Active Matrix Using Elastic Conductors," *Science* 321:1468-1472.
Sen et al. (2002) "Nonequilibrium Processes for Generating Silicon Nanostructures in Single-Crystalline Silicon," *Pure Appl. Chem.* 74(9):1631-1641.
Serikawa et al. (May 1, 2000) "High-Mobility Poly-Si Thin Film Transistors Fabricated on Stainless-Steel Foils by Low-Temperature Processes Using Sputter-Depositions," *Jpn. J. Appl. Phys.* 39:L393-L395.
Servanti et al. (2005) "Functional Pixel Circuits for Elastic AMOLED displays," *Proc. IEEE* 93:1257-1264.
Service, R.F. (Aug. 15, 2003) "Electronic Textiles Charge Ahead," *Science* 301:909-911.
Shan et al. (2004) "From Si Source Gas Directly to Positioned, Electrically Contained Si Nanowires: The Self-Assembling 'Grow-in-Place' Approach," *Nano Lett.* 4(11):2085-2089.
Sharp et al. (2003) "Holographic Photonic Crystals with Diamond Symmetry," *Phys. Rev. B* 68:205102/1-205102/6.
Sheraw et al. (2002) "Organic Thin-Film Transistor-Driven Polymer-Dispersed Liquid Crystal Displays on Flexible Polymeric Substrates," *Appl. Phys. Lett.* 80:1088-1090.
Shetty et al. (2005) "Formation and Characterization of Silicon Films on Flexible Polymer Substrates," *Mater. Lett.* 59:872-875.
Shi et al. (2001) "Free-Standing Single Crystal Silicon Nanoribbons," *J. Am. Chem. Soc.* 123(44):11095-11096.
Shi et al. (Sep. 2000) "Synthesis of Large Areas of Highly Oriented, Very Long Silicon Nanowires," *Adv. Mater.* 12(18):1343-1345.

Shin et al. (2003) "PDMS-Based Micro PCR Chip with Parylene Coating," *J. Micromech. Microeng.* 13:768-774.

Shtein et al. (Oct. 15, 2004) "Direct Mask-Free Patterning of Molecular Organic Semiconductors Using Organic Vapor Jet Printing," *J. Appl. Phys.* 96(8):4500-4507.

Shull et al. (1998) "Axisymmetric Adhesion Tests of Soft Materials," *Macromol. Chem. Phys.* 199:489-511.

Siegel et al. (Web Release Feb. 7, 2007) "Microsolidics: Fabrication of Three-Dimensional Metallic Microstructures in Poly(dimethylsiloxane)," *Adv. Mater.* 19(5):727-733.

Sim et al. (1993) "An Analytical Back-Gate Bias Effect Model for Ultrathin SOI CMOS Devices," *IEEE Trans. Elec. Dev.* 40:755-765.

Sirringhaus et al. (2003) "Inkjet Printing of Functional Materials," *MRS Bull.* 28:802-806.

Sirringhaus et al. (Dec. 15, 2000) "High-Resolution Inkjet Printing of All-Polymer Transistor Circuits," *Science* 290:2123-2126.

Sirringhaus, H. (2005) "Device Physics of Solution-Processed Organic Field-Effect Transistors," *Adv. Mater.* 17:2411-2425.

Smay et al. (2002) "Colloidal Inks for Directed Assembly of 3-D Periodic Structures," *Langmuir* 18:5429-5437.

Smith et al. (2000) "Electric-Field Assisted Assembly and Alignment of Metallic Nanowires," *Appl. Phys. Lett.* 77(9):1399-1401.

Snow et al. (2003) "Random networks of carbon nanotubes as an electronic material," *Appl. Phys. Lett.*, vol. 82, No. 13, pp. 2145-2147.

Snow et al. (2005) "High-mobility carbon-nanotube transistors on a polymeric substrate," *Appl. Phys. Lett.*, 86, 033105.

Someya et al. (2005) "Conformable, Flexible, Large-Area Networks of Pressure and Thermal Sensors with Organic Transistor Active Matrixes," *Proc. Nat. Acad. Sci. USA* 102:12321-12325.

Someya et al. (2005) "Integration of Organic FETs with Organic Photodiodes for a Large Area, Flexible, and Lightweight Sheet Image Scanners," *IEEE Trans. Electron Devices* 52:2502-2511.

Someya et al. (Jul. 6, 2004) "A Large-Area, Flexible, Pressure Sensor Matric with Organic Field-Effect Transistors for Artificial Skin Applications," *Proc. Nat. Acad. Sci. USA* 101(27):9966-9970.

Soole et al. (Mar. 1991) "InGaAs Metal-Semiconductor-Metal Photodetectors for Long Wavelength Optical Communications," *IEEE J. Quantum Electron.* 27(3):737-752.

Srinivasan et al. (Web Release Mar. 26, 2007) "Piezoelectric/Ultrananocrystalline Diamond Heterostructures for High-Performance Multifunctional Micro/Nanoelectromechanical Systems," *Appl. Phys. Lett.* 90:134101.

Stafford et al. (Aug. 2004) "A Buckling-Based Metrology for Measureing the Elastic Moduli of Polymeric Thin Films," *Nature Mater.* 3:545-550.

Star et al. (2004) "Nanotube Optoelectric Memory Devices," *Nano Lett.*, vol. 4, No. 9, pp. 1587-1591.

Storm et al. (Aug. 2003) "Fabrication of Solid-State Nanopores with Single-Nanometre Precision," *Nat. Mater.* 2:537-540.

Streetman et al. (2000) "Intrinsic Material," In; *Solid State Electronic Devices*, 5th Ed., Prentice Hall; Upper Saddle River, NJ; pp. 74-75.

Strukov et al. (2005) "CMOL FPGA: A Reconfigurable Architecture for Hybrid Digital Circuits with Two-Terminal Nanodevices," *Nanotechnology* 16:888-900.

Su et al. (2000) "Lattice-Oriented Growth of Single-Walled Carbon Nanotubes," *J. Phys. Chem. B* 104(28):6505-6508.

Sumant et al. (Apr. 2005) "Toward the Ultimate Tribological Interface: Surface Chemistry and Nanotribology of Ultrananocrystalline Diamond," *Adv. Mater.* 17(8):1039-1045.

Sun et al. (2004) "Fabricating Semiconductor Nano/Microwires and Transfer Printing Ordered Arrays of Them onto Plastic Substrates," *Nano Lett.* 4:1953-1959.

Sun et al. (2005) "Advances in Organic Field-Effect Transistors," *J. Mater. Chem.* 15:53-65.

Sun et al. (2005) "Bendable GaAs Metal-Semiconductor Field-Effect Transistors Formed with a Printed GaAs Wire Arrays on Plastic Substrates," *Appl. Phys. Lett.* 87:083501.

Sun et al. (2005) "Photolithographic Route to the Fabrication of Micro/Nanowires of III-V Semiconductors," *Adv. Fuct. Mater.* 15:30-40.

Sun et al. (2007) "Controlled Buckling of Semiconductor Nanoribbons for Stretchable Electronics," *Nat. Nanotechnol.* 1:201-207.

Sun et al. (2007) "Inorganic Semiconductors for Flexible Electronics," *Adv. Mater.* 19:1897-1916.

Sun et al. (2007) "Structural Forms of Single Crystal Semiconductor Nanoribbons for High-Performance Stretchable Electronics," *J. Mater Chem.* 17:832-840.

Sun et al. (Nov. 2006) "Buckled and Wavy Ribbons of GaAs for High-Performance Electronics on Elastomeric Substrates," *Adv. Mater.* 18(21):2857-2862.

Sundar et al. (2004) "Elastomeric Transistor Stamps: Reversible Probing of CHaarge Transport in Organic Crystals," *Science* 303:1644-1646.

Suo et al. (Feb. 22, 1999) "Mechnics of Rollable and Foldable Film-on-Foil Electronics," *Appl. Phys. Lett.* 74(8):1177-1179.

Supplementary European Search Report, Corresponding to European Application No. 05 75 6327, Completed Sep. 25, 2009.

Swain et al. (2004) "Curved CCD Detector Devices and Arrays for Multi-Spectral Astrophysical Application and Terrestrial Stereo Panoramic Cameras," *Proc. SPIE* 5499:281-301.

Sze et al. (1985) *Semiconductor Devices, Physics and Technology*, 2nd ed., Wiley, New York, pp. 190-192.

Sze, S. (1985) *Semiconductor Devices: Physics and Technology*, New York: Wiley, pp. 428-467.

Sze, S. (1988) *VLSI Technology*, Mcgraw-Hill, 327-374, 566-611.

Sze, S. (1994) *Semiconductor Sensors*, John Wiley and Sons: New York, pp. 17-95.

Takamoto et al. (Jan. 20, 1997) "Over 30% Efficient InGaP/GaAs Tandem Solar Cells," *Appl. Phys. Lett.* 70(3):381-383.

Talapin et al. (Oct. 7, 2005) "PbSe Nanocrystal Solids for n- and p-Channel Thin Film Field-Effect Transistors," *Science* 310:86-89.

Tan et al. (Apr. 12, 2004) "Performance Enhancement of InGaN Light Emitting Diodes by Laser-Lift-off and Transfer from Sapphire to Copper Substrate," *Appl. Phys. Lett.* 84(15):2757-2759.

Tanase et al. (2002) "Magnetic Trapping and Self-Assembly of Multicomponent Nanowires," *J. Appl. Phys.* 91:8549-8551.

Tang et al. (2005) "One-Dimensional Assemblies of Nanoparticles: Preparation, Properties, and Promise," *Adv. Mater.* 17:951-962.

Tao et al. (2003) "Langmuir-Blodgett Silver Nanowire Monolayers for Molecular Sensing Using Surface-Enhanced Raman Spectroscopy," *Nano Lett.* 3:1229-1233.

Tate et al. (2000) "Anodization and Microcontact Printing on Electroless Silver: Solution-Based Fabrication Procedures for Low-Voltage Electronic Systems with Organic Active Components," *Langmuir* 16:6054-6060.

Teshima et al. (2001) "Room-Temperature Deposition of High-Purity Silicon Oxide Films by RF Plasma-Enhanced CVD," *Surf. Coat. Technol.* 146-147:451-456.

Theiss et al. (1998) "PolySilicon Thin Film Transistors Fabricated at 100° C. on a Flexible Plastic Substrate," *IEDM* 98:257-260.

Toader et al. (2004) "Photonic Band Gap Architectures for Holographic Lithography," *Phy. Rev. Lett.* 043905/1-043905/4.

Toader et al. (2004) "Photonic Band Gaps Based on Tetragonal Lattices of Slanted Pores," *Phys. Rev. Lett.* 90:233901/1-233901/4.

Tong (1999) *Semiconductor Wafer Bonding: Science and Technology*, John Wiley; New York, pp. 187-221.

Trau et al. (1997) "Microscopic Patterning of Orientated Mesoscopic Silica Through Guided Growth," *Nature* 390:674-676.

Trentler et al. (1995) "Solution-Liquid-Solid Growth of Crytalline III-V Semiconductors: An Analogy to Vapor-Liquid-Solid Growth," *Science* 270:1791-1794.

Tseng et al. (Web Release Dec. 19, 2003) "Monolithic Integration of Carbon Nanotube Devices with Silicon MOS Technology" *Nano Lett.* 4(1):123-127.

Ucjikoga, S. (2002) "Low-Temperature Polycrystalline Silicon Thin-Film Transistor Technologies ofr System-on-Glass Displays," *MRS Bull.* 27:881-.

Urruchi et al. (2000) "Etching of DLC Films Using a Low Intensity Oxygen Plasma Jet," *Diamond Relat. Mater.* 9:685-688.

Vanhollenbeke et al. (2000) "Compliant Substrate Technology: Integration of Mismatched Materials for Opto-Electronic Applications," *Prog. Cryst. Growth Charact. Mater.* 41(1-4):1-55.

Velev et al. (1997) "Porous silica via colloidal crystallization," *Nature* 389:447-448.

Vilan et al. (2000) "Molecular Control Over Au/GaAs Diodes," *Nature* 404:166-168.

Vlasov et al. (2001) "On-Chip Natural Assembly of Silicon Photonic Bandgap Crystals," *Nature* 414:289-293.

Voss, D. (2000) "Cheap and Cheerful Circuits," *Nature* 407:442-444.

Wagner et al. (2003) "Silicon for Thin-Film Transistors," *Thin Solid Films* 430:15-19.

Wagner et al. (2005) "Electronic Skin: Architecture and Components," *Physica E* 25:326-334.

Wagner et al. (Mar. 1, 1964) "Vapor-Liquid-Solid Mechanism of Single Crystal Growth," *Appl. Phys. Lett.* 4(5):89-90.

Wang et al. (2003) "A Solution-Phase, Precursor Route to Polycrystalline $SnO_2$ Nanowores that can be Used for Gas Sensing under Ambient Conditions," *J. Am. Chem. Soc.* 125:16176-16177.

Wang et al. (2005) "Electronically Selective Chemical Functionalization of Carbon Nanotubes: Correlation between Raman Spectral and Electrical Responses," *J. Am. Chem. Soc.*, 127:11460-11468.

Wang et al. (2005) "Oxidation Resistant Germanium Nanowires: Bulk Synthesis, Long Chain Alkanethiol Functionalization, and Langmuir-Blodgett Assembly," *J. Am. Chem. Soc.* 127(33):11871-11875.

Wang et al. (2006) "Direct Synthesis and Characterization of CdS Nanobelts," *Appl. Phys. Lett.* 89:033102.

Weber et al. (Jan. 2004) "A Novel Low-Cost, High Efficiency Micromachined Silicon Solar Cell," *IEEE Electron Device Lett.* 25(1):37-39.

Wen et al. (Web Release Dec. 4, 2004) "Controlled Growth of Large-Area, Uniform, Vertically Aligned Arrays of $\alpha$-$Fe_2O_2$ Nanobelts and Nanowires," *J. Phys. Chem. B* 109(1):215-220.

Whang et al. (2003) "Large-Scale Hierarchical Organization of Nanowire Arrays for Integrated Nanosystems," *Nano Lett.* 3(9):1255-1259.

Williams et al. (Oct. 2006) "Growth and Properties of Nanocrystalline Diamond Films," *Phys. Stat. Sol. A* 203(13):3375-3386.

Williams et al. (Web Release Jan. 23, 2006) "Comparison of the Growth and Properties of Ultranocrystalline Diamond and Nanocrystalline Diamond," *Diamond Relat. Mater.* 15:654-658.

Willner et al. (2002) "Functional Nanoparticle Architectures for Senoric, Optoelectronic, and Bioelectronic Applications," *Pure Appl. Chem.* 74(9):1773-1783.

Wind et al. (May 20, 2002) "Vertical Scaling of Carbon Nanotube-Field-Effect Transitors Using Top Gate Electrodes," *Appl. Phys. Lett.* 80(20):3871-3819.

Won et al. (2004) "Effect of Mechanical and Electrical Stresses on the Performance of an a-Si:H TFT on Plastic Substrate," *J. Electrochem. Soc.* 151:G167-G170.

Written Opinion and Response, Corresponding to Singapore Patent Application No. 200904643-4, Mailed Jun. 6, 2011.

Wu et al. (2001) "Amorphous Silicon Crystallization and Polysilicon Thin Film Transistors on SiO2 Passivated Steel Foil Substrates," *Apple. Surf. Sci* 175-176:753-758.

Wu et al. (2001) "Direct Observation of Vapor-Liquid-Solid Nanowire Growth," *J. Am. Chem. Soc.* 123(13):3165-3166.

Wu et al. (2001) "Thermal Oxide of Polycrystalline Silicon on Steel Foil as a Thin-Film Transitor Gate Dielectric," *Appl. Phys. Lett.* 78:3729-2731.

Wu et al. (2002) "Block-by-Block Growth of Single-Crystalline Si/SiGe Superlattice Nanowires," *Nano Lett.* 2(2):83-86.

Wu et al. (2002) "Growth of Au-Catalyzed Ordered GaAs Nanowire Arrays by Molecular-Beam Epitaxy," *Appl. Phys. Lett.* 81:5177-5179.

Wu et al. (2002) "Inorganic Semiconductor Nanowires: Rational Growth, Assembly, and Novel Properties," *Chem. Eur. J.* 8(6):1261-1268.

Wu et al. (2003) "Growth, Branching, and Kinking of Molecular-Beam Epitaxial (110) GaAs Nanowires," *Appl. Phys. Lett.* 83:3368-3370.

Wu et al. (Jul. 1, 2004) "Single-Crystal Metallic Nanowires and Metal/Semiconductor Nanowire Heterostructures," *Nature* 430:61-65.

Wu et al. (Nov. 2002) "Complementary Metal-Oxide-Semiconductor Thin-Film Transistor Circuits from a High-Temperature Polycrystalline Silicon Process on Steel Foil Substrates," *IEEE Trans. Electr. Dev.* 49(11):1993-2000.

Xia (1998) "Soft Lithography" *Angew. Chem. Int. Ed.* 37:551-575.

Xia et al. (1996) "Shadowed Sputtering of Gold on V-Shaped Microtrenches Etched in Silicon and Applications in Microfabrication," *Adv. Mater.* 8(9):765-768.

Xia et al. (1998) "Soft Lithography," *Annu. Rev. Mater. Sci.* 28:153-184.

Xia et al. (1999) "Unconventional Methods for Fabricating and Patterning Nanostructures," *Chem. Rev.* 99:1823-1848.

Xia et al. (2003) "One-Dimensional Nanostructures: Synthesis, Characterization and Applications," *Adv. Mater.* 15:353-389.

Xia et al. (Jul. 19, 1996) "Complex Optical Surfaces Formed by Replica Molding Against Elastomeric Masters," *Science* 273:347-349.

Xiang et al. (Mar. 25, 2006) "Ge/Si Nanowire Heterostructures as High-Performance Field-Effect Transistors," *Nature* 441:489-493.

Xiao et al. (2003) "High-mobility thin-film transistors based on aligned carbon nanotubes," *Appl. Phys. Lett.*, vol. 83, No. 1, pp. 150-152.

Xie et al. (May 2003) "Polymer-Controlled Growth of $Sb_2Se_3$ Nanoribbons Via a Hydrothermal Process," *J. Cryst. Growth* 252(4):570-574.

Xin et al. (Jun. 2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," *Biomaterials* 26(16):3123-3129.

Yang et al. (1997) "Mesoporous Silica with Micrometer-Scale Desgns," *Adv. Mater.* 9:811-814.

Yang et al. (2000) "Stability of Low-Temperature Amorphous Silicon Thin Film Transistors Formed on Glass and Transparent Plastic Substrates," *J. Vac. Sci. Technol. B* 18:683-689.

Yang et al. (2002) "Creating Periodic Three-Dimensional Structures by Multibeam Interface of Visible Laser," *Chem. Mater.* 14:2831-2833.

Yang et al. (Dec. 2007) "RFID Tag and RF Structures on a Paper Substrate Using Inkjet-Printing Technology," *IEEE Trans. Microw. Theory Tech.* 55(12):2894-2901.

Yang, P. (2005) "The Chemistry and Physics of Semiconductor Nanowires," *MRS Bull.* 30:85-.

Yanina et al. (2002) "Terraces and ledges on (001) spinel surfaces," *Surf. Sci.*, 513:L402-L412.

Yao et al. (Mar. 2000) "High-Field Effect Electrical Transport in Single-Walled Carbon Nanotubes," *Phys. Rev. Lett.* 84(13):2941-2944.

Yeh et al. (1994) "Fluidic Self-Assembly for the Integration of GaAs Light Emitting Diodes on Si Substrates," *IEEE Photon. Techn. Lett.* 6:706-708.

Yin et al. (2000) "A Soft Lithography Approach to the Fabrication of Nanostructures of Single Crystalline Silicon with Well-Defined Dimensions and Shapes," *Adv. Mater.* 12:1426-1430.

Yin et al. (2005) "Colloidal Nanocrystal Synthesis and the Organic-Inorganic Interface," *Nature* 437:664-670.

Yoon et al. (2005) "Low-Voltage Organic Field-Effect Transistors and Inverters Enabled by Ultrathin Cross-Linked Polymers as Gate Dielectrics," *J. Am. Chem. Soc.* 127:10388-10395.

Yu et al. (2000) "Silicon Nanowires: Preparation, Device Fabrication, and Transport Properties," *J. Phys. Chem. B* 104(50):11864-11870.

Yu et al. (2003) "Solution-Liquid-Solid Growth of Soluble GaAs Nanowires," *Adv. Mater.* 15:416-419.

Yu et al. (2003) „Two-Versus Three-Dimensional Quantum Confinement in Indium Phosphide Wires and Dots, *Nat. Mater.* 2:517-520.

Yuan et al. (2006) "High-Speed Strained-Single-Crystal-Silicon Thin-Film Transistors on Flexible Polymers," *J. Appl. Phys.* 100:013708.

Yurelki et al. (Jul. 24, 2004) "Small-Angle Neutron Scattering from Surfactant-Assisted Aqueous Dispersions of Carbon Nanotubes," *J. Am. Chem. Soc.* 126(32):9902-9903.

Zakhidov et al. (1998) "Carbon Structure with Three-Dimensional Periodicity at Optical Wavelengths," *Science* 282:897-901.

Zaumseil et al. (2003) "Nanoscale Organic Transistors that use Source/Drain Electrodes Supported by High Resolution Rubber Stamps," *Appl. Phys. Lett.* 82(5):793-795.

Zaumseil et al. (2003) "Three-Dimensional and Multilayer Nanostructures Formed by Nanotransfer Printing," *Nano Lett.* 3(9):1223-1227.

Zhang et al. (2001) "Electric-field-directed growth of aligned single-walled carbon nanotubes," *Appl. Phys. Lett.*, vol. 79, No. 19. pp. 3155-3157.

Zhang et al. (2005) "Low-Temperature Growth and Photoluminescence Property of ZnS Nanoribbons," *J. Phys. Chem. B* 109(39):18352-18355.

Zhang et al. (2006) "Anomalous Coiling of SiGe/Si and SiGe/Si/Cr Helical Nanobelts," *Nano Lett.* 6(7):1311-1317.

Zhang et al. (Apr. 2003) "Oxide-Assisted Growth of Semiconducting Nanowires," *Adv. Mater.* 15(7-8):635-640.

Zhang et al. (Apr. 5, 2004) "Structure and Photoiluminescence of ZnSe Nanoribbons Grown by Metal Organic Chemical Vapor Deposition," *Appl. Phys. Lett.* 84(14):2641-2643.

Zhang et al. (Feb. 9, 2006) "Electronic Transport in Nanometre-Scale Silicon-on-Insulator Membranes," *Nature* 439:703-706.

Zhao et al. (Mar. 2007) "Improved Field Emission Properties from Metal-Coated Diamond Films," *Diamond Relat Mater.* 16(3):650-653.

Zheng et al. (2004) "Shape-and Solder-Directed Self-Assembly to Package Semiconductor Device Segments," *Appl. Phys. Lett.* 85:3635-3637.

Zheng et al. (Aug. 31, 2004) "Sequential Shape-and-Solder-Directed Self Assembly of Functional Microsystems," *Proc. Natl. Acad. Sci. USA* 101(35):12814-12817.

Zhou et al. (2002) "An Efficient Two-Photon-Generated Photoacid Applied to Positive-Tone 3D Microfabrication," *Science* 296:1106-1109.

Zhou et al. (2004) "p-Channel, n-Channel Thin Film Transistors and p-n Diodes Based on Single Wall Carbon Nanotube Networks," *Nano Lett.* 4:2031-2035.

Zhou et al. (2005) "Band Structure, Phonon Scattering, and the Performance Limit of Single-Walled Carbon Nanotube Transistors," *Phys. Rev. Lett.* 95:146805.

Zhou et al. (2005) "Mechanism for Stamp Collapse in Soft Lithography," *Appl. Phys. Lett.* 87:251925.

Zhu et al. (2005) "Spin on Dopants for High-Performance Single Crystal Silicon Transistors on Flexible Plastic Substrates," *Appl. Phys. Lett.* 86(133507)1-3.

Alavi et al. (1992) "Fabrication of Microchannels by Laser Machining and Anisotropic Etching of Silicon," *Sensors and Actuators A.* 299-302.

Examination Report and Response, Corresponding to Malaysian Patent Application No. PI 20062537, Mailed May 13, 2011.

Examination Report and Response, Corresponding to Malaysian Patent Application No. PI 2011003695, Mailed Aug. 17, 2011.

Holke and Henderson (1999) "Ultra-Deep Anisotropic Etching of (110) Silicon," *J. Micromech. Microeng.* 9: 51-57.

Supplementary European Search Report, Corresponding to European Application No. 06 77 1761, Apr. 4, 2012.

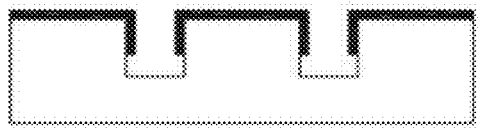 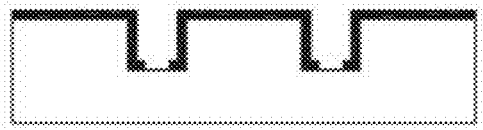
FIG. 1c    FIG. 1d
Anisotropic etching of unmasked regions; generation of free-standing structures
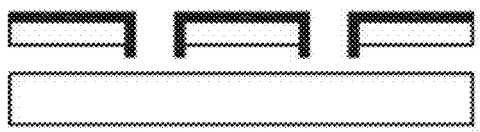 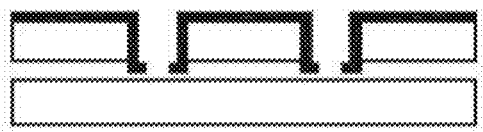
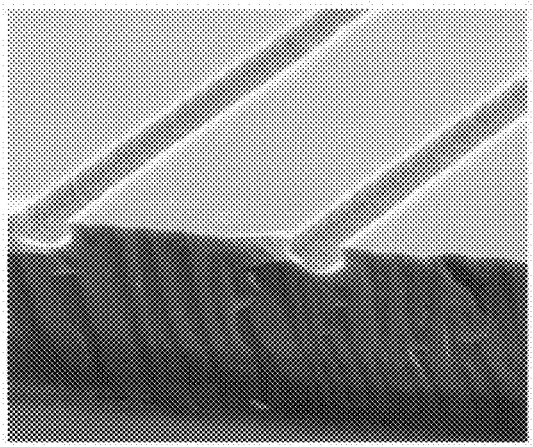 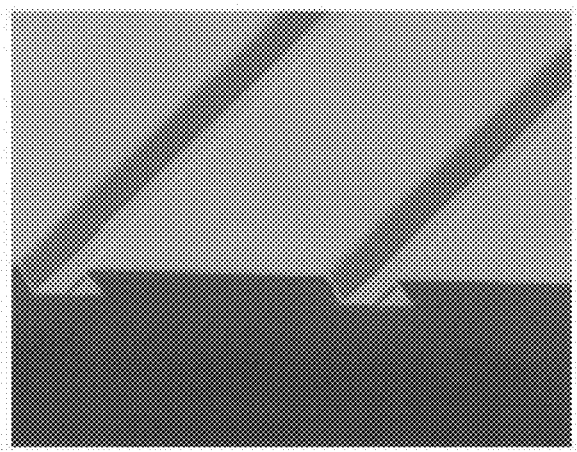
FIG. 1e    FIG. 1f

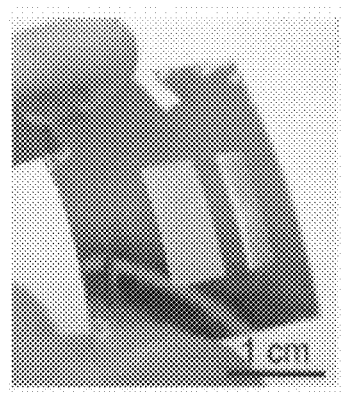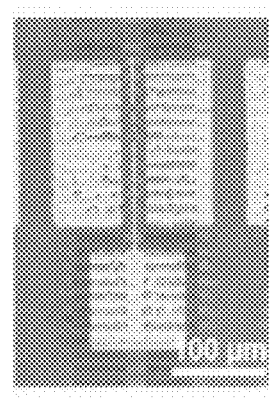
FIG. 17a  FIG. 17b
FIG. 17c
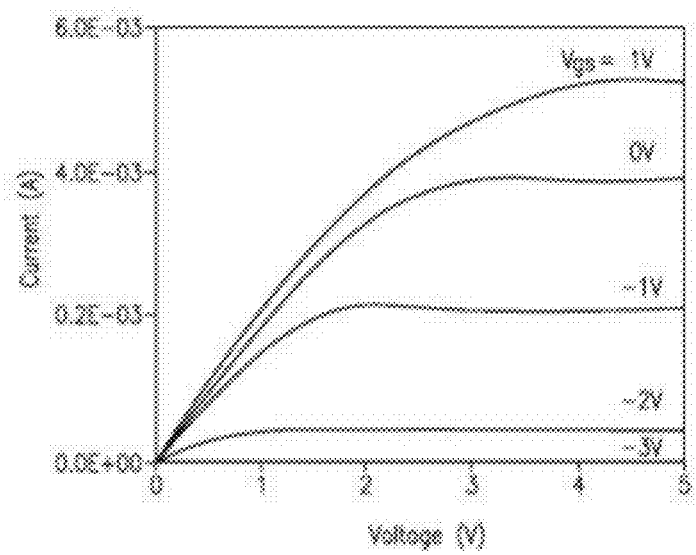
FIG. 17d
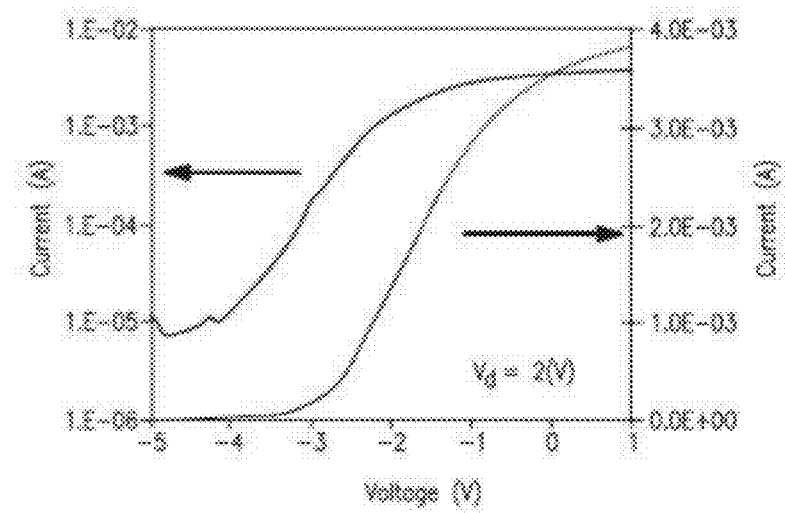

PRINTABLE SEMICONDUCTOR STRUCTURES AND RELATED METHODS OF MAKING AND ASSEMBLING

CROSS REFERENCE TO RELATED APPLICATION

This application is a continuation of U.S. patent application Ser. No. 12/844,492, filed on Jul. 27, 2010, which is a continuation of U.S. patent application Ser. No. 11/421,654 (issued as U.S. Pat. No. 7,799,699 on Sep. 21, 2010), filed on Jun. 1, 2006, which is a Continuation-in-Part of U.S. patent application Ser. No. 11/145,574 (issued as U.S. Pat. No. 7,622,367 on Nov. 24, 2009), filed Jun. 2, 2005, which claims the benefit under 35 U.S.C. 119(e) of U.S. Provisional Patent Application Nos. 60/577,077, 60/601,061, 60/650,305, 60/663,391 and 60/677,617 filed on Jun. 4, 2004, Aug. 11, 2004, Feb. 4, 2005, Mar. 18, 2005, and May 4, 2005, respectively; U.S. patent application Ser. No. 11/421,654 also claims priority under 35 U.S.C. 119(e) to U.S. provisional Patent Application 60/790,104 filed Apr. 7, 2006, all of which are hereby incorporated by reference in their entireties to the extent not inconsistent with the disclosure herein.

STATEMENT REGARDING FEDERALLY SPONSORED RESEARCH OR DEVELOPMENT

This invention was made, at least in part, with United States governmental support awarded by Department of Energy under Grant No. DEFG02-91 ER45439 and the Defense Advanced Projects Agency under Contract F8650-04-C-710. The United States Government has certain rights in this invention.

BACKGROUND OF INVENTION

Since the first demonstration of a printed, all polymer transistor in 1994, a great deal of interest has been directed at a potential new class of electronic systems comprising flexible integrated electronic devices on plastic substrates. [Garnier, F., Hajlaoui, R., Yassar, A. and Srivastava, P., Science, Vol. 265, pgs 1684-1686] Recently, substantial research has been directed toward developing new solution processable materials for conductors, dielectrics and semiconductors elements for flexible plastic electronic devices. Progress in the field of flexible electronics, however, is not only driven by the development of new solution processable materials but also by new device component geometries, efficient device and device component processing methods and high resolution patterning techniques applicable to plastic substrates. It is expected that such materials, device configurations and fabrication methods will play an essential role in the rapidly emerging new class of flexible integrated electronic devices, systems and circuits.

Interest in the field of flexible electronics arises out of several important advantages provided by this technology. First, the mechanical ruggedness of plastic substrate materials provides electronic devices less susceptible to damage and/or electronic performance degradation caused by mechanical stress. Second, the inherent flexibility of these substrate materials allows them to be integrated into many shapes providing for a large number of useful device configurations not possible with brittle conventional silicon based electronic devices. For example, bendable flexible electronic devices are expected to enable fabrication of new devices, such as electronic paper, wearable computers and large-area high resolution displays, that are not easily achieved with established silicon based technologies. Finally, the combination of solution processable component materials and plastic substrates enables fabrication by continuous, high speed, printing techniques capable of generating electronic devices over large substrate areas at low cost.

The design and fabrication of flexible electronic devices exhibiting good electronic performance, however, present a number of significant challenges. First, the well developed methods of making conventional silicon based electronic devices are incompatible with most plastic materials. For example, traditional high quality inorganic semiconductor components, such as single crystalline silicon or germanium semiconductors, are typically processed by growing thin films at temperatures (>1000 degrees Celsius) that significantly exceed the melting or decomposition temperatures of most plastic substrates. In addition, most inorganic semiconductors are not intrinsically soluble in convenient solvents that would allow for solution based processing and delivery. Second, although many amorphous silicon, organic or hybrid organic-inorganic semiconductors are compatible with incorporation into plastic substrates and can be processed at relatively low temperatures, these materials do not have electronic properties capable of providing integrated electronic devices capable of good electronic performance. For example, thin film transistors having semiconductor elements made of these materials exhibit field effect mobilities approximately three orders of magnitude less than complementary single crystalline silicon based devices. As a result of these limitations, flexible electronic devices are presently limited to specific applications not requiring high performance, such as use in switching elements for active matrix flat panel displays with non-emissive pixels and in light emitting diodes.

Progress has recently been made in extending the electronic performance capabilities of integrated electronic devices on plastic substrates to expand their applicability to a wider range of electronics applications. For example, several new thin film transistor (TFT) designs have emerged that are compatible with processing on plastic substrate materials and exhibit significantly higher device performance characteristics than thin film transistors having amorphous silicon, organic or hybrid organic-inorganic semiconductor elements. One class of higher performing flexible electronic devices is based on polycrystalline silicon thin film semiconductor elements fabricated by pulse laser annealing of amorphous silicon thin films. While this class of flexible electronic devices provides enhanced device electronic performance characteristics, use of pulsed laser annealing limits the ease and flexibility of fabrication of such devices, thereby significantly increasing costs. Another promising new class of higher performing flexible electronic devices is devices that employ solution processable nanoscale materials, such as nanowires, nanoribbons, nanoparticles and carbon nanotubes, as active functional components in a number of macroelectronic and microelectronic devices.

Use of discrete single crystalline nanowires or nanoribbons has been evaluated as a possible means of providing printable electronic devices on plastic substrates that exhibit enhanced device performance characteristics. Duan et al. describe thin film transistor designs having a plurality of selectively oriented single crystalline silicon nanowires or CdS nanoribbons as semiconducting channels [Duan, X., Niu, C., Sahl, V., Chen, J., Parce, J., Empedocles, S, and Goldman, J., Nature, Vol. 425, pgs, 274-278]. The authors report a fabrication process allegedly compatible with solution processing on plastic substrates in which single crystalline silicon nanowires or CdS nanoribbons having thicknesses less than or equal to 150 nanometers are dispersed into solution and assembled onto the surface of a substrate using flow-directed alignment methods to produce the semiconducting element of at thin film transistor. An optical micrograph provided by the authors suggests that the disclosed fabrication process prepares a monolayer of nanowires or nanoribbons in a substantially parallel orientation and spaced apart by about 500 nanometers to about 1,000 nanometers. Although the authors report relatively high intrinsic field affect mobilities for individual nanowires or nanoribbons ($\approx 119$ cm$^2$ V$^{-1}$ s$^{-1}$), the overall device field effect mobility has recently been determined to be "approximately two orders of magnitude smaller" than the intrinsic field affect mobility value reported by Duan et al. [Mitzi, D. B, Kosbar, L. L., Murray, C. E., Copel, M. Afzali, A., Nature, Vol. 428, pgs. 299-303]. This device field effect mobility is several orders of magnitude lower than the device field effect mobilities of conventional single crystalline inorganic thin film transistors, and is likely due to practical challenges in aligning, densely packing and electrically contacting discrete nanowires or nanoribbons using the methods and device configurations disclosed in Duan et al.

Use of nanocrystal solutions as precursors to polycrystalline inorganic semiconductor thin films has also been explored as a possible means of providing printable electronic devices on plastic substrates that exhibit higher device performance characteristics. Ridley et al. disclose a solution processing fabrication method wherein a solution cadmium selenide nanocrystals having dimensions of about 2 nanometers is processed at plastic compatible temperatures to provide a semiconductor element for a field effect transistor. [Ridley, B. A., Nivi, B. and Jacobson, J. M., Science, Vo. 286, 746-749 (1999)] The authors report a method wherein low temperature grain growth in a nanocrystal solution of cadmium selenide provides single crystal areas encompassing hundreds of nanocrystals. Although Ridley et al. report improved electrical properties relative to comparable devices having organic semiconductor elements, the device mobilities achieved by these techniques ($\approx 1$ cm$^2$ V$^{-1}$ s$^{-1}$) are several orders of magnitude lower than the device field effect mobilities of conventional single crystalline inorganic thin film transistors. Limits on the field effect mobilities achieved by the device configurations and fabrication methods of Ridley et al. are likely to arise from the electrical contact established between individual nanoparticles. Particularly, the use of organic end groups to stabilize nanocrystal solutions and prevent agglomeration may impede establishing good electrical contact between adjacent nanoparticles that is necessary for providing high device field effect mobilities.

Although Duan et al. and Ridley et al. provide methods for fabricating thin film transistors on plastic substrates, the device configurations described employ transistors comprising mechanically rigid device components, such as electrodes, semiconductors and/or dielectrics. Selection of a plastic substrate with good mechanical properties may provide electronic devices capable of performing in flexed or distorted orientations. However, such motion is expected to generate mechanical strain on the individual rigid transistor device components. This mechanical strain may induce damage to individual components, for example by cracking, and also may degrade or disrupt electrical contact between device components.

U.S. patent Ser. Nos. 11/145,574 and 11/145,542, both filed on Jun. 2, 2005, disclose a high yield fabrication platform using printable semiconductor elements for making electronic devices, optoelectronic devices and other functional electronic assemblies by versatile, low cost and high area printing techniques. The disclosed methods and compositions provide for the transfer, assembly and/or and integration of microsized and/or nanosized semiconductor structures using dry transfer contact printing and/or solution printing techniques providing good placement accuracy, registration and pattern fidelity over large substrate areas. The disclosed methods provide important processing advantages enabling the integration of high quality semiconductor materials fabricated using conventional high temperature processing methods onto substrates by printing techniques which may be independently carried out at relatively low temperatures (<about 400 degrees Celsius) compatible with a range of useful substrate materials, including flexible plastic substrates. Flexible thin film transistors fabricated using printable semiconductor materials exhibit good electronic performance characteristics, such as device field effect mobilities greater than 300 cm$^2$ V$^{-1}$ s$^{-1}$ and on/off ratios greater than 10$^3$, when in flexed and non-flexed conformations.

It will be appreciated from the foregoing that methods of making high quality printable semiconductor elements from low cost, bulk starting materials will enhance the commercial attractiveness of printing technologies for generating large area, flexible electronic and optoelectronic devices and device arrays. Further, printable semiconductor compositions and printing-based assembly methods enabling a high degree of control over the physical dimensions, spatial orientations and registration of semiconductor elements printed onto substrates will also enhance the applicability of these methods for fabricating a broad range of functional devices.

SUMMARY OF INVENTION

The present invention provides a high yield pathway for the fabrication, transfer and assembly of high quality printable semiconductor elements having selected physical dimensions, shapes, compositions and spatial orientations. The compositions and methods of the present invention provide high precision registered transfer and integration of arrays of microsized and/or nanosized semiconductor structures onto substrates, including large area substrates and/or flexible substrates. In addition, the present invention provides methods of making printable semiconductor elements from low cost bulk materials, such as bulk silicon wafers, and smart-materials processing strategies that enable a versatile and commercially attractive printing-based fabrication platform for making a broad range of functional semiconductor devices. The present semiconductor fabrication, transfer and integration platform provides a number of advantages including a very high degree of control over the geometry, relative spatial orientation and organization, doping levels and materials purity of the printable semiconductor structures.

The present methods and compositions enable fabrication of range of complex integrated electronic or optoelectronic devices or device arrays, including large area, flexible, high performance macroelectronic devices, exhibiting performance characteristics comparable to single crystalline semiconductor based devices fabricated using conventional high temperature processing methods. The present compositions and related methods of assembling, positioning, organizing, transferring, patterning and/or integrating printable semiconductor elements onto or into substrates may be used to fabricate virtually any structure comprising one or more semiconductor elements. These methods are particularly useful, however, for fabricating complex integrated electronic or optoelectronic devices or device arrays, such as arrays of diodes, light emitting diodes, solar cells, and transistors (e.g., thin film transistors (TFTs), metal-semiconductor field effect transistors (MESFETs) FET and bipolar). The present compositions and related methods are also useful for making systems level integrated electrical circuits, such as NOA and NAND logic gates and complementary logic circuits, wherein printable semiconductor elements are printed onto a substrate in well defined spatial orientations and interconnected to form a desired circuit design.

In one aspect, the present invention provides processing methods using bulk silicon wafer starting materials that may be repeatedly processed to provide high yields of printable semiconductor elements having physical dimensions, shapes and spatial orientations selected with great accuracy. In one embodiment of this aspect of the present invention a silicon wafer having a (111) orientation and having an external surface is provided. In a commercially attractive embodiment, the wafer is a low cost, bulk (111) silicon wafer. A plurality of recessed features is generated on the external surface of the (111) silicon wafer, wherein each of the recessed features comprises a bottom surface and side surfaces of exposed silicon wafer. At least a portion of the side surfaces of the recessed features are masked. In the context of this description the expression "masked" refers to providing a mask material, such as an etch resistant mask material, capable of preventing or inhibiting etching or capable of decreasing the rate of etching of masked surfaces. Regions between the recessed features are etched such that etching occurs along <110> directions of the (111) silicon wafer, thereby fabricating one or more printable semiconductor element(s) comprising a partially or entirely undercut silicon structure(s). In a useful embodiment, regions between adjacently positioned recessed features are undercut by etching along <110> directions of the silicon wafer, thereby generating the printable semiconductor element(s). Optionally, the position, shape and spatial orientation of recessed features is selected to form alignment maintenance elements, such as bridge elements connecting the printable semiconductor element to the wafer.

In one embodiment, a portion, but not all, of the side surfaces of the recessed features are masked thereby generating masked and unmasked regions of the side surfaces. The unmasked regions of the side surfaces are etched, for example via anisotropic etching methods, which results in undercutting of regions of the (111) silicon wafer positioned between recessed features. In this embodiment of the present invention, etching occurs between the recessed features along <110> directions of the silicon wafer, thereby fabricating printable semiconductor element(s) comprising a partially or entirely undercut silicon structure.

In another embodiment, the side surfaces of the recessed features are completely masked and regions between the recessed features are etched such that etching occurs along <110> directions of the silicon wafer, for example by etching the material under the masked regions which results in undercutting of regions of the (111) silicon wafer positioned between recessed features. This processing fabricates printable semiconductor element(s) comprising a partially or entirely undercut silicon structures. In some embodiments, material under the floor of the recessed features is removed, for example, by anisotropic etching methods. Optionally, the floors of the recessed feature are partially masked, thereby leaving inlets for etchant, wherein the inlets are positioned on the floors of recessed features. Fabrication methods wherein side surfaces of the recessed features are completely masked allow the thicknesses of the printable elements to be defined and selected more precisely than in some methods employing partial masking of the side surfaces.

Optionally, the present methods may further comprise the step of refining the geometry, physical dimensions and morphology of the recessed features, prior to fabrication of the printable semiconductor elements. Refining in this context refers to material removal processing of surfaces of the recessed features, such as the side surfaces and floors of recessed features. Refining includes processing resulting in smoother recessed feature surfaces and/or processing resulting in recessed features having more uniform physical dimensions and surface morphologies, thereby resulting in printable semiconductor elements having smoother surfaces and features and/or having more uniform physical dimensions and morphologies. In one embodiment, the geometry, physical dimensions and/or morphology is refined via anisotropic etching techniques, for example etching using hot KOH solution. Methods of the present invention including processing steps involving refining the geometry, physical dimensions and morphology of the recessed features are useful for fabrication pathways for making microelectromechanical systems (MEMS) and nanoelectromechanical systems (NEMS).

Patterning of the external surface of the (111) wafer with a plurality of recessed features having selected physical dimensions, positions and relative spatial orientations is useful in this aspect of the present methods for simultaneously fabricating arrays of a large number of (e.g., about $1 \times 10^3$ to about $1.0 \times 10^{10}$) printable semiconductor elements provided in positions and spatial orientations selected with high accuracy to facilitate their eventual assembly and integration into device systems. Methods of the present invention are capable of generating arrays of printable semiconductor elements corresponding to a large portion (e.g., about 75%-about 95%) of the external surface of the silicon wafer.

The present invention includes methods wherein etching along <110> directions of the (111) silicon wafer proceeds to completion between adjacent recessed features, thereby entirely undercutting the regions of the (111) silicon wafer between recessed features, thereby making the printable semiconductor element(s). Alternatively, the present invention includes methods wherein etching along <110> directions of the silicon wafer between adjacent recessed features does not go to completion, thereby partially undercutting the regions of the (111) silicon wafer between recessed features and, thus generating a partially undercut printable semiconductor element(s). In some methods wherein the printable semiconductor element is entirely undercut by this etching processing step, the spatial orientation and physical dimensions of recessed features on the external surface of the wafer are selected such that the printable semiconductor element(s) fabricated remain connected, optionally integrally connected, to the silicon wafer at one or more ends of the printable semiconductor element. In some embodiments, the printable semiconductor element is directly connected to the silicon wafer and in other embodiment the printable semiconductor element is connected to the silicon wafer via one or more alignment maintenance elements, such as bridge elements.

Use of a silicon wafer having a (111) orientation in combination with etching systems of the present invention provides an intrinsic etch stop useful for at least partially or completely undercutting printable semiconductor elements and optionally alignment maintenance elements such as bridge elements. In some embodiments, for example, an anisotropic etching system is selected that provides for preferential etching along the <110> directions of the silicon wafer. In these embodiments, etching proceeds at a faster rate along the <110> directions of the silicon wafer than <111> directions of the silicon wafer, and preferentially for some applications etching proceeds at an at least 100 times faster rate along the <110> directions of the silicon wafer than <111> directions of the silicon wafer and in some embodiments etching proceeds at an at least 600 times faster rate along the <110> directions of the silicon wafer than <111> directions of the silicon wafer. Under some processing conditions an anisotropic etching system is used such that etching does not substantially proceed along the <111> directions of the silicon wafer. In the context of this description the expression "etching does not substantially proceed along the <111> directions" refers to an extent of etching that is less than about a few percent for a typical printable semiconductor element fabrication process. Useful etching systems for this undercutting processing step generate printable semiconductor elements having a smooth, undercut bottom surface, for example a undercut bottom surface with a surface roughness less than or equal to 0.5 nanometers. Anisotropic etchant systems useful in the present methods include, but are not limited to, wet chemical etching using a basic solution, such as KOH, alkali hydroxide solutions, EDP (ethylene diamine pyrochatechol), TMAH (tetramethylammonium hydroxide), amine gallate (gallic acid, ethanolamine, pyrazine, surfactant aqueous solution), and hydrazine, at room temperature or at a temperature greater than 298K.

Useful methods for masking side surfaces of recessed features include angled electron beam deposition of mask material, such as a metal or combination of metals, chemical vapor deposition, thermal oxidation, and solution deposition of mask materials. Exemplary methods include two metal angled electron beam deposition of Ti/Au providing partial coverage of the side surface of the recessed features. The "shadows" cast during angle evaporations, in this embodiment, at least in part define the thickness of the printable semiconductor elements. The present methods include processing steps that completely mask the side surfaces of the recessed features and, alternatively processing steps that only partially mask the side surfaces of the recessed features, for example process steps that mask selected portions, regions, areas or depths of the side surfaces.

In one embodiment of this aspect of the present invention, a pattern of recessed features having selected physical dimensions, orientations and positions is provided to the external surface. In this embodiment, recessed features on the external surface have physical dimensions (i.e., lengths, widths and depths), shapes, positions and relative spatial orientations selected to at least partially define the physical dimensions, shapes, positions and spatial orientations of the printable semiconductor elements, and optionally bridge elements. The relative positions (e.g. spacing), shapes and spatial orientations of adjacent recessed features are selected to define the shape, width or length of the printable semiconductor element(s). For example, the spacing between adjacent recessed features defines the width or length of the of the printable semiconductor element, and the depth of the recessed features may be selected to, at least partially, determine the thickness of the printable semiconductor element. In some embodiments, recessed features having one or more substantially uniform (i.e., within about 5%) physical dimensions are preferred so as to generate printable semiconductor elements having one or more uniform physical dimensions, such as uniform thickness, width or lengths. Recessed features may be fabricated by any means known in the art, including but not limited to, photolithographic processing such as near-field phase shift photolithography, soft lithographic processing, lift-off methods, dry chemical etching, plasma etching, wet chemical etching, micromachining, electron beam writing, and reactive ion etching. In one useful embodiment capable of providing patterns of recessed features having selected physical dimensions and relative spatial orientations, the step of generating one or more recessed features on the external surface of the silicon wafer comprises the steps of: (i) masking one or more regions of the external surface by applying a mask, thereby generating masked regions and unmasked regions of the external surface; and (ii) etching, for example anisotropic dry etching or isotropic dry etching techniques, at least a portion of the unmasked regions of the external surface of the wafer.

In one embodiment of this aspect of the present invention, recessed features comprises a plurality of channels in the external surface of the wafer having selected physical dimensions, positions and relative spatial orientations. For example, recessed features comprising first and second channels may be patterned onto the silicon wafer such that they that are physically separated from each other. The step of etching between recessed features in this embodiment proceeds from the first channel to the second channel along the <110> directions of the silicon wafer, thereby undercutting at least a portion of the region of the silicon wafer positioned between adjacent channels so as to fabricate printable semiconductor element(s), and optional bridge elements, between first and second channels from the (111) silicon wafer. This processing generates a printable semiconductor element(s) comprising a partially or entirely undercut silicon structure positioned between the first and second channels. In useful embodiments for making an array of printable semiconductor elements, a pattern comprising a large number of channels having well defined positions and dimensions is generated on the external surface of the silicon wafer, thereby enabling simultaneous fabrication of a large number of printable semiconductor elements in a single processing protocol.

In one embodiment, first and second channels on the external surface of the wafer are longitudinally oriented in a substantially parallel configuration. In this embodiment, the step of etching between the recessed features generates a partially or entirely undercut printable semiconductor ribbon positioned between the first and second channels. Preferably for some embodiments, the position and physical dimensions of first and second channels are selected such that the printable semiconductor ribbon remains integrally connected to the silicon wafer, until further processing such as processing steps involving contact with a transfer device, including but not limited to, an elastomeric stamp. In one embodiment, for example, the first channel terminates at a first end and the second channel terminates at a second end, and the printable semiconductor ribbon remains connected, directly or via an alignment maintenance element such as a bridge element, to the silicon wafer at a region between the first end of the first channel and at the second end of the channel. Additionally, the first channel and second channel may terminate at third and fourth ends, respectively, and optionally the printable semiconductor ribbon may also be connected, directly or via an alignment maintenance element such as a bridge element, to the silicon wafer at a region between the third and fourth ends.

The methods of this aspect of the present invention may further comprise a number of optional processing steps including, but not limited to, material deposition and/or patterning for generating electrically conductive structures such as electrical contacts, insulating structures and/or additional semiconductor structures onto the printable semiconductor element; annealing steps; wafer cleaning; surface processing for example surface polishing to decrease the roughness of the external surface; material doping processing; transfer, patterning, assembly and/or integration of printable semiconductor elements using a transfer device such as an elastomeric stamp or solution printing techniques; wafer surface refinishing; functionalizing the surface of the printable semiconductor elements for example by making hydrophilic or hydrophobic groups; material removal for example by etching; growth and/or removal of a thermal oxide layers on the printable semiconductor element and any combination of these optional processing steps.

The method of making printable semiconductor elements of the present invention may further comprise the step of releasing the printable semiconductor element(s) from the silicon wafer. In the context of this description, "release" refers to a process wherein the printable semiconductor element is separated from the silicon wafer. Release processing in the present invention may involve breaking one or more alignment maintaining elements, such as bridge elements, that connects one or more ends of the printable semiconductor element to a mother substrate. Release of the printable semiconductor element(s) from the silicon wafer may be carried out by contacting the printable semiconductor element with a transfer device, such as an elastomeric stamp useful for contact printing transfer processing, such as dry transfer contact printing. In some embodiments, an external surface of the semiconductor element is contacted, optionally conformally contacted, with a contact surface of a transfer device, such as a conformable elastomeric stamp, such that the semiconductor element binds to the contact surface. Optionally, the methods of this aspect of the present invention further include the step of registered transfer of printable semiconductor element(s) to a transfer device. Optionally, methods of this aspect of the present invention further include use of kinetically controlled separation rates to facilitate registered transfer of printable semiconductor elements to an elastomeric stamp.

An advantage of the present method for fabricating printable semiconductor elements is that it is capable of being carried out more than once using a given (111) silicon wafer starting material, such as a bulk (111) silicon wafer. The repeat processing capability of the present methods is beneficial because it makes possible multiple repetitions of the present methods using a single starting wafer possible, thereby enabling production of tens or even hundreds of square feet of printable semiconductor elements from one square foot of bulk silicon wafer starting material. In one embodiment, the methods further comprise the step of refinishing the external surface of the silicon wafer after release and transfer of the printable semiconductor element(s). In the context of this description, the expression "refinishing the silicon wafer" refers to processing steps that generate a flat, and optionally smooth, external surface of the silicon wafer, for example after the release and/or transfer of one or more printable semiconductor elements. Refinishing may be carried out by any technique known in the art, including, but not limited to, polishing, etching, grinding, micromachining, chemical-mechanical polishing; anisotropic wet etching. In a useful embodiment, the processing steps of (i) generating a plurality of recessed features on the external surface of the silicon wafer, (ii) masking at least a portion of the side surfaces, and optionally the entirety of the side, of the recessed features, and (iii) etching between the side surfaces, thereby generating additional printable semiconductor elements, are repeated after refinishing the external surface. Methods of the present invention including release and refinishing processing steps may be repeatedly carried out a large number of times using a single silicon wafer starting material.

In another aspect, the present invention provides printable semiconductor compositions and structures enabling high precision registered transfer, registered assembly and/or registered integration onto a receiving substrate. In the context of this description, the expressions "registered transfer", "registered assembly" and "registered integration" refer to concerted processes that maintain the relative spatial orientation of transferred elements, preferably to with about 5 microns and more preferably for some application to within about 0.1 microns. Registered processes of the present invention may also refer to the ability of methods of the present invention to transfer, assemble and/or integrate printable semiconductor elements to specific regions of a receiving substrate preselected to with 5 microns and preferably for some embodiment to with 500 nanometers. The printable semiconductor compositions and structures of this aspect of the present invention enhance the precision, accuracy and reproducibility of transfer printing assembly and integration techniques, thereby providing a robust and commercial practicable fabrication platform for making high performance electronic and electro-optical devices. Registered processing in the present invention may be carried out using a variety of transfer devices including, but not limited to, stamping transfer devices such as elastomeric and non-elastomeric stamps useful for contact printing transfer processing, such as dry transfer contact printing.

In one embodiment of this aspect, the present invention provides a printable semiconductor structure comprising a printable semiconductor element; and one or more bridge elements that are connected, optionally integrally connected, to the printable semiconductor structure and to a mother wafer. The physical dimensions, composition, shape and geometries of the printable semiconductor element, and bridge element(s) are selected so that contacting the printable semiconductor with a transfer device, such as an elastomeric stamp, is capable of fracturing the bridge element(s), thereby releasing the printable semiconductor structure from the mother wafer in a controlled manner.

In one embodiment, the bridge element(s), the printable semiconductor element and the mother wafer are integrally connected so as to comprise a unitary structure. In the context of the present description, a "unitary structure" refers to a composition wherein the mother wafer, bridge element(s) and printable semiconductor element comprise a monolithic structure. In an embodiment, for example, a unitary structure comprises a single, continuous semiconductor structure wherein one or more bridge elements are integrally connected to the mother wafer and to the printable semiconductor element. The present invention also includes, however, printable semiconductor structures wherein the bridge element(s), printable semiconductor element and mother wafer do not comprise a unitary structure, but, rather, are connected to each other via bonding mechanisms, such as covalent bonding, adhesives, and/or intermolecular forces (e.g., van der Waals forces, hydrogen bonding, dipole-dipole interactions, London dispersion forces).

Printable semiconductor structures of this aspect of the present invention may comprise a single or plurality of bridge elements connected, optionally integrally connected, to the printable semiconductor element and the mother wafer. Bridge elements of the present invention include structures that connect surfaces of the printable semiconductor element to the mother wafer. In one embodiment, one or more bridge elements connect the ends and/or bottom of the printable semiconductor element to the mother wafer. In an embodiment, bridge elements connect one or both ends terminating the length of a printable semiconductor ribbon to the mother wafer. In some embodiments, the printable semiconductor element and the bridge element(s) are at least partially undercut from the mother wafer. In an embodiment enabling high precision registered transfer, the printable semiconductor element and the bridge element are entirely undercut from the mother wafer. The present invention also includes, however, bridge elements that are not undercut structures that connect the printable semiconductor element to the mother wafer. An example of such a non-undercut configuration is a bridge element that connects and/or anchors the bottom of a printable semiconductor element to a mother wafer.

The present invention includes embodiments wherein bridge elements connect at least two different ends or surfaces of a printable semiconductor element to a mother wafer. Printable semiconductor structures having a plurality of bridge elements are useful for applications requiring enhanced, high precision registered transfer because they provide greater stability of the alignment, spatial orientation and position of semiconductor elements during contact and transfer to the contact surface of a transfer device and/or a receiving substrate.

Bridge elements of this aspect of the present invention are alignment maintaining elements which connect and/or anchor the printable semiconductor element to a mother substrate, such as a semiconductor wafer. Bridge elements are useful for maintaining selected orientations and/or positions of printable semiconductor elements during transfer, assembly and/or integration processing steps. Bridge elements are also useful for maintaining relative positions and orientations of a pattern or array of semiconductor elements during transfer, assembly and/or integration processing steps. In methods of the present invention, bridge elements preserve the positions and spatial orientations of printable semiconductor elements during contact, bonding, transfer and integration processes involving a contact surface of a transfer device, such as a conformable elastomeric stamp, thereby enabling registered transfer from a mother wafer to the transfer device.

Bridge elements in this aspect of the present invention are capable of disengaging from the printable semiconductor elements without significantly changing the positions and orientations of the printable semiconductor elements upon contact and/or movement of the transfer device. Disengagement may be achieved by fracture and/or disconnection of the bridge elements during contact and/or movement of the transfer device, for example during dry transfer contact printing. Fracture driven disengagement may be enhance by used of conformable transfer devices, such as elastomeric stamps, and/or kinetically controlled separation rates that facilitate transfer to the contact surface of a transfer device.

In one embodiment of this aspect of the present invention, the spatial arrangement, geometry, compositions and physical dimensions of bridge elements are selected to provide high precision registered transfer. In the context of this description, the expression "high precision registered transfer" refers to the transfer of printable semiconductor elements with changes in their relative spatially orientations and relative positions of less than about 10%. High precision registered transfer also refers to transfer of a printable semiconductor element from a mother substrate to a transfer device and/or receiving substrate with good placement accuracy. High precision registered transfer also refers to transfer of a pattern of printable semiconductor elements to a transfer device and/or receiving substrate with good pattern fidelity.

Bridge elements of the present invention may comprise partially or entirely undercut structures. Bridge elements useful in the present invention may have a uniform width or a systematically variable width, such as a width that tapers to a narrow neck that facilitates release via fracture. In some embodiments, the bridge elements have an average width selected from the range of about 100 nanometers to about 1000 microns, an average thickness selected from the range of about 1 nanometers to about 1000 microns and an average length selected from the range of about 100 nanometers to about 1000 microns. In some embodiments the physical dimensions and shape of the bridge element are defined relative to the physical dimensions of the printable semiconductor element it connects to the mother wafer. Registered transfer may be achieved, for example, using of a bridge element having an average width that is at least 2 times smaller, and preferably for some applications 10 times smaller, than the average width of the printable semiconductor element and/or an average thickness that is 1.5 times smaller than the average thickness of the printable semiconductor element. Bridge elements may also be provided with sharp features to facilitate their fracture and the registered transfer of the printable semiconductor element from the mother wafer to the transfer device and/or receiving substrate.

In one embodiment of this aspect, the printable semiconductor element comprises a printable semiconductor ribbon extending a length along a principle longitudinal axis terminating in a first end and a second end. A first bridge element connects the first end of the printable semiconductor ribbon to the mother wafer and a second bridge element connects the second end of the semiconductor ribbon to the mother wafer. Optionally, the printable semiconductor ribbon, first bridge element and second bridge element are entirely undercut structures. In an embodiment, the first bridge element, second bridge element, printable semiconductor ribbon and mother wafer comprise a unitary semiconductor structure. In an embodiment, first and second bridge element have average widths that are about 1 to about 20 times less than the average width of the printable semiconductor ribbon. In an embodiment, the first and second bridge elements are each connected to less than 1 to about 100% of the cross sectional areas of the first end and second ends, respectively, of the printable semiconductor ribbon. The present invention includes embodiments wherein first and second bridge elements have a spatial configuration proximal to or distal to each other.

In the present invention, the external surfaces of printable semiconductor elements and/or bridge element may be functionalized to enhance registered transfer to a transfer device, such as an elastomeric stamp. Functionalization schemes useful for registered transfer include adding hydrophilic and/or hydrophobic groups to the surface of the printable semiconductor element to enhance bonding to the contact surface of a transfer device. An alternate chemistry strategy is to coat one or more of the contacting surfaces (the surfaces on the printable elements and/or on the receiving surface) with metals, including but not limited to gold. These metals may be treated with self assembled monolayers that may chemically bridge the receiving surface to the printable elements. In addition two nominally bare gold surfaces may form a metallic welded bond upon contact (e.g., via cold welding)

Printable semiconductor elements of the present invention may be fabricated from a wide range of materials. Useful precursor materials for fabricating printable semiconductor elements include semiconductor wafer sources, including bulk semiconductor wafers such as single crystalline silicon wafers, polycrystalline silicon wafers, germanium wafers; ultra thin semiconductor wafers such as ultra thin silicon wafers; doped semiconductor wafers such as P-type or N-type doped wafers and wafers with selected spatial distributions of dopants (semiconductor on insulator wafers such as silicon on insulator (e.g. Si—$SiO_2$, SiGe); and semiconductor on substrate wafers such as silicon on substrate wafers and silicon on insulator. Further, printable semiconductor elements of the present invention may be fabricated from scrape or unused high quality or reprocessed semiconductor materials that are left over from semiconductor device processing using conventional methods. In addition, printable semiconductor elements of the present invention may be fabricated from a variety of nonwafer sources, such as a thin films of amorphous, polycrystalline and single crystal semiconductor materials (e.g. polycrystalline silicon, amorphous silicon, polycrystalline GaAs and amorphous GaAs) that is deposited on a sacrificial layer or substrate (e.g. SiN or $SiO_2$) and subsequently annealed, and other bulk crystals, including, but not limited to, graphite, $MoSe_2$ and other transition metal chalcogenides, and yttrium barium copper oxide.

An exemplary transfer device of the present invention comprises a dry transfer stamp, such as an elastomeric transfer stamp, a composite transfer stamp, a conformable transfer device such as a conformable elastomeric stamp, and multilayer transfer devices such as a multilayer elastomeric stamp. Transfer devices, such as an elastomeric stamp, are useful for contact printing processing, such as dry transfer contact printing. Transfer devices of the present invention are optionally conformable. Transfer devices useful for the present invention include transfer devices comprising a plurality of polymer layers as described in U.S. patent application Ser. No. 11/115,954, entitled "Composite Patterning Devices for Soft Lithography", filed with the U.S. Patent and Trademark Office on Apr. 27, 2005, which is hereby incorporated by reference in its entirety. An exemplary patterning device useable in the methods of the present invention comprises a polymer layer having a low Young's Modulus, such as a poly(dimethylsiloxane) (PDMS) layer, preferably for some applications having a thickness selected from the range of about 1 micron to about 100 microns. Use of a low modulus polymer layer is beneficial because it provides transfer devices capable of establishing good conformal contact with one or more printable semiconductor elements, particularly printable semiconductor elements having curved, rough, flat, smooth and/or contoured exposed surfaces, and capable of establishing good conformal contact with substrate surfaces having a wide range of surface morphologies, such as curved, rough, flat, smooth and/or contoured substrate surfaces.

The present invention also includes methods transferring, including high precision register transfer, of printable semiconductor elements to a transfer device, such as an elastomeric stamp, and/or methods of assembling and/or integrating printable semiconductor elements, including high precision registered assembly and/or integration, on a receiving substrate. An advantage of the printing methods and compositions of the present invention is that patterns of printable semiconductors elements may be transferred and assembled onto substrate surfaces in a manner preserving selected spatial orientations of semiconductor elements which define the pattern. This aspect of the present invention is particularly beneficial for applications wherein a plurality of printable semiconductor elements are fabricated in well defined positions and relative spatial orientations which directly correspond to a selected device configuration or array of device configurations. Transfer printing methods of the present invention are capable of transferring, positioning and assembling printable semiconductor elements and/or printable functional devices including, but not limited to, transistors, optical waveguides, microelectromechanical systems, nanoelectromechanical systems, laser diodes, or fully formed circuits.

The present processing methods and composition are applicable to bulk semi-metal materials in addition to semiconducting materials. For example, the present methods, compositions and structure may be used with carbonaceous materials, such as graphite and graphene, and other layered materials such as mica.

In one embodiment, the present invention provides a method of transferring a printable semiconductor element to a transfer device comprising the steps of: (i) providing a printable semiconductor structure comprising a printable semiconductor element; and at least one bridge element connected to the printable semiconductor structure and connected to a mother wafer, wherein the printable semiconductor element and the bridge element(s) are at least partially undercut from the mother wafer; (ii) contacting the printable semiconductor element with a transfer device having a contact surface, wherein contact between the contact surface and the printable semiconductor element binds the printable semiconductor element to the contact surface; and (iii) moving the transfer device in a manner resulting in the fracture the bridge element(s), thereby transferring the printable semiconductor structure from the mother wafer to the transfer device.

In one embodiment, the present invention provides a method for assembling a printable semiconductor element on a receiving surface of a substrate comprising the steps of: (i) providing a printable semiconductor element; and at least one bridge element connected to said printable semiconductor structure and connected to a mother wafer, wherein said printable semiconductor element and said bridge element(s) are at least partially undercut from said mother wafer; (ii) contacting said printable semiconductor element with a transfer device having a contact surface, wherein contact between said contact surface and said printable semiconductor element binds said printable semiconductor element to said contact surface; (iii) moving said transfer device in a manner resulting in the fracture said bridge element(s), thereby transferring said printable semiconductor structure from said mother wafer to said transfer device, thereby forming said contact surface having said printable semiconductor element disposed thereon; (iv) contacting said printable semiconductor element disposed on said contact surface with said receiving surface of said substrate; and (v) separating said contact surface of said conformable transfer device and said printable semiconductor element, wherein said printable semiconductor element is transferred onto said receiving surface, thereby assembling said printable semiconductor element on said receiving surface of said substrate.

In one embodiment, the present invention provides a method for fabricating a printable semiconductor element comprising the steps of: (1) providing a silicon wafer having a (111) orientation and having an external surface; (2) generating a plurality of recessed features on said external surface of said silicon wafer, wherein each of said recessed features comprises a bottom surface and side surfaces of exposed silicon wafer; (3) masking at least a portion of said side surfaces of said recessed features; and (4) etching between said recessed features, wherein etching occurs along <110> directions of said silicon wafer, thereby fabricating said printable semiconductor element.

BRIEF DESCRIPTION OF THE DRAWINGS

FIG. 1C provides a cross sectional view schematic processing diagram illustrating fabrication methods wherein the side surfaces of recessed features are partially, but not completely, masked. FIG. 1D provides a cross sectional view schematic processing diagram illustrating fabrication methods wherein the side surfaces of recessed features are completely masked.

FIG. 1E provides an image of recessed features in Si (111) having a trench configuration generated without side surface refining. The recessed features shown in FIG. 1E were defined by phase shift photolithography, metal lift-off and reactive ion etching, and subsequent removal of metal etch mask. FIG. 1F provides an image of recessed features in Si (111) having a trench configuration generated with side surface refining.

FIG. 17: High performance HEMTs formed from the Ws-GaN on plastic substrate. (a-b) Optical micrographs of actual flexible Ws-GaN devices. Schematic illustration of cross section device geometry is shown in FIG. 14B (c) I-V curves of Ws-GaN based HEMTs at a range of gate voltage (Vg=-4 V to 1 V). The channel length, the channel width and gate width of the device were 20 μm, 170 μm, and 5 μm respectively. (d) The transfer characteristics, measured at a constant source-drain voltage ($V_{ds}$=2V), indicated the transconductance of 1.5 mS FIG. 18 (a) An optical image of the actual bending stage and plastic device. (b) Transfer curves obtained at different bending radii (and its corresponding strains). (c) I-V curves obtained when the plastic sheet is bent at maximum bending radius (orange) and flattened after bending cycles (blue).

DETAILED DESCRIPTION OF THE INVENTION

Figure 1A:
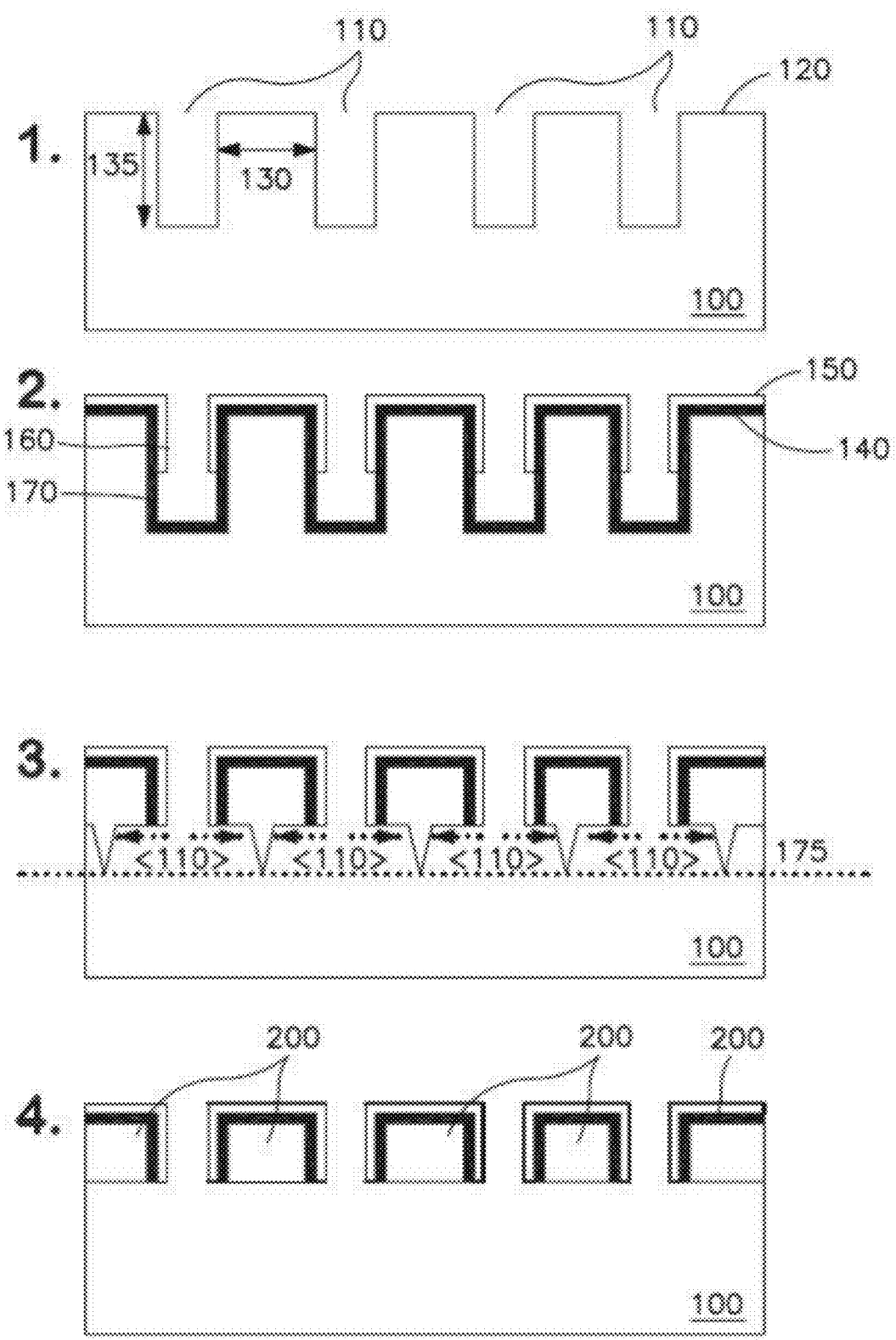
FIG. 1A provides a schematic cross section view diagram illustrating exemplary methods of the present invention for making printable semiconductor elements comprising ribbons of single crystalline silicon from a bulk silicon wafer having a (111) orientation.

Referring to the drawings, like numerals indicate like elements and the same number appearing in more than one drawing refers to the same element. In addition, hereinafter, the following definitions apply:

"Printable" relates to materials, structures, device components and/or integrated functional devices that are capable of transfer, assembly, patterning, organizing and/or integrating onto or into substrates without exposure of the substrate to high temperatures (i.e. at temperatures less than or equal to about 400 degrees Celsius). In one embodiment of the present invention, printable materials, elements, device components and devices are capable of transfer, assembly, patterning, organizing and/or integrating onto or into substrates via solution printing or dry transfer contact printing.

"Printable semiconductor elements" of the present invention comprise semiconductor structures that are able to be assembled and/or integrated onto substrate surfaces, for example using by dry transfer contact printing and/or solution printing methods. In one embodiment, printable semiconductor elements of the present invention are unitary single crystalline, polycrystalline or microcrystalline inorganic semiconductor structures. In one embodiment, printable semiconductor elements are connected to a substrate, such as a mother wafer, via one or more bridge elements. In this context of this description, a unitary structure is a monolithic element having features that are mechanically connected. Semiconductor elements of the present invention may be undoped or doped, may have a selected spatial distribution of dopants and may be doped with a plurality of different dopant materials, including P and N type dopants. The present invention includes microstructured printable semiconductor elements having at least one cross sectional dimension greater than or equal to about 1 micron and nanostructured printable semiconductor elements having at least one cross sectional dimension less than or equal to about 1 micron. Printable semiconductor elements useful in many applications comprises elements derived from "top down" processing of high purity bulk materials, such as high purity crystalline semiconductor wafers generated using conventional high temperature processing techniques. In one embodiment, printable semiconductor elements of the present invention comprise composite structures having a semiconductor operational connected to at least one additional device component or structure, such as a conducting layer, dielectric layer, electrode, additional semiconductor structure or any combination of these. In one embodiment, printable semiconductor elements of the present invention comprise stretchable semiconductor elements and/or heterogeneous semiconductor elements.

"Cross sectional dimension" refers to the dimensions of a cross section of device, device component or material. Cross sectional dimensions include width, thickness, radius, and diameter. For example, printable semiconductor elements having a ribbon shape are characterized by a length and two cross sectional dimensions; thickness and width. For example, printable semiconductor elements having a cylindrical shape are characterized by a length and the cross sectional dimension diameter (alternatively radius).

"Longitudinally oriented in a substantially parallel configuration" refers to an orientation such that the longitudinal axes of a population of elements, such as printable semiconductor elements, are oriented substantially parallel to a selected alignment axis. In the context of this definition, substantially parallel to a selected axis refers to an orientation within 10 degrees of an absolutely parallel orientation, more preferably within 5 degrees of an absolutely parallel orientation.

The terms "flexible" and "bendable" are used synonymously in the present description and refer to the ability of a material, structure, device or device component to be deformed into a curved shape without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to about 5%, preferably for some applications larger than or equal to about 1%, and more preferably for some applications larger than or equal to about 0.5%.

"Semiconductor" refers to any material that is a material that is an insulator at a very low temperature, but which has a appreciable electrical conductivity at a temperatures of about 300 Kelvin. In the present description, use of the term semiconductor is intended to be consistent with use of this term in the art of microelectronics and electrical devices. Semiconductors useful in the present invention may comprise element semiconductors, such as silicon, germanium and diamond, and compound semiconductors, such as group IV compound semiconductors such as SiC and SiGe, group III-V semiconductors such as AlSb, AlAs, AIn, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electrical properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light emitting materials, such as light emitting diodes (LEDs) and solid state lasers. Impurities of semiconductor materials are atoms, elements, ions and/or molecules other than the semiconductor material(s) themselves or any dopants provided to the semiconductor material. Impurities are undesirable materials present in semiconductor materials which may negatively impact the electrical properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

"Good electronic performance" and "high performance" are used synonymously in the present description and refer to devices and device components have electronic characteristics, such as field effect mobilities, threshold voltages and on-off ratios, providing a desired functionality, such as electronic signal switching and/or amplification. Exemplary printable semiconductor elements of the present invention exhibiting good electronic performance may have intrinsic field effect mobilities greater than or equal 100 $cm^2 V^{-1} s^{-1}$, preferably for some applications greater than or equal to about 300 $cm^2 V^{-1} s^{-1}$. Exemplary transistors of the present invention exhibiting good electronic performance may have device field effect mobilities great than or equal to about 100 $cm^2 V^{-1} s^{-1}$, preferably for some applications greater than or equal to about 300 $cm^2 V^{-1} s^{-1}$, and more preferably for some applications greater than or equal to about 800 $cm^2 V^{-1} s^{-1}$. Exemplary transistors of the present invention exhibiting good electronic performance may have threshold voltages less than about 5 volts and/or on-off ratios greater than about $1 \times 10^4$.

"Plastic" refers to any synthetic or naturally occurring material or combination of materials that can be molded or shaped, generally when heated, and hardened into a desired shape. Exemplary plastics useful in the devices and methods of the present invention include, but are not limited to, polymers, resins and cellulose derivatives. In the present description, the term plastic is intended to include composite plastic materials comprising one or more plastics with one or more additives, such as structural enhancers, fillers, fibers, plasticizers, stabilizers or additives which may provide desired chemical or physical properties.

"Elastomer" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, thermoplastic elastomers, styrenic materials, olefenic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones. Elastomers provide elastomeric stamps useful in the present methods.

"Transfer device" refers to a device or device component capable of receiving and/or relocating an element or array of elements, such as printable semiconductor elements. Transfer devices useful in the present invention include conformable transfer devices, having one or more contact surfaces capable of establishing conformal contact with elements undergoing transfer. The present methods and compositions are particularly well suited for use in connection with a transfer device comprising an elastomeric stamp useful for contract printing processing.

"Large area" refers to an area, such as the area of a receiving surface of a substrate used for device fabrication, greater than or equal to about 36 square inches.

"Device field effect mobility" refers to the field effect mobility of an electrical device, such as a transistor, as computed using output current data corresponding to the electrical device.

"Conformal contact" refers to contact established between surfaces, coated surfaces, and/or surfaces having materials deposited thereon which may be useful for transferring, assembling, organizing and integrating structures (such as printable semiconductor elements) on a substrate surface. In one aspect, conformal contact involves a macroscopic adaptation of one or more contact surfaces of a conformable transfer device to the overall shape of a substrate surface or the surface of an object such as a printable semiconductor element. In another aspect, conformal contact involves a microscopic adaptation of one or more contact surfaces of a conformable transfer device to a substrate surface leading to an intimate contact without voids. The term conformal contact is intended to be consistent with use of this term in the art of soft lithography. Conformal contact may be established between one or more bare contact surfaces of a conformable transfer device and a substrate surface. Alternatively, conformal contact may be established between one or more coated contact surfaces, for example contact surfaces having a transfer material, printable semiconductor element, device component, and/or device deposited thereon, of a conformable transfer device and a substrate surface. Alternatively, conformal contact may be established between one or more bare or coated contact surfaces of a conformable transfer device and a substrate surface coated with a material such as a transfer material, solid photoresist layer, prepolymer layer, liquid, thin film or fluid.

"Placement accuracy" refers to the ability of a transfer method or device to transfer a printable element, such as a printable semiconductor element, to a selected position, either relative to the position of other device components, such as electrodes, or relative to a selected region of a receiving surface. "Good placement" accuracy refers to methods and devices capable of transferring a printable element to a selected position relative to another device or device component or relative to a selected region of a receiving surface with spatial deviations from the absolutely correct position less than or equal to 50 microns, more preferably less than or equal to 20 microns for some applications and even more preferably less than or equal to 5 microns for some applications. The present invention provides devices comprising at least one printable element transferred with good placement accuracy.

"Fidelity" refers to a measure of how well a selected pattern of elements, such as a pattern of printable semiconductor elements, is transferred to a receiving surface of a substrate. Good fidelity refers to transfer of a selected pattern of elements wherein the relative positions and orientations of individual elements are preserved during transfer, for example wherein spatial deviations of individual elements from their positions in the selected pattern are less than or equal to 500 nanometers, more preferably less than or equal to 100 nanometers.

"Undercut" refers to a structural configuration wherein the bottom surfaces of an element, such as printable semiconductor element, bridge element or both, are at least partially detached or not fixed from another structure, such as a mother wafer or bulk material. Entirely undercut refers to a refers to a structural configuration wherein the bottom surfaces of an element, such as printable semiconductor element, bridge element or both, is completely detached from another structure, such as a mother wafer or bulk material. Undercut structures may be partially or entirely free standing structures. Undercut structures may be partially or fully supported by another structure, such as a mother wafer or bulk material, that they are detached from. Undercut structures may be attached, affixed and/or connected to another structure, such as a wafer or other bulk material, at surfaces other than the bottom surfaces. For example, the present invention includes methods and compositions wherein printable semiconductor elements and/or bridge elements are connected to a wafer at ends positioned on surfaces other than their bottom surfaces (e.g., See FIGS. 2A and 2B).

In the following description, numerous specific details of the devices, device components and methods of the present invention are set forth in order to provide a thorough explanation of the precise nature of the invention. It will be apparent, however, to those of skill in the art that the invention can be practiced without these specific details.

This invention provides methods and devices for fabricating printable semiconductor elements and assembling printable semiconductor elements and patterns of printable semiconductor elements onto substrate surfaces. Methods for fabricating high quality printable semiconductor elements from low cost bulk semiconductor materials are provided. The present invention also provides semiconductor structures and methods providing high precision registered transfer of printable semiconductor elements from a mother wafer to a transfer device and/or receiving substrate. The methods, devices and device components of the present invention are capable of generating high performance electronic and optoelectronic devices and arrays of devices on flexible plastic substrates.

Figure 1B:
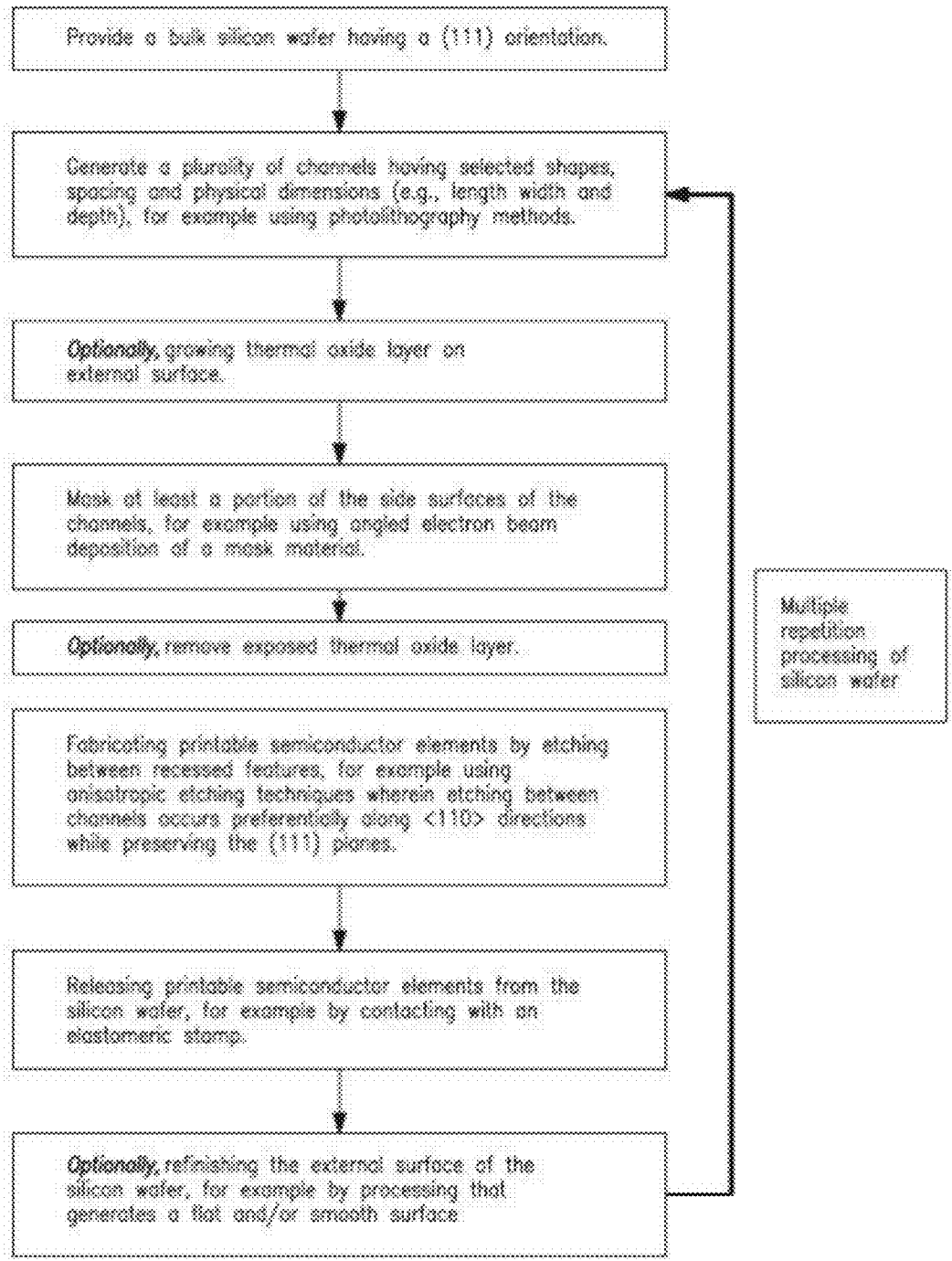
FIG. 1B provides a flow diagram setting forth processing steps in the present methods for generating printable semiconductor elements from bulk silicon wafers.

FIG. 1A provides a schematic cross section view diagram illustrating exemplary methods of the present invention for making printable semiconductor elements comprising printable semiconductor ribbons of single crystalline silicon from a bulk silicon wafer having a (111) orientation. FIG. 1B provides a flow diagram setting forth processing steps, including repeatable processing steps, in the present methods for generating printable semiconductor elements from bulk silicon wafers.

As shown in FIGS. 1A (panel 1) and 1B, a silicon wafer having a (111) orientation 100 is provided. Silicon wafer 100 having a (111) orientation may be a bulk silicon wafer. A plurality of channels 110 having preselected physical dimensions, spacing and spatial orientations is etched into external surface 120 of silicon wafer 100, for example using a combination near field photolithography, lift-off and dry etching techniques. In this embodiment, the spacing 130 between channels defines the width of the printable semiconductor ribbons fabricate using this method.

As shown in FIGS. 1A (panel 2) and 1B, optionally a thermal oxide layer 140 is grown on channels 110 and external surface 120, for example by heating the (111) silicon wafer 100. Next, a mask 150 is deposited on the side surfaces of channels 110 and external surface 120, for example using angled electron beam evaporation of one or more mask materials such as a metal or combination of metals, thereby generating masked and unmasked regions the silicon wafer 100. This masking step generates masked regions 160 of the side surfaces and unmasked regions 170 of the side surfaces of channels 110. The present invention includes embodiments wherein the entire side surfaces of channels 110 along depth 135 are masked (See e.g., FIG. 1D). The extent that masked region extend down the side surfaces, in some embodiments, is controlled by angle of evaporation of mask materials, the "shadows" cast by the surface features on external surface 120 of wafer 100 and the degree of collimation of the flux of mask materials. The depth 135 of the trenches 110 and the extent of masked regions 160 of the side surfaces, at least in part, define the thickness of the printable semiconductor ribbon generated by these methods. Optionally, exposed regions of thermal oxide layer 140 is removed prior to additional processing, for example using dry chemical etching techniques.

As shown in FIGS. 1A (panel 3) and 1B, unmasked regions 170 of the side surfaces of channels 110 are etched. In an exemplary embodiment, unmasked regions 170 of the side surfaces of channels 110 are anisotropically etched such that etching between channels occurs preferentially along <110> directions of the silicon wafer 100, thereby undercutting regions of (111) silicon wafer 100 between adjacent channels 110. The direction of the etch front <110> directions is schematically shown by the dashed arrows in panel 3 of FIG. 1B. In one embodiment, an anisotropic etching system is chosen so that etching does not substantially occur along <111> directions of the silicon wafer 100. The selectivity of the anisotropic etching system and the (111) orientation of silicon wafer 100 provides an intrinsic etch stop that is schematically represented as dotted line 175. Useful anisotropic etching systems for this aspect of the present invention include a wet chemical etching system using a hot basic solution. In some embodiments, an etching system is chosen for this processing step that generates a printable semiconductor ribbon having a relatively smooth underside (e.g. roughness less than 1 nanometer).

As shown in FIGS. 1A (panel 4) and 1B, etching between channels generates printable semiconductor ribbons 200 that are entire undercut from the silicon wafer 100. In one embodiment, the physical dimensions, shapes and spatial orientations of channels 110 are selected such that the etching processing steps generates printable semiconductor ribbons 200 that are connected at one or more ends to the silicon wafer 100. Printable semiconductor ribbons 200 generated by the present methods may be flat, thin and mechanically flexible. Optionally, the mask 150 is removed, for example via wet chemical etching techniques.

Referring to the flow diagram in FIG. 1B, optionally the present method includes the step of releasing printable semiconductor elements from the silicon wafer, for example by contact with an elastomeric stamp. In exemplary methods, contacting the printable semiconductor elements with an elastomeric stamp fractures one or more bridge elements connecting the printable semiconductor elements to the silicon wafer 100, thereby resulting in registered transfer of the printable semiconductor element(s) from silicon wafer 100 to the elastomeric stamp. Methods of the present invention include use of kinetically controlled peel rates to facilitate register transfer from silicon wafer 100 to an elastomeric stamp transfer device.

Optionally, the present invention includes high yield fabrication methods, further comprising the step of refinishing the external surface of the silicon wafer, for example by surface processing steps (e.g., polishing, grinding, etching, micromachining etc.) that generate a flat and/or smooth external surface of silicon wafer 100. As shown in FIG. 1B, refinishing silicon wafer 100, enables the fabrication process to be repeated multiple times, thereby providing high yields of printable semiconductor ribbons from a single silicon wafer starting material.

FIG. 1C provides a cross sectional view schematic processing diagram illustrating fabrication methods wherein the side surfaces of recessed features are partially, but not completely, masked. FIG. 1D provides a cross sectional view schematic processing diagram illustrating fabrication methods wherein the side surfaces of recessed features are completely masked. As shown in FIG. 1D, a portion, but not all, of the floors of the recessed features are also masked. In this embodiment, the method includes the processing step of etching material underneath the masked side surfaces of the recessed feature. The partially masked floor configuration provides an inlet for etchant such that etching may occur between recessed features, such as adjacent recessed features. Methods of the present invention employing complete masking of the side surfaces of recessed feature are beneficial for providing enhanced accuracy and precision in the definition and selection of the thickness of the printable semiconductor elements. In one embodiment the side surfaces are completely masked such that the boundary of the passivation happens on the floors of the recessed features. In these methods, the thickness of the ribbon is not defined by the boundary of the passivation, but instead by the height floor the floor of the trenches and the top surface of the wafer.

The methods of fabricating printable semiconductor elements of the present invention may further comprise the step of refining the geometry, physical dimensions and morphology of the recessed features. Refining of the recessed features may be carried out at any point in the fabrication process after generation of the recessed features and prior to formation and/or release of the printable semiconductor elements. In a useful embodiment, refining of the recessed features is carried out prior to processing steps involving masking, partially or completely, the side surfaces of the recessed features. FIG. 1E provides an image of recessed features in Si (111) having a trench configuration generated without side surface refining. The recessed features shown in FIG. 1E were defined by phase shift photolithography, metal lift-off and reactive ion etching, and subsequent removal of metal etch mask. FIG. 1F provides an image of recessed features in Si (111) having a trench configuration generated with side surface refining. The recessed features shown in FIG. 1F were defined by phase shift photolithography, metal lift-off and reactive ion etching, refining by anisotropic etching in hot KOH solution, and subsequent removal of metal etch mask. This sample is also treated by angled metal evaporation. As shown by a comparison of these figures, the floors and side surfaces of the trenches in FIG. 1F are more smoothly defined than the floors and side surfaces of the trenches in FIG. 1E.

Refining in this context refers to material removal processing of surfaces of the recessed feature, such as the side surfaces and floors of recessed features. Refining includes processing resulting in smoother recessed feature surfaces and/or processing resulting in recessed features having more uniform physical dimensions and surface morphologies. In one embodiment, the geometry, physical dimensions and/or morphology is refined via anisotropic etching techniques, for example etching using hot KOH solution. Anisotropic wet etch refining of trenches is particularly useful for generation of (111) silicon ribbons capable of register transfer. The advantages of the refining processing steps include: (i) providing improved definition of the trench floors determined from the crystallographic axes of the mother wafer, and (2) providing improved definition of the side surfaces of the trench by the crystallographic axes of the mother wafer.

Figure 2A:
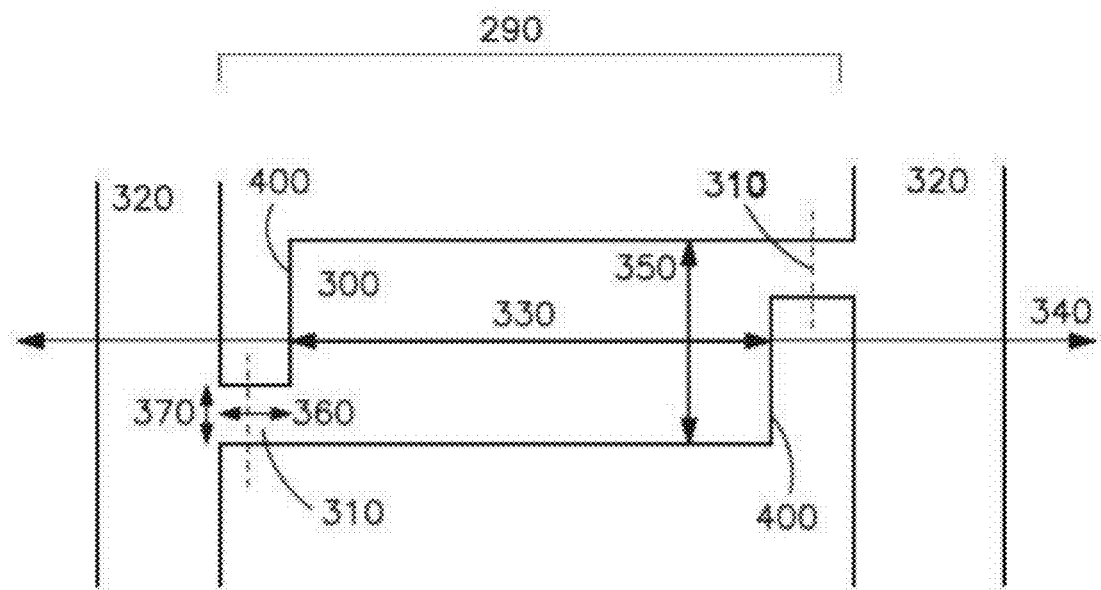
FIGS. 2A and 2B provide schematic top plan view diagrams of printable semiconductor structures of the present invention comprising a printable semiconductor element and two bridge elements. Bridge elements are positioned distal to each other in the structure shown in FIG. 2A, and bridge elements are positioned proximal to each other in the structure shown in FIG. 2B.
Figure 2B:
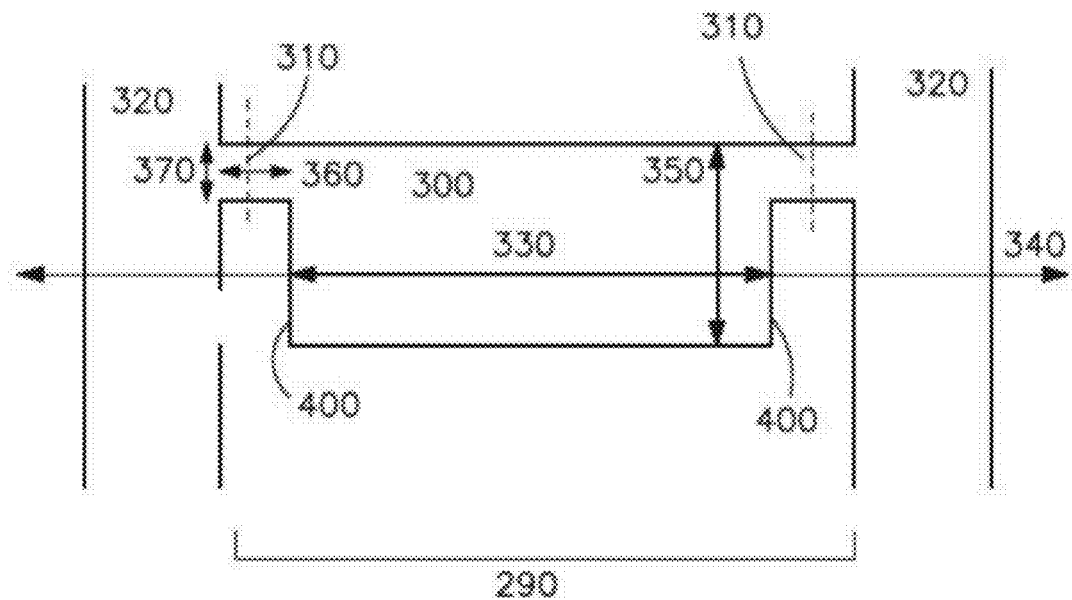

FIGS. 2A and 2B provide schematic top plan view diagrams of printable semiconductor structures of the present invention comprising a printable semiconductor element and two bridge elements. Bridge elements are positioned distal to each other in the structure shown in FIG. 2A and bridge elements are positioned proximal to each other in the structure shown in FIG. 2B. A shown in FIGS. 2A and 2B, printable semiconductor structures 290 comprise printable semiconductor element 300 and bridge elements 310. Bridge elements 310 are alignment maintenance elements that connect, optionally integrally connect, semiconductor element 300 to mother wafer 320. In one embodiment, printable semiconductor element 300 and bridge elements 310 are partially or entirely undercut from mother wafer 320. In one embodiment, printable semiconductor element 300, bridge elements 310 and mother wafer 320 are a unitary structure, such as a single, continuous semiconductor structure.

Printable semiconductor elements 300 longitudinal extend length 330 along longitudinal axis 340 and extend width 350. Length 330 terminates in first and second ends 400 that are connected to bridge elements 310. Bridge elements 310 extend lengths 360 and extend widths 370. In the embodiment shown in FIGS. 1A and 1B, bridge elements connect to less than the entire width and/or cross sectional area of the ends 400 of printable semiconductor elements 300. As shown in FIGS. 2A and 2B, width 370 of bridge elements 310 is smaller than width 350 of printable semiconductor elements 300 to facilitate registered transfer. In addition, semiconductor elements 300 have surface areas of exposed external surfaces that are larger than the surface areas of exposed external surfaces of bridge elements 310. For some processing and transfer methods of the present invention, these dimensional attributes of bridge elements 310 and printable semiconductor elements 300 facilitate high precision registered transfer, assembly and/or integration of printable semiconductor elements 300

The structural support provided by bridge elements 310 holds semiconductor element 300 in a preselected spatial orientation before and/or during transfer from wafer 320, for example using an elastomeric stamp transfer device. The anchoring functionality of bridge elements 310 is desirable in many fabrication applications wherein the relative position, spacing and spatial orientation of one or printable semiconductor elements corresponds to a desired functional device and/or circuit design. The physical dimensions, spatial orientation and geometry of bridge elements is selected such that semiconductor elements 300 are capable of release upon contact with a transfer device. In some embodiments release is achieved by fracture, for example along the dotted lines shown in FIGS. 2B and 2B. It is important for some applications that the force required to fracture the bridge elements 310 is low enough so that the positions and spatial orientations of semiconductor elements 300 are not substantially disrupted during transfer.

Figure 2C:
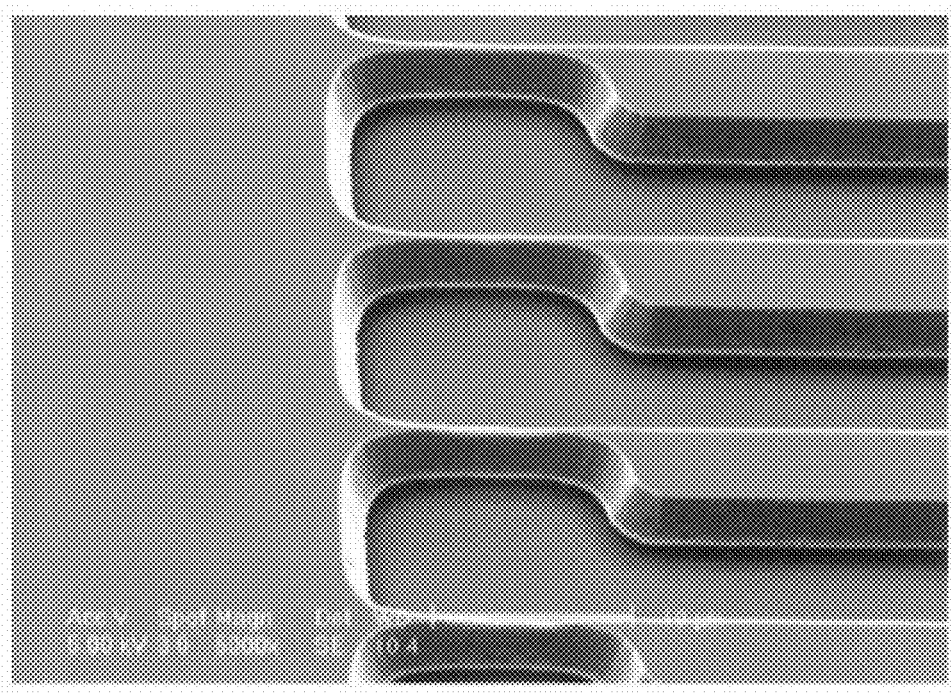
FIGS. 2C and 2D provide images of bridge elements connecting a printable semiconductor element to a mother wafer.
Figure 2D:
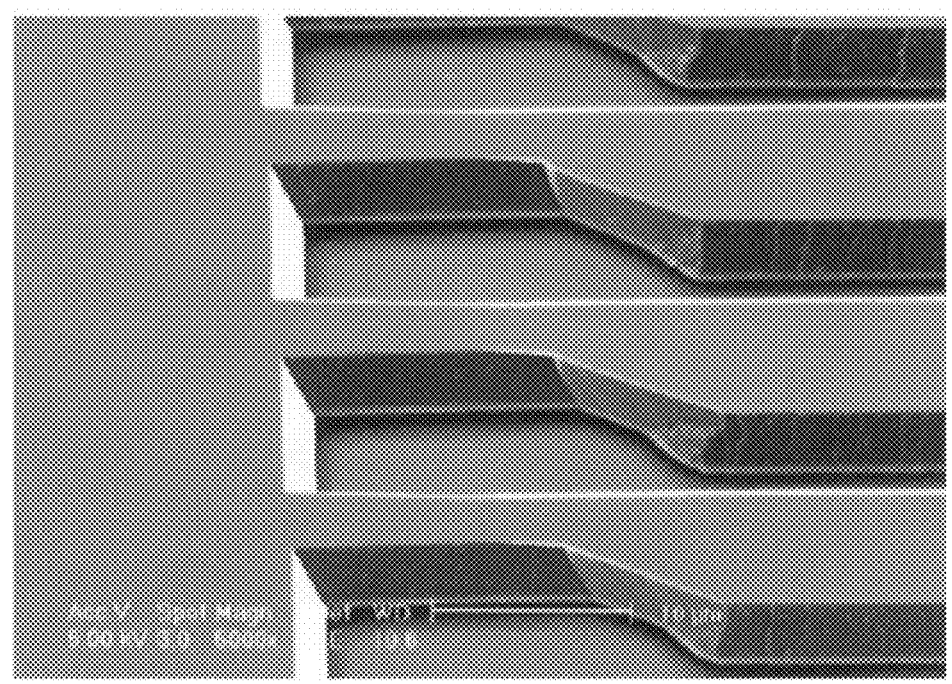

The spatial arrangement, geometry, compositions and physical dimensions of bridge elements or any combination of these are selected in the present invention to provide high precision registered transfer. FIGS. 2C and 2D provide images of bridge elements connecting a printable semiconductor element to a mother wafer. Printable silicon elements and (narrow) bridge elements connecting printable elements to the mother (SOI) wafer are shown in FIG. 2C. The geometry of the printable semiconductor element and bridge element is defined by SF6 etching. As shown in FIG. 2C, the printable semiconductor element and bridge element confirmation has rounded corners. The roundness of these corners and the overall geometry of these elements decrease the ability to release the printable semiconductor element with a PDMS transfer device. Printable silicon elements and (narrow) bridge elements connecting printable elements to the mother (SOI) wafer are also shown in FIG. 2D. Geometry was defined by hot KOH anisotropic etching. As shown in FIG. 2D, the printable semiconductor element and bridge element confirmation has sharp corners. The sharpness of those corners concentrates the stress at well defined breaking points and, thus, enhance the ability to release these elements be with a PDMS transfer device.

EXAMPLE 1

Printed Arrays of Aligned GaAs Wires for Flexible Transistors, Diodes, and Circuits on Plastic Substrates Aligned arrays of GaAs wires with integrated ohmic contacts generated from high-quality, single-crystalline wafers by the use of photolithography and anisotropic chemical etching provide a promising class of material for transistors, Schottky diodes, logic gates and even more complex circuits on flexible plastic substrates. These devices exhibit excellent electronic and mechanical characteristics, which are both important to the emerging area of low cost, large area flexible electronics, often referred to as macroelectronics.

Micron and nanoscale wires, ribbons, platelets, etc. of single crystal inorganic semiconductors are attractive building blocks for functional devices (e.g., optics, optoelectronics, electronics, sensing, etc.) that can be used in many applications. For example, Si nanowires synthesized by "bottom-up" approaches can be assembled using Langmuir/Blodgett techniques (or microfluidics) into aligned arrays and used as transport channels for flexible thin-film transistors (TFTs) on plastic substrates. In a different approach, micro/nanoscale elements of Si (microstructured silicon; μs-Si) in the form of ribbons with thicknesses of ~100 nm and widths ranging from several microns to hundreds of microns, can be generated from high-quality, single-crystalline bulk sources (e.g., silicon-on-insulator, SOI wafers, or bulk wafers) though "top-down" approaches. This type of material can be used to fabricate flexible TFTs on plastic with device mobilities as high as 300 $cm^2 \cdot V^{-1} \cdot s^{-1}$. The high quality of the wafer based source material (in terms of well-defined doping levels, uniformity in doping, low surface roughness, and density of surface defects) leads to a silicon based semiconductor material with similarly good properties, which are beneficial for reliable, high performance device operation. The "top-down" fabrication process is attractive also because it offers the possibility of preserving the highly ordered organization nano/microstructures defined at the wafer level, during "dry transfer printing" to the final (e.g. plastic, or other) device substrate. Although high performance is possible with Si, even better characteristics (e.g. operating speed) is achieved with GaAs, for example, due to its high intrinsic electron mobility of ~8500 $cm^2 \cdot V^{-1} \cdot s^{-1}$. Previous studies demonstrate techniques for generating, using anisotropic chemical etching steps, nano/microwires with triangular cross sections from GaAs wafers with "top-down" fabrication steps. By forming ohmic contacts on these GaAs wires while they are still tethered to the wafer, and then transfer printing them to plastic substrates, mechanically flexible metal-semiconductor field-effect transistors (MESFETs) are built with excellent properties. These transistors show unity small signal gains in the gigahertz regime. This example demonstrates the ability to build, with transfer printing as the assembly/integration strategy, various elemental units of functional circuits, such as inverters and logic gates, on plastic substrates using these types of MESFETs as well as GaAs wire based diodes as active components. These types of systems are important in large area electronic circuits for steerable antennas, structural health monitors and other devices that have demanding requirements for high speed, high performance flexible devices on lightweight plastic substrates.

Figure 3A:
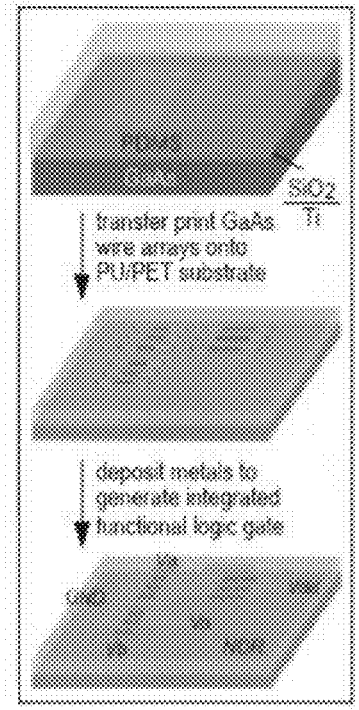
FIG. 3. (a) Schematic illustration of the process for fabricating transistors, diodes and logic circuits on plastic using transfer printed GaAs wires integrated with ohmic stripes, prepared from a single-crystalline GaAs wafer. (b) SEM image of an array of GaAs wires (with ohmic stripes) with their ends connecting to the mother wafer. The partial wire indicated by the arrow lies underneath the arrayed wires, indicating that the GaAs wires are separated from the bulk wafer. The inset presents a free-standing individual wire, clearly showing its triangular cross section. (c) SEM image of an individual MESFET with channel length of 50 μm and gate length of 5 μm, formed with the GaAs wire array shown in (b) transfer printed on a PET substrate. (d) Optical micrograph of a Ti/n-GaAs Schottky diode on a PET sheet. The insets show that one electrode pad connects the ohmic stripes on one end of the wires while the other electrode (150 nm Ti/150 nm Au) pad directly connects to the GaAs wires for forming Schottky contacts. (e, f) Optical images of PET substrates with various logic gates and individual MESFETs mounted on a flat surface (e) and on the curved shaft of a white marker (f).
Figure 3B:
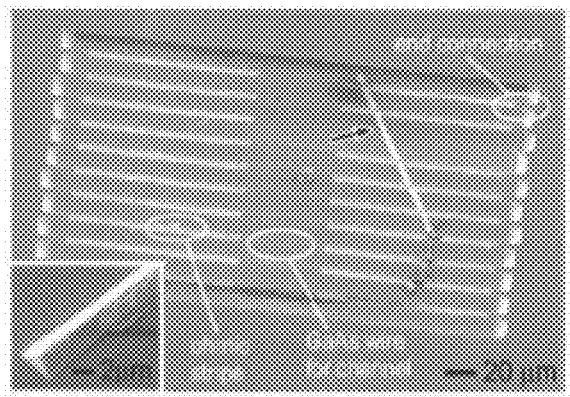

FIG. 3A depicts the major steps for fabricating GaAs transistors, diodes and logic gates on plastic. The basic approach relies on "top-down" fabrication techniques to generate micro/nanowires with high purity and well-known doping profiles from bulk single crystal GaAs wafers. Ohmic contacts, formed on the wafer before fabricating the wires, consist of 120 nm AuGe/20 nm Ni/120 nm Au deposited and annealed (450° C. for 1 min in a quartz tube with flowing $N_2$) on an epitaxial layer of 150-nm n-GaAs on a (100) semi-insulating GaAs (SI-GaAs) substrate. The contact stripes lie along the (0 $\bar{1}$ $\bar{1}$) crystallographic orientation, and have widths of 2 μm. In the case of transistors, the gaps between the ohmic stripes define the channel lengths. Photolithography and anisotropic chemical etching generates arrays of GaAs wires with triangular cross sections (inset of FIG. 3B) and widths of ~2 μm, with ends that connect to the wafer (FIG. 3B). These connections act as 'anchors' to maintain the well defined orientation and spatial location of the wires, as defined by the layout of etch mask (i.e., photoresist pattern). Removing the etching mask and depositing a bilayer of Ti(2 nm)/$SiO_2$(50 nm) via electron-beam evaporation prepares the surfaces of the wires for transfer printing. The triangular cross section ensures that the Ti/$SiO_2$ films on the surfaces of wires do not connect to those on the mother wafer, thus facilitating the yield of transfer printing. Laminating a slightly oxidized poly (dimethylsiloxane) (PDMS) stamp on the surface of the wafer leads to chemical bonding between the surface of the PDMS stamp and the fresh $SiO_2$ film by a condensation reaction. See top frame of FIG. 3A. Peeling back the PDMS stamp pulls the wires off of the wafer and leaves them bound to the stamp. Contacting this 'inked' stamp to a poly(ethylene terephthalate) (PET) sheet coated with a thin layer of liquid polyurethane (PU), curing the PU, peeling off the stamp and then removing the Ti/$SiO_2$ layer in 1:10 HF solution leaves ordered arrays of GaAs wires on the PU/PET substrate, as illustrated in the middle frame of FIG. 3A. The Ti/$SiO_2$ film not only serves as an adhesive layer to bond the GaAs wires to the PDMS but it also protects the surface of GaAs wires from possible contamination (e.g., by solvents and PU) during the processing.

In this format, the pristine, bare surfaces of the wires and ohmic stripes are exposed for further lithographic processing and metallization to define source and drain electrodes (250 nm Au) that connect the ohmic contacts integrated on the wires. For transistors, these electrodes define the source and drain; for the diodes, they represent the ohmic electrode. Contacts (150 nm Ti/150 nm Au) formed by photolithography and liftoff on the bare parts of the wires while they are integrated with the plastic substrates define Schottky contacts for the diodes and gate electrodes for the MESFETs. All of the processing on the plastic substrate occurs at temperatures below 110° C. We did not observe any debonding of GaAs wires from the substrates, due to mismatches in thermal expansion coefficients or other possible effects. In the transistors, the width of the gate electrode represents the critical dimension for controlling the operation speed. The position of this electrode between the source and drain is relatively unimportant in this work. This tolerance to poor registration, which is not present in non-self aligned high speed MOSFET (metal-oxide-semiconductor field-effect transistor) type devices, is critically important for reliably achieving high speed operation on plastic substrates where precise registration is often challenging or impossible due to slight uncontrolled deformations that can occur in the plastic during processing. Connecting multiple transistors and diodes together in appropriate geometries generates functional logic circuits. The scheme of FIG. 3A shows a NOR gate.

Figures 3C, 3D:
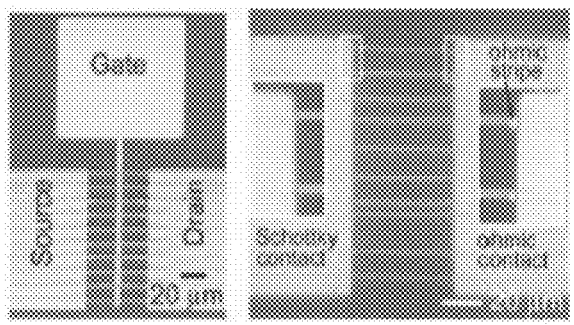
Figure 3E:
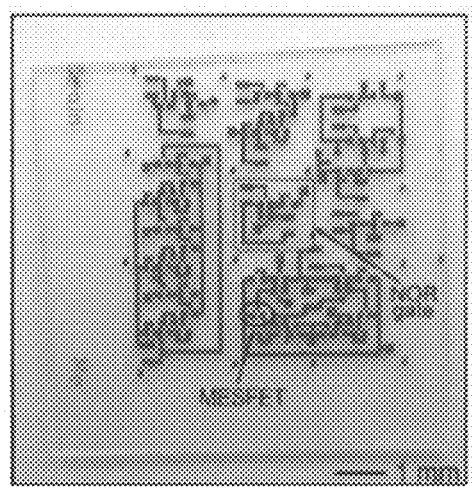
Figure 3F:
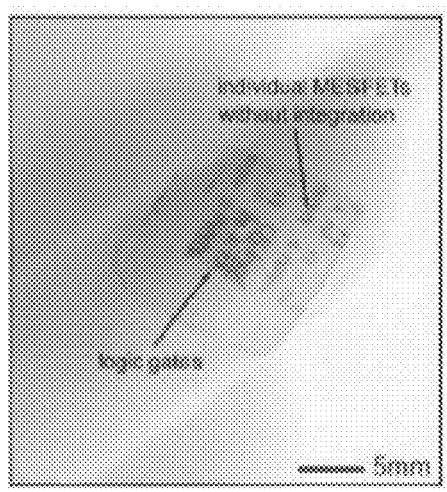

A scanning electron microscope (SEM) image (FIG. 3C) shows ten parallel wires that form the semiconductor component of a transistor. The channel length and the gate length of this device are 50 and 5 µm, respectively. These geometries are used for building the simple integrated circuits, i.e., logic gates. The Ti/Au stripe in the gap between the source and drain electrodes forms a Schottky contact with the n-GaAs surface. This electrode acts as a gate for modulating the flow of current between source and drain. Diodes (FIG. 3D) use wires with ohmic stripes on one end and Schottky contacts on the other. FIGS. 3E and 3F show images of a collection of GaAs transistors, diodes and simple circuits on a PET substrate. In FIG. 3F the PET sheet with circuits is bent around the shaft of a white marker, indicating the flexibility of these electronic units.

Figure 4A:
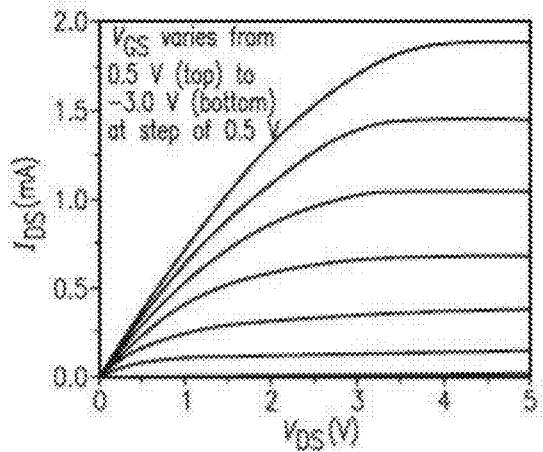
FIG. 4. Characterization of GaAs-wire MESFETs with a gate length of 5 μm and different channel lengths: (a, b) 50 μm and (c) 25 μm on PU/PET substrates. (a) Current-voltage (i.e., $I_{DS}$ versus $V_{DS}$) curves of the transistor shown in FIG. 3c at different gate voltage ($V_{GS}$). From top to bottom, the $V_{GS}$ decreases from 0.5 to −3.0 V at a step of 0.5 V. (b) Transfer curve of the same transistor in the saturation region of $V_{DS}$=4V. The inset shows the derivative of the transfer curve, revealing the dependence of the transconductance on the gate voltage. (c) Source-drain current at different $V_{GS}$ for a transistor with channel length of 25 μm. From top to bottom, the $V_{GS}$ decreases from 0.5 to −5.0 V at a step of 0.5 V. (d) I-V characteristics of the as-fabricated Au/Ti-GaAs Schottky diodes, showing good rectifying capabilities.
Figure 4B:
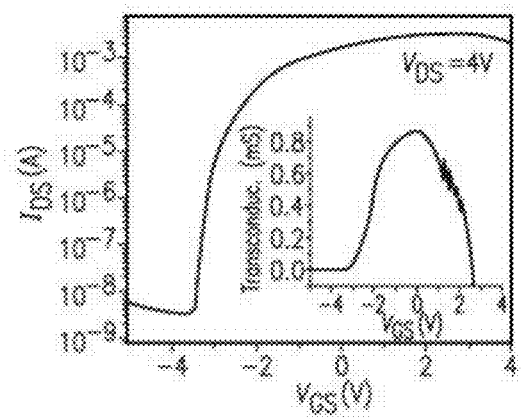
Figure 4C:
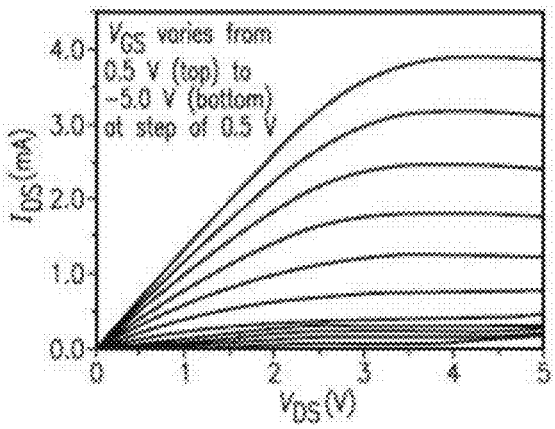

The DC characteristics of the wire based MESFETs on plastic (FIG. 3C) exhibit qualitatively the same behavior (FIG. 4A) as those formed on the wafer. The flow of current between source and drain ($I_{DS}$) is well modulated by the bias applied to the gate ($V_{GS}$), i.e., the $I_{DS}$ decreases with decrease of $V_{GS}$. In this case, the negative $V_{GS}$ depletes the effective carriers (i.e., electrons for n-GaAs) in the channel region and decreases the channel thickness. Once the $V_{GS}$ is negative enough, the depletion layer equals to the thickness of n-GaAs layer and the flow of current between source and drain is pinched off (i.e., the $I_{DS}$ becomes essentially zero). As shown in FIG. 4A, the $I_{DS}$ drops to almost zero at the $V_{GS}$ less than −2.5 V. The pinch-off voltage (i.e. gate voltage $V_{GS}$) at a drain-source voltage ($V_{DS}$) of 0.1 V (i.e., linear region) is 2.7 V. In the saturation region ($V_{DS}$=4 V), the transfer curve of this transistor is shown in FIG. 4B. The ON/OFF current ratio and maximum transconductance are determined from FIG. 4B to be ~$10^6$ and ~880 µS, respectively. The overall source-drain current is a function of the number of wires (i.e., the effective channel width) and the distance between source and drain (i.e., the channel length). With constant channel width, transistors with short channels can provide relatively high currents. For example, the saturated $I_{DS}$ at $V_{GS}$=0.5 V and $V_{DS}$=4 V increases from 1.75 mA for transistor with channel length of 50 µm to 3.8 mA for transistor with channel length of 25 µm (FIG. 4C). Although transistors with short channels can supply high current for certain applications, the ON/OFF current ratio tends to decrease because of the difficulty to completely pinch off the current. As shown in FIG. 4C, the $I_{DS}$ of transistor with channel length of 25 µm is still on the order of several microamperes even for $V_{GS}$ of −5 V.

Figure 4D:
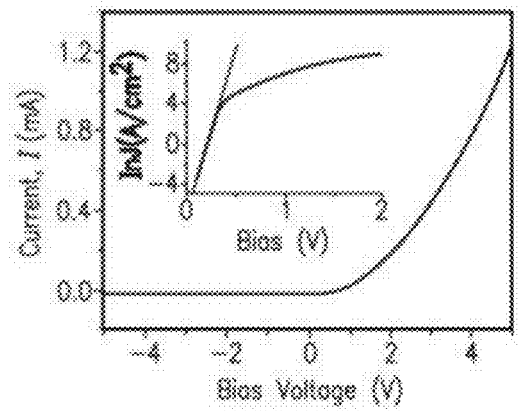

The GaAs-wire Sckottky diodes on plastic exhibit the typical behavior (FIG. 4D) of rectifiers, i.e., the forward current (I) increases quickly with increasing forward bias voltage (V) while the reverse current remains small even at reverse biases as large as 5 V. The I-V characteristics of these Schottky diodes can be described by the thermionic emission model, which is expressed as follows at V>>3kT/q:

$$J \approx J_0 \exp\left(\frac{qV}{nkt}\right) \quad (1)$$

$$\text{with } J_0 = A^{**}T^2 \exp\left(-\frac{q\phi_B}{kT}\right) \quad (2)$$

where J represents the forward diode current density with the applied bias voltage (V), k is the Boltzmann constant, T is the absolute temperature (i.e., 298 K in the experiment), $\phi_B$ is the Schottky barrier height and A** is the effective Richardson constant (i.e., 8.64 A·cm$^{-2}$·K$^{-2}$) for GaAs. By plotting the relationship between lnJ and bias (V) (inset), the saturation current $J_0$ and the ideality factor n are determined from the intercept and slope of the linear relation (the straight line of the inset). The quantity of $\phi_B$ is estimated with eq. (2). $\phi_B$ and n are commonly used as the evaluation criteria of Schottky interfacial properties. Both are highly dependent on the interface charge states between metal and GaAs, i.e., an increase of charge states will cause the decrease of $\phi_B$ and the increase of n value. For the diodes fabricated in this work, $\phi_B$ and n are determined from the inset of FIG. 4D to be 512 meV and 1.21, respectively. These devices have a somewhat lower Schottky barrier (512 meV versus ~800 meV) and larger ideality factor (1.21 versus ~1.10) compared with the diodes built on wafers.

Figure 5A:
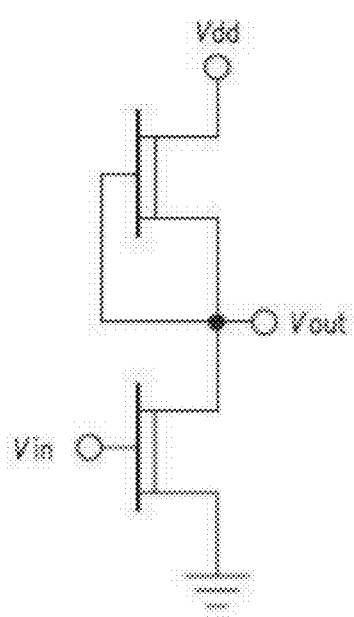
FIG. 5: Circuit diagram (a), optical image (b), and output-input characteristics (c) of an inverter. All MESFETs have a gate length of 5 μm. The $V_{dd}$ was biased to 5 V versus ground (GND).
Figure 5B:
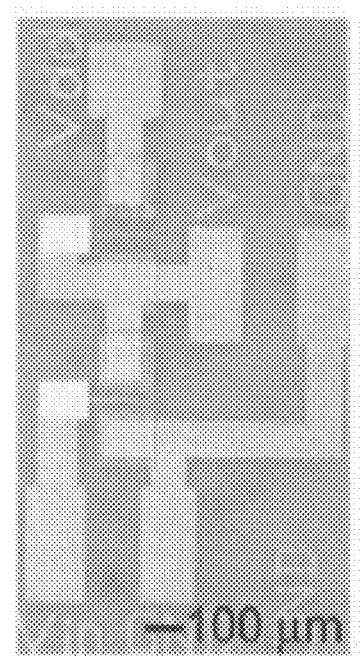
Figure 5C:
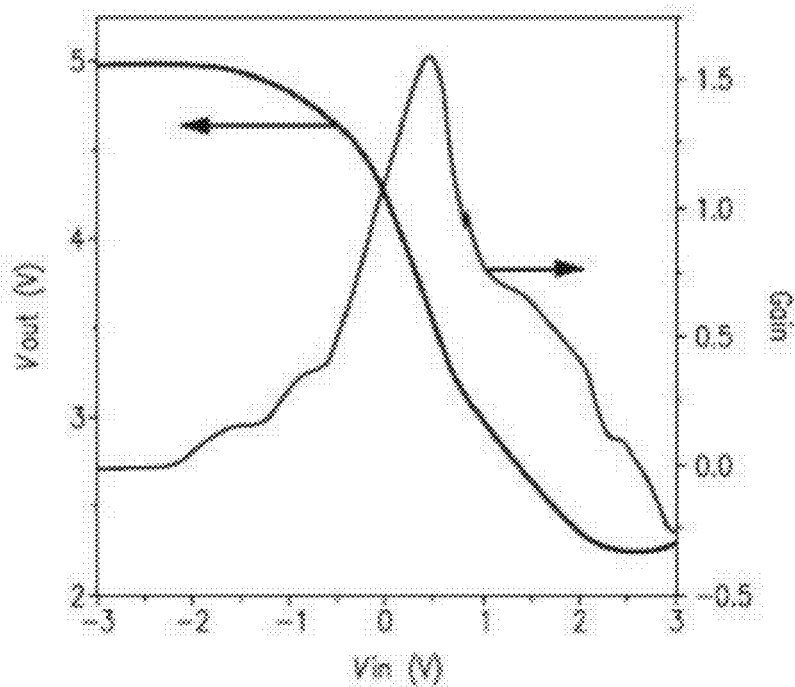

These GaAs-wire devices (i.e., MESFETs and diodes) can be integrated into logic gates for complex circuits. For example, connecting two MESFETs with different channel lengths, which have different saturation currents, forms an inverter (logic NOT gate) (FIGS. 5A and 5B). The load (top) and switching transistor (bottom) have channel lengths of 100 and 50 µm, respectively, and channel widths of 150 µm and gate lengths of 5 µm. This design results in a saturation current from the load transistor that is ~50% that of the switching transistor, which ensures that the load line intersects the $V_{GS}$=0 curve of the switching transistor in the linear region with a small turn-on voltage. The inverter is measured in the saturated region, i.e., the $V_{dd}$ is biased with 5 V. When a large negative voltage (logic 0) is applied to the gate of the switching transistor ($V_{in}$) to turn it off, the voltage of the output node ($V_{out}$) equals the $V_{dd}$ (logic 1, high positive voltage) because the load transistor is always on. An increase in $V_{in}$ turns the switching transistor on and provides a large current through both the switching transistor and the load transistor. The $V_{out}$ decreases to a low positive voltage (logic 0) when the switching transistor is completely turned on, i.e., the $V_{in}$ is a large positive voltage (logic 1). FIG. 5C shows the transfer curve. The inverter exhibits a maximum voltage gain (i.e., $(dV_{out}/dV_{in})_{max}$=1.52) higher than unity. The logic status of $V_{out}$ is shifted to voltages suitable for further circuit integration by adding a level-shifting branch composed of Schottky diodes (as shown in FIG. 3D).

Figure 6A:
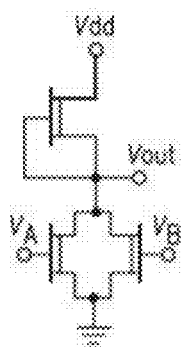
FIG. 6: Circuit diagrams, optical images, and output-input characteristics of different logic gates: (a, b, c) NOR gate; (d, e, f) NAND gate. All MESFETs have a gate length of 5 μm. The scale bars represent 100 μm. $V_{dd}$ applied to these logic gates was 5 V versus ground (GND). The logic "0" and "1" input signals of the NOR and NAND gates were driven by −5 and 2 V, respectively. The logic "0" and "1" outputs of the NOR gate are 1.58-1.67 V and 4.1 V, respectively. The logic "0" and "1" outputs of the NAND gate are 2.90 V and 4.83-4.98 V, respectively.
Figure 6B:
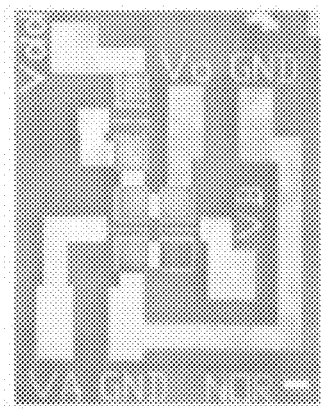
Figure 6C:
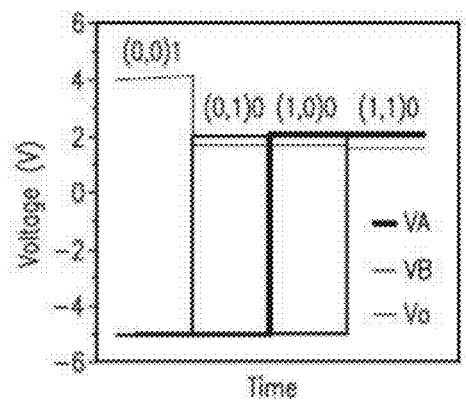
Figure 6D:
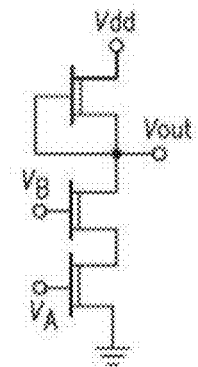
Figure 6E:
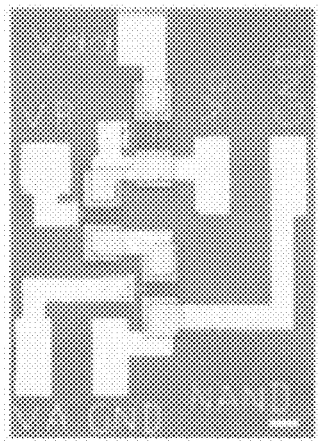
Figure 6F:
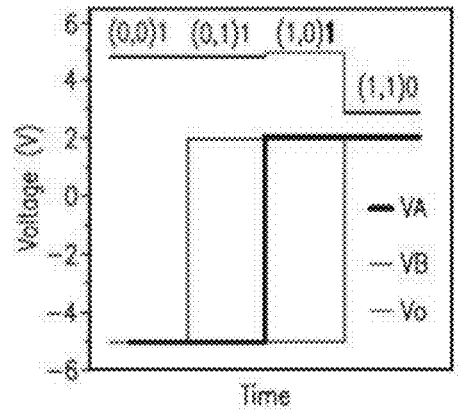

Combining several devices of this type in parallel or in series yields more complex logic functions, such as NOR and NAND gates. For the NOA gate shown in FIGS. 6A and 6B, two identical MESFETs in parallel serve as the switching transistors. Turning on either switching transistor ($V_A$ or $V_B$) by applying a high positive voltage (logic 1) can provide a large current flow through the drain ($V_{dd}$) of the load transistor to ground (GND), resulting in the output voltage ($V_o$) at a low level (logic 0). High positive output voltage (logic 1) can be achieved only when both inputs are at high negative voltages (logic 0). The dependence of the output on the inputs of the NOR gate is shown in FIG. 6C. In the configuration of a NAND gate (FIGS. 6D and 6E), the current is large through all transistors only when both switching transistors are turned on by applying high positive voltages (logic 1). The output voltage exhibits a relatively low value (logic 0) in this configuration. Almost no current flows through the transistors with other input combinations, resulting in a high positive output voltage (logic 1), comparable to $V_{dd}$ (FIG. 6F). Further integration of logic gates of this type and/or other passive elements (e.g., resistors, capacitors, inductors, etc.) offers the promise for high-speed, large-area electronic systems on plastic.

In summary, GaAs wires with integrated ohmic contacts fabricated using "top-down" procedures with high-quality, bulk single-crystal wafers provide a high performance 'printable' semiconductor material and a relatively easy path to transistors, diodes and integrated logic gates on flexible plastic substrates. The separation of high-temperature processing steps (e.g. formation of ohmic contacts) from the plastic substrates and the use of PDMS stamps for transfer printing well ordered arrays of GaAs wires are key features of the approach described herein. The use of GaAs wires as the semiconductor is attractive for large area printed electronics with demanding requirements on operating speed because (i) GaAs has a high intrinsic electron mobility ($8500\ cm^2V^{-1}s^{-1}$) and has established applications in conventional high frequency circuits, (ii) MESFETs built with GaAs offer simpler processing than MOSFETs because the MESFETs do not require gate dielectrics, (iii) GaAs MESFETs do not suffer from parasitic overlap capacitances that occur in non-self aligned MOSFETs, (iv) high-speed operation in GaAs MESFETs is possible even with the modest levels of patterning registration and resolution that can be achieved easily on large area plastic substrates. The relatively high cost of GaAs (compared with Si) and difficulty to generating complementary circuits with GaAs-wire devices represent drawbacks. Nevertheless, the relative ease with which high performance transistors and diodes that can be built on plastic substrates, and the ability to integrate these components into functional circuits indicates some promise for this path to electronic systems where mechanical flexibility, lightweight construction and compatibility with large area, printing-like processing are required.

Experimental Section: The GaAs wafer (IQE Inc., Bethlehem, Pa.) has an epitaxial Si-doped n-type GaAs layer (with carrier concentration of $4.0 \times 10^{17}\ cm^{-3}$) grown on a (100) semi-insulating GaAs wafer through molecular beam epitaxial (MBE) deposition in a high vacuum chamber. The lithography processes employ AZ photoresist (AZ 5214 and AZ nLOF 2020 for positive and negative imaging, respectively), which are carried out at temperatures (<110° C.) compatible with the plastic substrates, i.e., poly(ethylene terephthalate) (PET of ~175 μm in thickness, Mylar film, Southwall Technologies, Palo Alto, Calif.) sheets covered with a thin layer of cured polyurethane (PU, NEA 121, Norland Products Inc., Cranbury, N.J.). The GaAs wafers with photoresist mask patterns are anisotropically etched in the etchant (4 mL $H_3PO_4$ (85 wt %), 52 mL $H_2O_2$ (30 wt %), and 48 mL deionized water) that was cooled in the ice-water bath. All the metals are evaporated at a speed of ~4 Å/s by an electron-beam evaporator (Temescal). The evaporation os stopped to cool the samples (for 5 min) to prevent the plastic substrates from melting when 50 nm thick metals are deposited. After the samples are cooled, repeating the evaporation/cooling cycle deposited more metals.

EXAMPLE 2

Gigahertz Operation in Mechanically Flexible Transistors on Flexible Plastic Substrates The combined use of GaAs wires with ohmic contacts formed from bulk wafers, soft lithographic transfer printing techniques, and optimized device designs enable mechanically flexible transistors to be formed on low cost plastic substrates, with individual device speeds in the gigahertz range and with high degrees of mechanical bendability. The approaches disclosed herein incorporate materials in simple layouts that are fabricated with modest lithographic patterning resolution and registration. This example describes the electrical and mechanical characteristics of high-performance transistors. The results are important in certain applications, including, but not limited to, high-speed communications and computations, and the emerging classes of large area electronic systems ("macroelectronics").

Large area, flexible electronic systems (i.e., macroelectronics) formed with high-mobility semiconductors are of interest because some potential applications of these types of circuits require high speed communication and/or computation capabilities. Flexible thin film transistors (TFTs) built with various inorganic materials, such as amorphous/polycrystalline oxides and chalcogenides, polysilicon as well as single crystalline silicon nanowires and microstructured ribbons, exhibit much higher mobilities (10-300 $cm^2 \cdot V^{-1} \cdot s^{-1}$) than those of polycrystalline organic thin films (<1 $cm^2 \cdot V^{-1} \cdot s^{-1}$ in general). Previous work has demonstrated that wire arrays of single crystalline GaAs, which have very high intrinsic electron mobility (8500 $cm^2 \cdot V^{-1} \cdot s^{-1}$), can serve as transport channels for TFTs in the geometry of metal-semiconductor field-effect transistors (MESFETs). This example shows that with optimized designs, similar devices can operate with frequencies in the GHz regime, even with modest lithographic resolution, and with good bendability. In particular, experimental results show that GaAs wire-based MESFETs on plastic substrates exhibit cutoff frequency higher than 1.5 GHz for transistors with gate length of 2 μm, with modest changes in the electrical properties for bend radii down to ~1 cm when ~200 mm thick substrates are used. Simple simulations of device behavior agree well with the experimental observations, and operating frequencies in the S-band (5 GHz) are achievable.

The basic fabrication strategy is similar to that described elsewhere, but with optimized device geometries and processing methods to enable high speed operation. GaAs wire (~2 μm in width) arrays with integrated ohmic stripes (formed by annealing 120 nm AuGe/20 nm Ni/120 nm Au at 450° C. for 1 min in the atmosphere of $N_2$) are fabricated from a (100) semi-insulating GaAs (SI-GaAs) wafer with epitaxial layer of 150-nm n-GaAs through photolithography and anisotropic chemical etching. A thin bilayer of Ti(2 nm)/$SiO_2$(50 nm) is deposited on the undercut GaAs wires to serve as the adhesive layer to facilitate the transfer printing process as well as to protect the flat surfaces of wires and ohmic contacts from contamination by organics (primarily those that transfer from the surfaces of the stamps) involved in the process. This layer is removed by dipping the samples in 1:10 HF solution to expose the clean surfaces of GaAs wires for device fabrication in the sequential steps. In addition, the thin thickness (compared with the thickness of photoresist layers which are used as the adhesive layer for transfer printing in our previous work) of this Ti/SiO$_2$ layer results in a relatively flat surface of plastic poly(ethylene terephthalate) (PET) sheet, on which GaAs wire arrays are printed with the assistance of a spin cast thin layer of polyurethane (PU). The enhanced surface flatness enables deposition of narrow gate electrodes without cracks along their longitudinal direction, thus providing an effective route to increase the operation speed of devices.

Figure 7A:
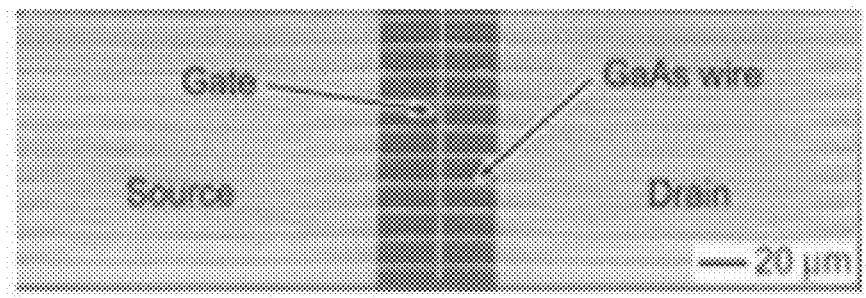
FIG. 7: (a) SEM image of an individual GaAs-wire MESFET with channel length of 50 μm and gate length of 2 μm on PU/PET substrate, showing each transistor is formed with ten aligned GaAs wires. (b) Current-voltage (i.e., $I_{DS}$ versus $V_{DS}$) curves of a transistor shown in (a). From top to bottom, the $V_{GS}$ decreases from 0.5 to −3.0 V at a step of 0.5 V. The inset shows the transfer curve of this transistor in the saturation region of $V_{DS}$=4 V.
Figure 7B:
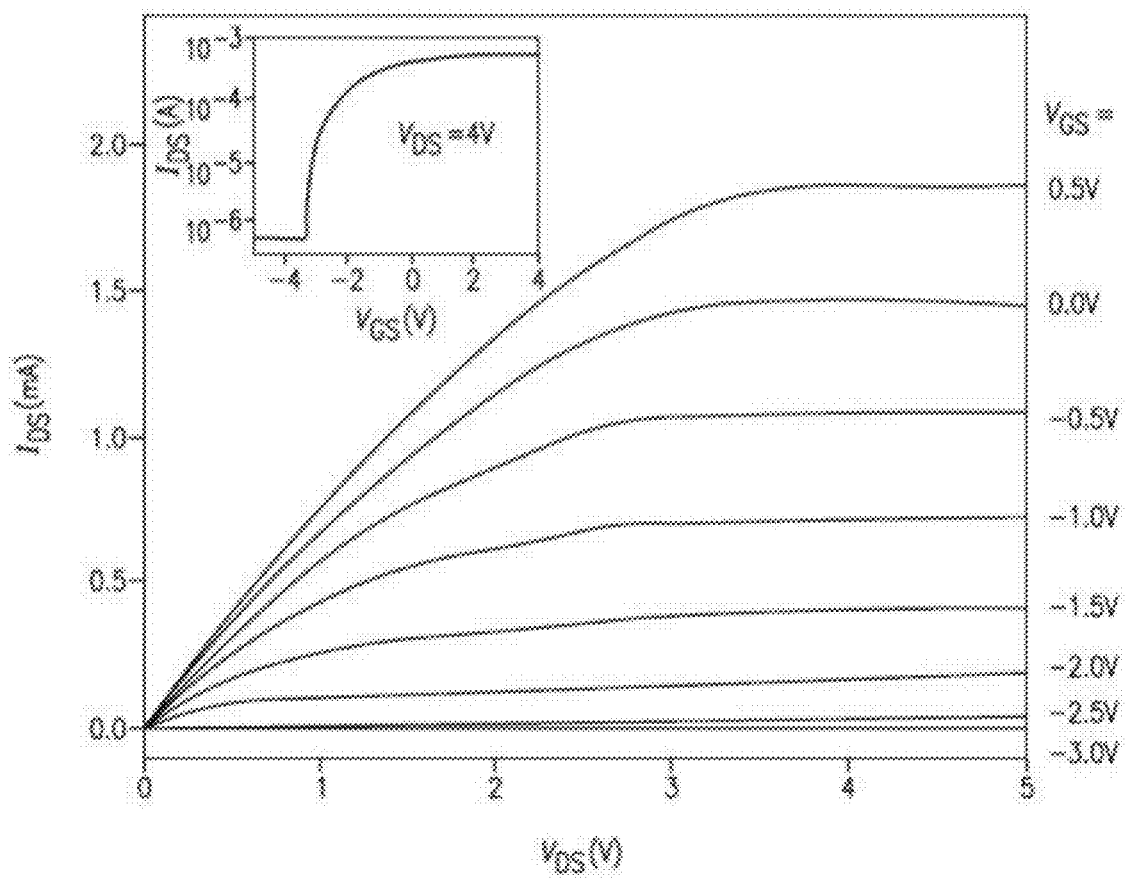

The resultant MESFETs on PET substrates (see, SEM image of a typical transistor with gate length of 2 μm as shown in FIG. 7A) exhibit DC transport properties similar to those of transistors built on the mother wafers. FIG. 7B shows the current flow between source and drain ($I_{DS}$) as a function of gate voltage ($V_{GS}$) (inset) and as a function of source/drain voltage at different $V_{GS}$, for a device with gate length of 2 μm. The pinch-off voltage at $V_{DS}$ of 0.1 V (i.e., linear region) is −2.7 V. The ON/OFF current ratio, determined from averaged measurements on many devices, is ~$10^6$. The devices exhibit negligible hysteresis (inset), which is particularly important for high-speed response. The devices show good device-to-device uniformity; Table 1 lists the statistical results (with device number>50) of MESFETs with channel lengths of 50 μm and different gate lengths. The DC characteristics are almost independent of the gate length except that devices with larger gate lengths exhibit somewhat lower ON/OFF ratios. The gate length plays a critical role, however, in determining the operating frequencies as described in the following.

TABLE 1

Statistical results of parameters extracted from MESFETs with different gate lengths

| Gate Length (μm) | Channel Resistance (kΩ) | Saturated current (mA) @$V_{GS}$ = 0 V | Pinch-off Voltage (V) | ON/OFF ratio ($r_{ON/OFF}$)@$V_{DS}$ = 4 V log($r_{ON/OFF}$) | Maximum transconductance (μS) |
|---|---|---|---|---|---|
| 2 | 1.5 ± 0.5 | 1.4 ± 0.5 | −2.41 ± 0.35 | 6.2 ± 0.7 | 796 ± 295 |
| 5 | 1.3 ± 0.2 | 1.6 ± 0.5 | −2.49 ± 0.25 | 6.1 ± 0.5 | 904 ± 337 |
| 10 | 1.5 ± 0.2 | 1.3 ± 0.3 | −2.54 ± 0.14 | 5.8 ± 0.5 | 772 ± 185 |
| 15 | 1.6 ± 0.2 | 1.1 ± 0.2 | −2.69 ± 0.05 | 5.3 ± 0.8 | 749 ± 188 |

*All transistors were formed with 10 parallel GaAs wires and a channel length of 50 μm.

Figure 8A:
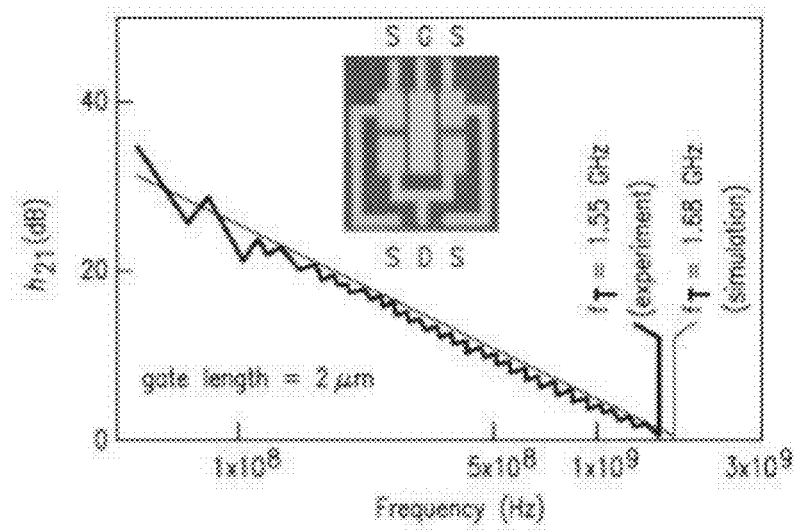
FIG. 8: (a, b) Experimental (blue) and simulated (red) results of RF responses of GaAs-wire MESFETs with different gate lengths: 2 μm (a) and 5 μm (b). The measurements are conducted with probing configuration shown in the inset of (a). (c) Dependence of $f_T$ on gate length. The different symbols represent measurements on different devices; the dashed line corresponds to simulation.
Figure 8B:
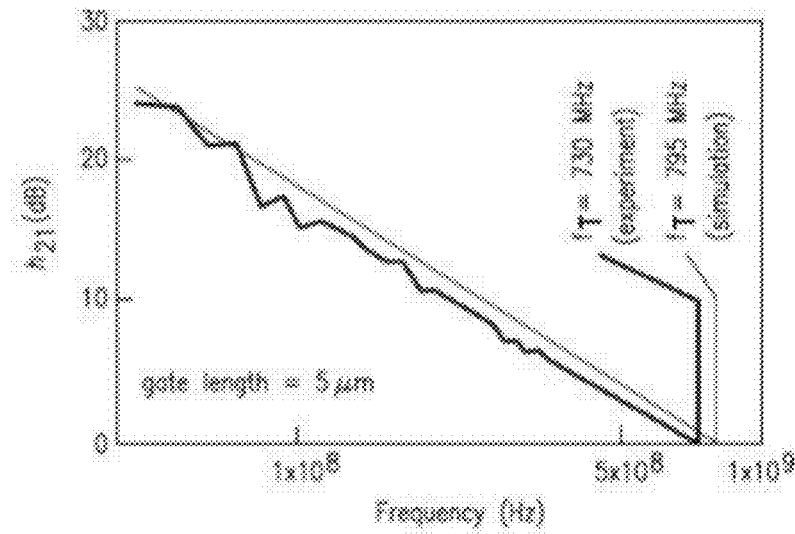

The inset of FIG. 8A shows the layout of a device designed for microwave testing. Each unit of the test structure contains two identical MESFETs with gate lengths of 2 μm and channel lengths of 50 μm with a common gate, and probing pads configured to match the layout of the RF probes. In the measurement, the drain (D) terminal is held at 4 V (versus source (S)) and the gate (G) is driven by a bias of 0.5 V coupled with a RF power of 0 dBm, which has an equivalently voltage amplitude of 224 mV with 50Ω. The measurement is carried out using HP8510C Network Analyzer calibrated from 50 MHz to 1 GHz using a standard SOLT (Short-Open-Load-Through) technique on a CascadeMicrotech 101-190B ISS substrate (a piece of ceramic chip covered with laser trimmed gold patterns) through WinCal 3.2 for error corrections. In other words, short calibration is thought to be perfect short and open calibration is thought be perfect open. Since the calibration is done without further de-embedding, the reference plane of measurement is set between the input probe and the output probe. In other words, parasitic components of contact pads are included in the measurement. However, impacts of these parasitic components on contact pads are negligible considering the fact that the wavelength of RF signal with frequency of 1 GHz is 300 mm, whereas length of a contact pad is 200 μm. Since the contact pad is only 1/1500 of the wavelength, its effect of impedance transformation is negligible.

Figure 9A:
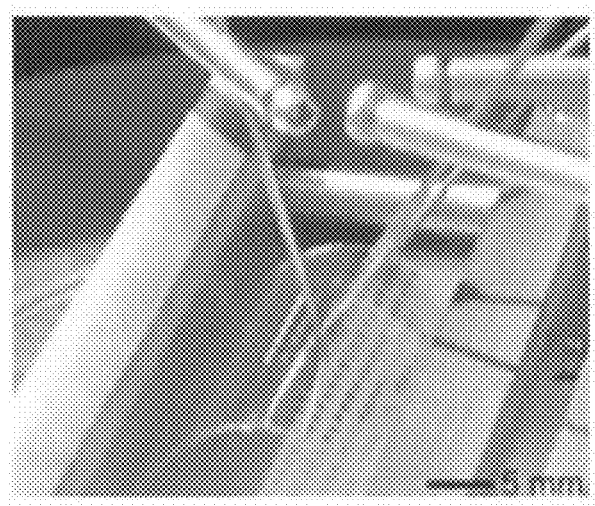
FIG. 9: Characterization of the mechanical flexibility of high speed GaAs-wire MESFETs (with gate length of 2 μm) on PU/PET substrates. (a) Optical image of the setup for the measurements. The effects of surface strain (positive and negative values correspond to tensile and compressive strains, respectively) on (b) the saturated current flow through source to drain at $V_{DS}$=4V and $V_{GS}$=0V; and (c) the ON/OFF current ratio in the saturation region of $V_{DS}$=4 V.
Figure 9B:
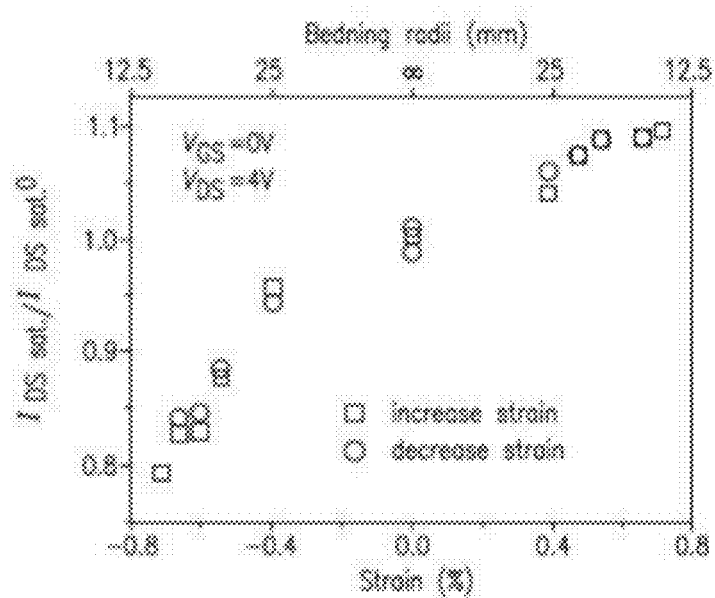

The small-signal current gain ($h_{21}$) can be extracted from the measured S-parameters of the device. This quantity exhibits a logarithmic dependence on the frequency of input RF signal (FIG. 9A). The unity current gain frequency ($f_T$) is defined as the frequency at which the shortcircuit current gain becomes unity. This quantity can be determined by extrapolating the curve of FIG. 9A according to a least-square fit of a −20 dB/decade line and locating its x-intercept. The value determined in this manner is $f_T$=1.55 GHz. This device represents, to our knowledge, the fastest mechanically flexible transistor on plastic and the first with an $f_T$ in the gigahertz regime. We also estimated the RF response of GaAs MESFETs according to the small-signal equivalent circuit model using the measured DC parameters and the calculated capacities between electrodes. The plot from simulation result agrees well with the experimental result yields $f_T$=1.68 GHz. This model also works well for the transistors with different gate lengths, for example, the experimental $f_T$ (730 MHz) of MESFET with gate length of 5 μm is close to that simulated quantity (795 MHz) (FIG. 9B). In the model, only the intrinsic parameters of MESFET are considered because the extrinsic parameters (i.e., inductance and resistance associated with probing pads) are considered negligible. The transconductance ($g_m$), the output resistance ($R_{DS}$), and the charging resistance ($R_i$, which accounts for the fact that the charge on the channel cannot instantaneously respond to changes in $V_{DS}$) are extracted from DC measurements. The intrinsic capacitances associated with the MESFET include contributions from the depletion layer, edge fringing and geometric fringing capacitances. Each of these are computed using standard equations for conventional devices with channel widths equal to the summed widths of the individual GaAs wires. The depletion layer capacitance is characterized with the gate length ($L_G$), the effective device width (W), and the depletion height:

$$\left(H_{depletion} = \sqrt{\left(\frac{2\varepsilon_r\varepsilon_0}{qN_D}\right)\left(\frac{kT}{q}\right)\left(\ln\frac{N_D}{N_i} - 1\right)}\right)$$

in the equation:

$$C_{depletion} = \varepsilon_r\varepsilon_0\frac{L_G W}{H_{depletion}}$$

with an assumption that the depletion layer works as a parallel plate capacitor. The edge fringing capacitance and the geometric fringing capacitance, are determined by:

$$C_{edge} = (\varepsilon_r \varepsilon_0 W)\left(1.41 + \frac{0.86\varepsilon_0}{\varepsilon_r \varepsilon_0}\right) \text{ and}$$

$$C_{geometric} = [\varepsilon_r W + \varepsilon_0 (150 \ \mu m - W) + 200 \ \mu m]\left(\frac{K(1-k^2)^{1/2}}{K(k)}\right),$$

respectively. 150 μm and 200 μm are the width and length of either source or drain pad. K(k) is an elliptical integral of the first kind and $$k_{DS} = \left[\frac{2(L_S + L_{DS})L_{DS}}{(L_S + L_{DS})^2}\right]^{1/2} \text{ and}$$

$$k_{GS} = k_{GD} = \frac{L_{GD}}{L_{GD} + L_G}.$$

Figure 8C:
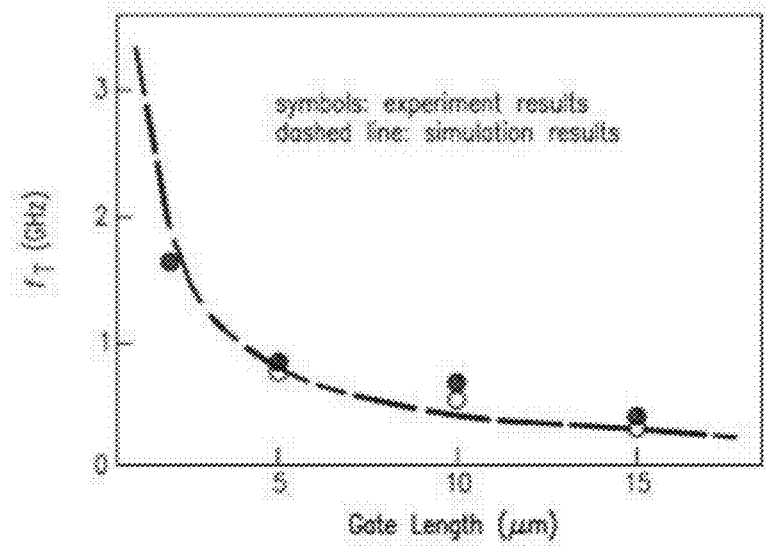

$C_{GS}$, capacitance between the gate and the source, include all three kinds of capacitance; while $C_{DS}$ and $C_{DG}$ only contain the edge fringing capacitance and the geometric fringing capacitance. The contributions of $C_{edge}$ and $C_{geometric}$ might be ignored without a significant effect on the simulation results, in most cases, because they are much smaller than $C_{depletion}$, which is appropriate to the gate length. This model accounts for the behavior of the wire array devices on plastic, including the variation in $f_T$ with gate length. FIG. 8C compares the measured (symbols) and calculated (dashed line) $f_T$ of GaA-wire MESFETs with different gate lengths and channel length of 50 μm. This modeling suggests that $f_T$ can be increased significantly by reducing the gate length or by further optimizing the design of the layers in the GaAs mother wafers.

We have reported initial measurements of the effects of tensile strains on wire based MESFETs with gate length of 15 μm. In this example, we examine the behavior of the high speed devices in both compression and tension, up to the fracture point. The measurements consist of full DC electrical characterization as a function of bending the substrate (see FIG. 9A) into concave and convex shapes with different radii of curvature. The bending radii are extracted through geometric fitting of side view images of the bent samples. The convex and concave bend surfaces induce tensile (assigned a positive value) and compressive strain (assigned a negative value) on the devices. A device similar to that shown in the inset of FIG. 8A is used to evaluate the effect of bending-induced strain on the performance. The saturation current (i.e., $V_{DS}$=4 V, $V_{GS}$=0 V) increases by ~10% with increasing tensile strain to 0.71% (corresponding bending radius of 14 mm for the 200-μm thick substrate used in this work) and drops by ~20% with increasing compressive strain to 0.71% (FIG. 9B). The current recovers when the substrate is released after bending in either direction, suggesting that deformations of the plastic substrate and the other components of the devices are elastic in this regime. (The PET and PU are expected to plastically deform at strains>~2%.) Studies on the strained epilayers of $Ga_xIn_{1-x}As$ or $Ga_xIn_{1-x}As$ on (100) GaAs wafers reveal that biaxial stress as well as externally applied uniaxial stress (the case similar to this example) can cause significant shifts in band-gap energy and valence-band splitting in the epilayers. Tensile strains decrease the band-gap energy thereby increasing the total carrier concentration (electrons and holes) and enhancing the current flow. In contrast, compressive strains increase the band-gap energy and decrease the current flow. These phenomena are consistent with observations of our devices. In situ imaging of the bending process with an SEM microscope confirms that none of the GaAs wires break at strains of <+/−0.71%. At tensile strains above ~1%, device degradation occurs, due to fracture of some of the wires (or cracking of the gate electrodes). For wires substantially wider than those used here (e.g. 10 μm widths) the wires debond from the plastic to release the tensile bending stresses, rather than fracture, due to their comparatively high flexural rigidity.

Figure 9C:
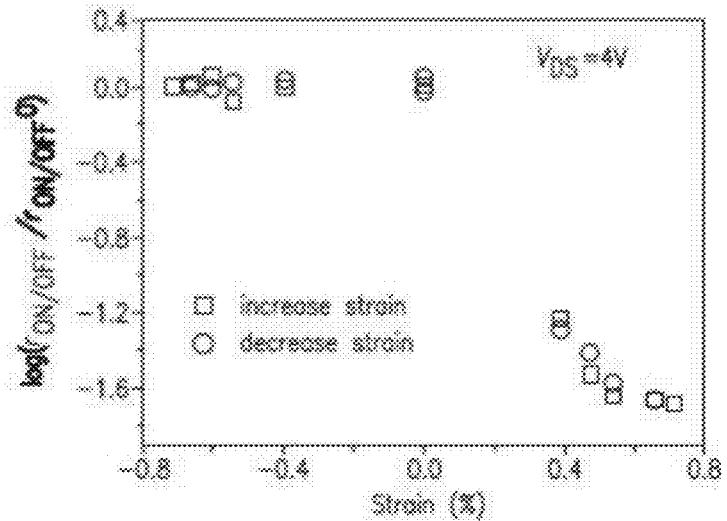
Figure 10A:
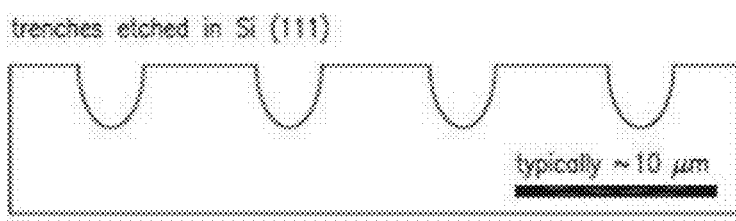
FIG. 10: Schematic process flow of single-crystal silicon ribbon fabrication. (a) An $SF_6$ plasma etches trenches in a (111) Si surface. (b) Thermal oxidation and angled evaporation of Ti/Au layers passivate the side surfaces. (c) Finally, a hot KOH/IPA/$H_2O$ solution undercuts the Si ribbons. (d) Cross-sectional SEM image of partially undercut ribbons. (e) Released, flexible ribbons.
Figure 10B:
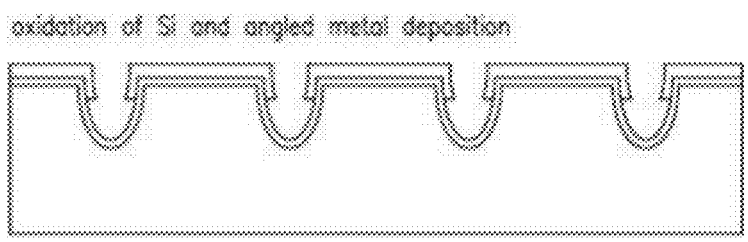
Figure 10C:
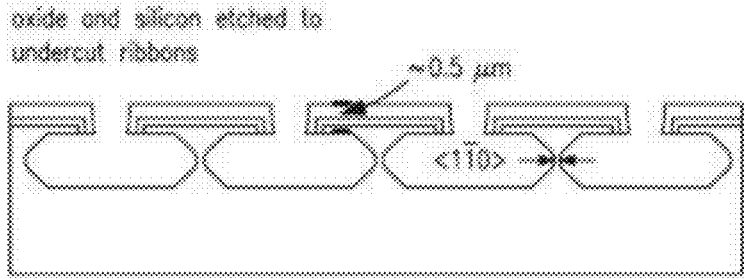
Figure 10D:
Figure 10E:
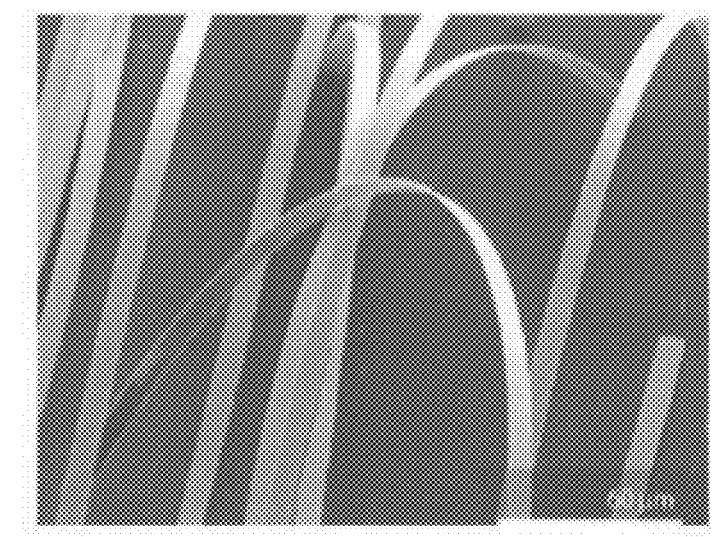

Because the bending strains change the saturated currents by less than 20%, variations in the ON/OFF ratio are determined mainly by changes in the OFF currents. The change of hole concentration in the valence band and the number of dislocations and surface defects of the n-GaAs layer induced by strain might contribute to the variation of the OFF current of the transistor. Both tensile and compressive strains can increase the number of dislocations and surface defects, thus increasing the OFF current of the device. The tensile strain generates additional holes as well as electrons, which also increase the OFF current. Compressive strains, on the other hand, lower the hole concentration. As a result, the OFF current of the MESFET in tension is expected to be higher than that of an unstrained device. The compressive strain has minor effect on the OFF current of the device. The corresponding ON/OFF current ratio, therefore, should decrease with tension and remain approximately the same with compression. FIG. 9C gives the dependence of the measured ON/OFF current ratio in the saturation region on strain, showing qualitative agreement with the discussion above.

In summary, the results of this example show that the bending induced surface strain (in both tension and compression, as high as 0.71%) does not significantly degrade the performance of the MESFETs fabricated from the modified procedure. More importantly, releasing the sample in its bent state returns the device performance to its original state. These observations indicate that the GaAs-wire based MESFETs on PU/PET substrates have mechanical properties that meet the requirements of many envisioned applications of macroelectronics. In addition, these types of TFTs exhibit high speeds approaching those suitable for RF communication devices and other applications where mechanical flexibility, lightweight construction and compatibility with large area, printing-like processing are required. Some of the disadvantages of GaAs compared to Si for conventional integrated circuits (i.e. high wafer costs, inability to build reliable complementary circuits, mechanical fragility, etc) have reduced importance for devices that use wires or ribbons in the classes of thin, bendable, moderate density and large-area circuits that are the focus of this work.

EXAMPLE 3

Mechanically Flexible Thin Film Transistors that Use Ultrathin Ribbons of Silicon Derived From Bulk Wafers This example introduces a type of thin film transistor that uses aligned arrays of thin (sub-micron) ribbons of single crystal silicon created by lithographic patterning and anisotropic etching of bulk silicon (111) wafers. Devices that incorporate such ribbons printed onto thin plastic substrates show good electrical properties and mechanical flexibility. Effective device mobilities, as evaluated in the linear regime, are as high as 360 $cm^2V^{-1}s^{-1}$, and on/off ratios are >$10^3$. These results represent important steps toward a low cost approach to large area, high performance, mechanically flexible electronic systems for structural health monitors, sensors, displays and other applications.

Confinement-related properties and broadly useable form factors make low-dimensional materials interesting for new applications in electronics, photonics, microelectromechanical systems and other areas. For example, high-performance flexible electronic devices (e.g. transistors, simple circuit elements, etc.) can be constructed using micro/nanowires, ribbons or tubes that are cast, painted, or printed onto plastic substrates. Thin, high aspect ratio materials structures allow bendability, and, in certain structural forms, stretchability, in single-crystalline semiconductors of materials that are inherently fragile and brittle in bulk. As a result, these types of semiconductors offer intriguing alternatives to vacuum and solution processable poly/noncrystalline organic materials, which usually display significantly lower performance in terms of carrier mobility. Recently described top-down approaches generate semiconductor wires, ribbons, and sheets from wafer based sources of material. This approach provides a high level of control over the geometry, spatial organization, doping levels and materials purity of the resulting structures. The economic attractiveness of this approach, however, especially for applications that demand large area coverage, is limited by the per-area cost of the wafers (silicon on insulator, epitaxial layers on growth substrates, etc).

In this example we report a different approach. In particular, we present a type of thin film transistor (TFT) that uses aligned arrays of silicon ribbons with sub-micron thicknesses derived from low-cost bulk Si (111) wafers. We begin with a description of the procedures for fabricating these structures and transfer printing them onto plastic substrates via elastomeric stamps. We present structural characterization of the shapes of the ribbons, their thicknesses and surface morphologies. Electrical measurements made on Schottky barrier TFTs formed with these printed ribbons exhibit n-type field effect mobilites of 360 $cm^2V^{-1}s^{-1}$ and on/off ratios of 4000.

Figure 12A:
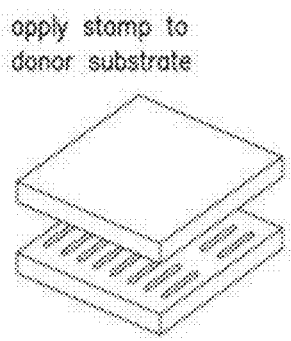
FIG. 12: Schematic process flow for transferring microstructured silicon from a "donor" wafer to a plastic substrate. (a) A PDMS stamp laminates against a chip with undercut ribbons that are anchored to the wafer. (b) Ribbons bond to the stamp and can be removed from the wafer by peeling away the stamp. (c) Ribbons are then printed from the stamp to a plastic substrate. (d) SEM image of near-completely-undercut ribbons anchored to the donor wafer. (e) Optical micrograph of ribbons removed from the donor and adhered to the stamp. (f) Photograph of a flexible plastic "chip" that houses TFTs made from transferred silicon ribbons.
Figure 12B:
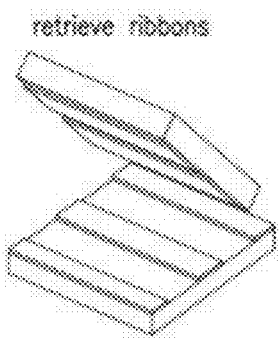
Figure 12C:
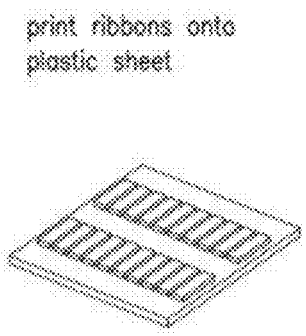
Figure 12D:
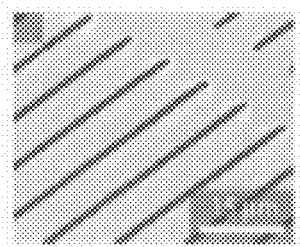

FIG. 10 illustrates a top-down method that generates thin (<1 μm) ribbons from the surface of a Si (111) wafer (Montco, Inc., n-type, 0.8-1.8 Ω·cm). The process begins with near-field phase shift photolithography[13] followed by metal lift-off and $SF_6$ plasma etching (Plasmatherm RIE system, 40 sccm $SF_6$, 30 mTorr, 200 W RF power for 45 sec.) to produce an array of ~1 μm deep, 1 μm wide trenches in the Si surface (FIG. 1(*a*)). The spacing between the trenches defines the width of the ribbons (generally 10 μm). Next, 100 nm of thermal oxide is grown on the wafer at 1100° C. Two metal deposition steps, performed by angled electron beam evaporation of Ti/Au (3/30 nm), provide partial coverage of the trench side surfaces (FIG. 10B). The 'shadows' cast during these angled evaporations define the thicknesses of the ribbons. The conditions of the trenching etch, the angle of evaporation and the degree of collimation of the flux of metal control the extent of this shadowing and, therefore, the ribbon thickness. A $CF_4$ plasma etch (40 sccm $CF_4$, 2 sccm $O_2$, 50 mTorr base pressure, 150 W RF power for 5 min) removes exposed oxide. Finally, a hot KOH solution (3:1:1 $H_2O$:KOH:IPA by mass, 100° C.) undercuts the ribbons. The etch front advances in the <110> directions while preserving the (111) planes (FIG. 10C) and produces free-standing ribbons that cover a large portion (75-90%) of the original wafer. The etch mask is designed to leave each of the ribbons anchored to the wafer at the ends of the trenches (FIGS. 12A and 12B). Removing this mask with $KI/I_2$ (2.67/0.67 wt %) in water followed by HF completes the fabrication. Ribbons generated in this manner are thin, flat, and mechanically flexible (FIG. 10E), similar to those produced using previously described approaches with expensive silicon-on-insulator wafers.[5-7,11]

Figure 11A:
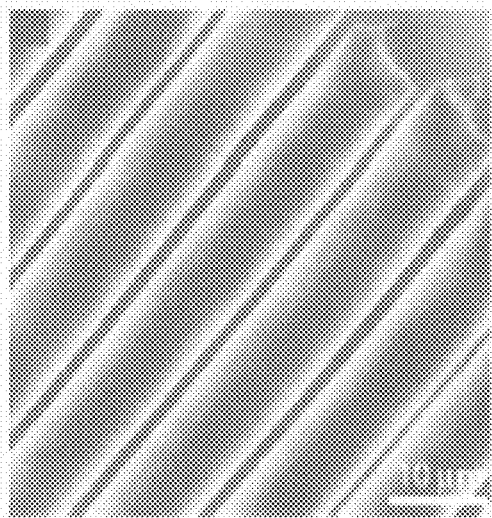
FIG. 11: Atomic force microscopy of microstructured silicon generated by anisotropic wet etch undercut. (a) AFM height image of ribbons on a PDMS stamp, with the underside exposed. Ribbons are 115 to 130 nm thick, as measured at their edges, and bow downward in the middle. (b) AFM image of the underside of a 550 nm-thick ribbon revealing nanoscale roughness introduced by the KOH/IPA/$H_2O$ undercut.
Figure 11B:
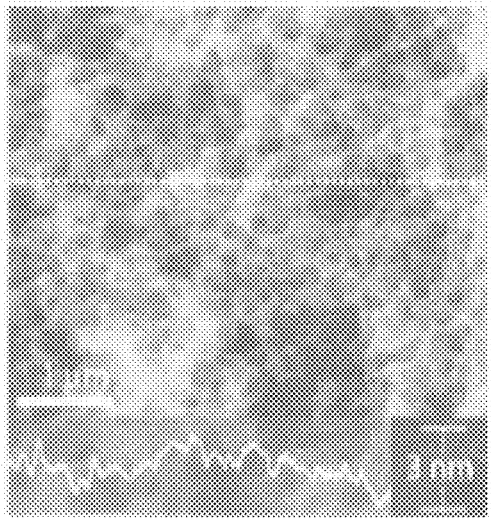
Figure 12E:
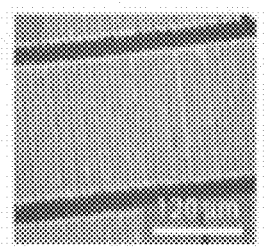
Figure 12F:
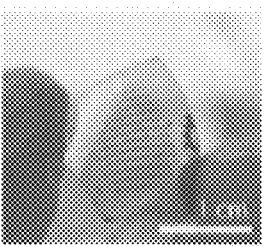
Figure 13A:
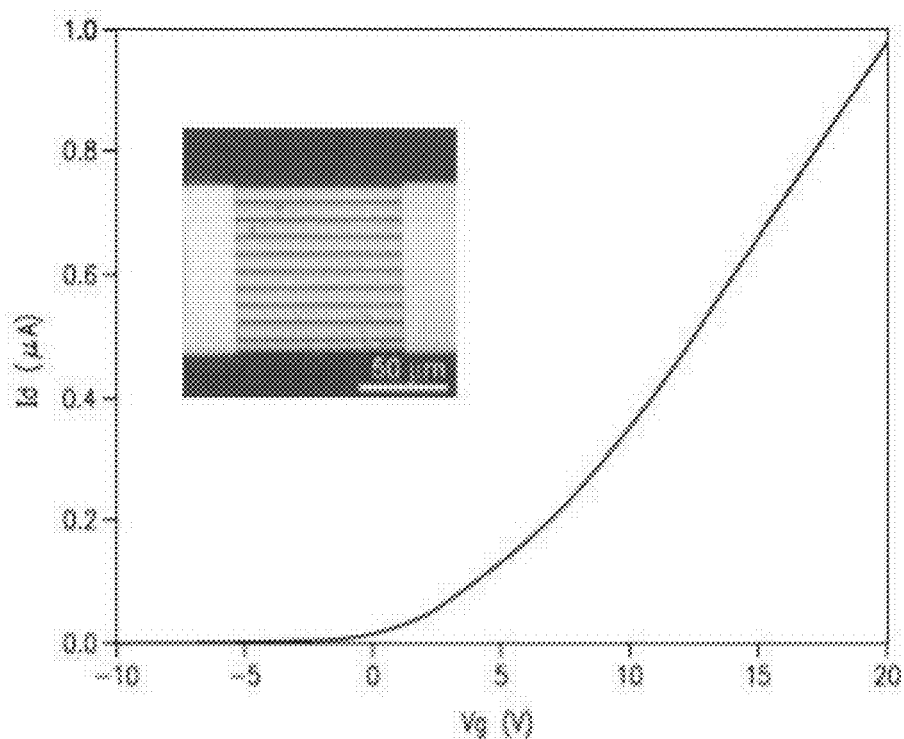
FIG. 13: Electrical characterization of a single-crystalline silicon bottom-gate transistor on a PET/ITO substrate; L=100 um, W=100 um, linear mobility 360 $cm^2V^{-1} s^{-1}$; saturation mobility 100 $cm^2V^{-1} s^{-1}$ (a) transfer characteristics (VD=0.1 V) showing ~4000 on/off ratio with inset top-view of a device. (b) current-voltage (I-V) characteristics.
Figure 13B:
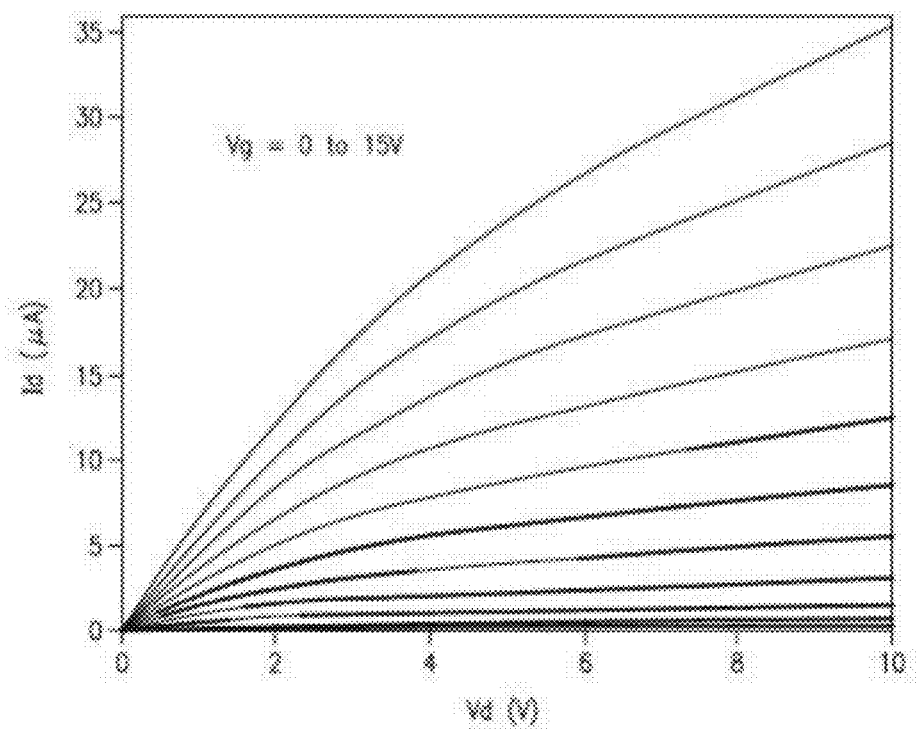

Atomic force microscopy (FIG. 11A) shows that the thickness ranges from ~115 to ~130 nm across a typical ribbon. These variations show up as slight color variations in optical micrographs (FIG. 12E). The roughness as measured by AFM of a 5×5 μm region of the underside of one of these ribbons, displayed in FIG. 12B, is 0.5 nm. This value is larger than the top polished surface (0.12 nm) or the underside of a ribbon generated from and SOI wafer (0.18 nm) measured by the same methods. The use of other anisotropic etchants to lower this roughness is of interest. The source of the thickness variations and, to a lesser extent, the roughness, is partly the edge roughness in the trenches, which in turn causes roughness in the side surface passivation during angled evaporation. Improving the side surface quality can reduce the ribbon thickness variations. As we show in the following, however, transistor devices with good performance can be constructed with ribbons fabricated using the procedures described herein.

The ribbons can be transferred to another (flexible) substrate via a high (>95%) yield printing process, as outlined in FIG. 12. To perform the printing process, a PDMS stamp is laminated against the wafer and then peeled back quickly to retrieve the ribbons. This type of process relies on kinetic control of adhesion to the stamp. The stamp, thus "inked," (FIGS. 12B and 12E) can print the ribbons by contact to another substrate. Ribbons printed onto an ITO-coated 0.2 mm thick PET substrate can be used to make high performance flexible bottom-gate TFTs on plastic with ITO as the gate electrode. A layer of SU-8 deposited onto the ITO gate prior to printing serves as a gate dielectric and a glue to facilitate ribbon transfer. During printing, the ribbons sink into uncured SU-8 such that their tops are flush with the surface of the glue, leaving about 2 μm of dielectric between the ribbons' bottom surfaces and the ITO. Thick (~0.2 μm) Ti source and drain contacts defined by photolithography (100 μm length×100 μm width) and wet etching with $HF/H_2O_2$ form Schottky barrier contacts for the source and drain electrodes. These bottom-gate devices display characteristic n-type enhancement mode MOSFET gate-modulation. Transistors achieve on/off ratios of ~103 with device-level mobilities, as determined using standard equations for the operation of a metal oxide semiconductor field effect transistors, 14 as high as ~360 $cm^2V^{-1}s^{-1}$ (linear) and 100 $cm^2V^{-1}s^{-1}$ (saturation, evaluated at Vd=5 V). The mobility of the ribbons themselves should be about 20% higher than the device level mobility (440 $cm^2V^{-1}s^{-1}$ linear and 120 $cm^2V^{-1}$ saturation), since they fill only about 83% of the channel due to the spaces between them. The ribbon devices survive when the substrate is bent to modest (15 mm) radii but degrade seriously at sharper (5 mm) bends for the 0.2 mm thick substrates.

In summary, this example demonstrates a high-yield fabrication strategy for producing printable single-crystal silicon ribbons from a bulk silicon (111) wafer. Refinishing the bulk wafer's surface after fabrication permit multiple repetitions, producing tens or even hundreds of square feet of ribbons from one square foot of starting material. TFTs made from these ribbons on plastic demonstrate their use as high-performance flexible semiconductors. These devices and the strategies to fabricate them are useful not only for large area flexible electronics, but also for applications that require three dimensional or heterogeneous integration or other features that are difficult to achieve using conventional silicon microfabrication approaches.

EXAMPLE 4

Bendable GaN High Electron Mobility Transistors (HEMTs) on Plastic Substrates

Flexible and large area electronics, technologies embraced within the emerging field of Macroelectronics, has witnessed remarkable progress over the past several years, with several leading consumer and military applications expected to be commercialized in the near future. Microelectronic circuits with novel form factors are critical components of these systems and new methods of fabrication—especially printing— will likely be needed to manufacture them. For this reason, considerable attention has been given to printable forms of semiconductors, and both organic (e.g. pentacene, polythiophenes, etc.) and inorganic (such as poly silicon, inorganic nanowires) materials have been examined. This work has shown some promising results for devices integrated on plastic substrates. Their current range of application, however, is one that is largely limited by the innate poor performance of devices made from these semiconductors, such as their low effective device mobilities and frequencies of operation. We have examined a new form of printable inorganic semiconductors, called microstructured semiconductors (μs-Sc) that enables the fabrication of exceptionally high performance devices on both conventional and organic polymer substrate. We have also shown that, using μs-Sc as a basis, fully developed devices can be made on semiconductor wafers and then subsequently transferred to a flexible substrate without diminishing their performance. This approach exploits the high quality of wafer scale semiconductors, while rendering them amenable to printing based methods of fabrication. Among these materials, single crystalline μs-GaN is of great interest, as it has superior material properties that include a wide band gap (3.4 eV vs 1.4 eV of GaAs) leading to high breakdown field (3 MV cm$^{-1}$ vs 0.4 MV cm$^{-1}$ of GaAs), high saturation carrier velocity (2.5*10$^7$ cm s$^{-1}$ vs 10$^7$ cm s$^{-1}$ of GaAs), and good thermal conductivity (1.3 W cm$^{-1}$ vs 0.5 W cm$^{-1}$ of GaAs). In addition, the heterogeneous integration in the form of AlGaN/GaN heterostructures yields device grade materials with a high conduction band offset and piezoelectric responsiveness with sheet carrier densities lying in the 1.0×10$^{13}$ cm$^{-2}$ range. These attractive properties made GaN suitable for requiring both high frequency and high power performance, such as electronic devices for wireless communication, full color light emitting devices, and UV photodetectors for optoelectronic systems.

Figure 14A:
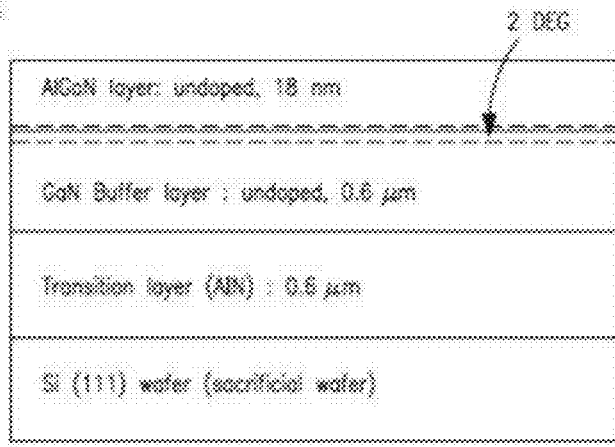
FIG. 14: Schematic illustration of (a) heterostructure GaN wafer for fabricating high electron mobility transistors (HEMTs, two dimensional electron gas (2 DEG) formed between AlGaN and GaN interface); (b) HEMTs geometry on plastic substrate; (c) the Ws-GaN design that is supported by two 'narrow bridges' at the end of Ws-GaN ribbon. Smart anisotropic etching orientation is used to make freestanding Ws-GaN elements.

Since the first demonstration of an AlGaN/GaN high electron mobility transistors (HEMTs), there has been substantial research activity focused in this area. These efforts have led to devices being integrated on a variety of substrates, including sapphire, SiC, Si and AlN. In this example, we describe the fabrication of flexible AlGaN/GaN heterostructure high electron mobility transistors (HEMTs, as shown the process summarized in FIG. 14), ones processed and subsequently transferred from their Si (111) growth substrate onto plastic sheets via a contact-printing-based protocol. This work provides a description of procedures for integrating high performance HEMT devices based on heterostructure III-V semiconductor materials onto plastic substrates.

FIG. 15 schematically illustrates the steps used in the fabrication of the HEMT devices. The process starts with the formation of an ohmic contact (Ti/Al/Mo/Au) on the bulk GaN heterostructure wafer using a standard sequence photolithographic and lift-off steps (FIG. 15A). A PECVD oxide layer and Cr metal are then deposited to serve as a mask for subsequent dry etching. Photolithography and etching of the Cr and PECVD oxide define the geometries desired for GaN ribbons that serve as the solid ink for subsequent printing (FIG. 15B). After striping the top photoresist, ICP dry etching is used to remove the exposed GaN (FIG. 15C). The Or layer is removed by this ICP etching step, but left the thicker PECVD oxide layer essentially intact on top of the GaN. Anisotropic wet etching with tetramethyl ammonium hydroxide (TMAH) (FIG. 15D) removes the underlying Si and detaches the GaN ribbons from the mother substrate. During this strong alkaline etching, the PECVD oxide serves to protect the ohmic contacts from degradation. The remaining PECVD oxide, which has been severely roughened by the plasma and wet etching steps, is then removed using a BOE (buffered oxide etchant) process step. A new smooth, sacrificial silicon oxide layer is deposited subsequently on the top of GaN ribbons by e-beam evaporation. A print to GaN ribbons, the wafer was contacted with a poly-dimethylsiloxane (PDMS) slab (FIG. 15E), and on fast removal from the mother substrate, a complete transfer of the μs-GaN to the PDMS is obtained. This "inked" slab is then laminated with a poly (ethyleneterepthalate) sheet (PET) coated with polyurethane (PU) (FIG. 15F) and, from the topside, a UV light is used to cure the PU (FIG. 15H). Peeling back the PDMS results in the transfer of the μs-GaN elements to the plastic substrate. The transfer leaves a PU residue on top of GaN ribbons. This residue is removed when the e-beam-deposited SiO$_2$ layer, evaporated in the step of FIG. 15E, is stripped with BOE. The final step of the process involves the formation of source/drain interconnections and schottky gate metal contacts (Ni/Au), layers deposited by e-beam evaporation and patterned using a standard liftoff process (FIG. 15F).

Figure 14B:
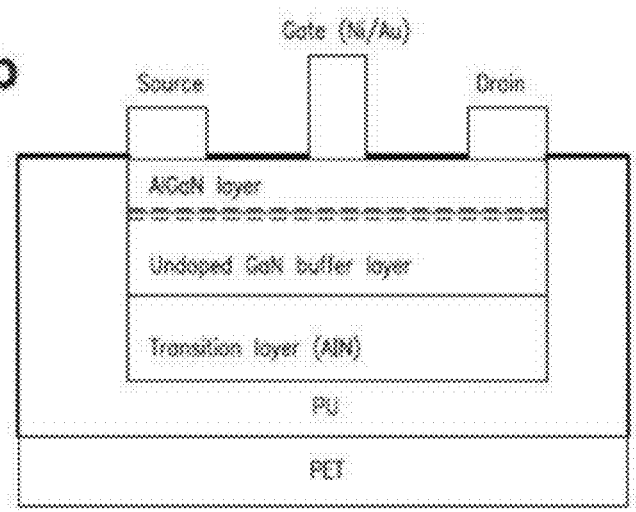
Figure 14C:
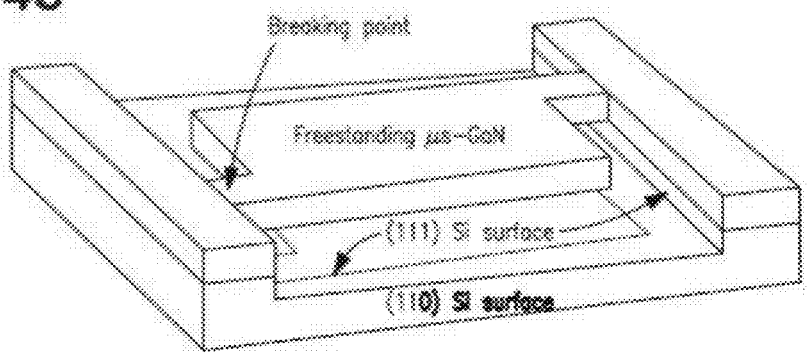
Figure 15A:
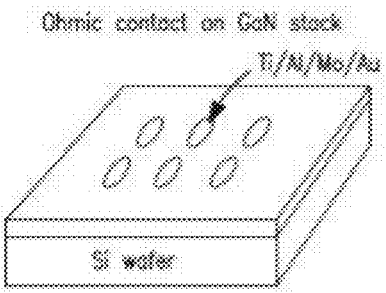
FIG. 15: Schematic illustration of steps for fabrication of Ws-GaN HEMTs onto plastic substrate.
Figure 15E:
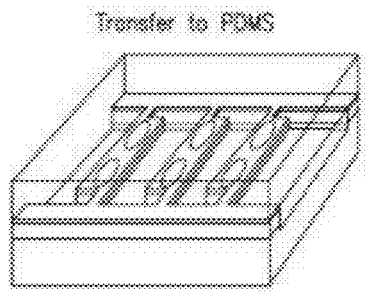
Figure 15B:
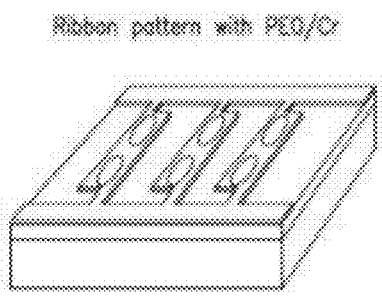
Figure 15F:
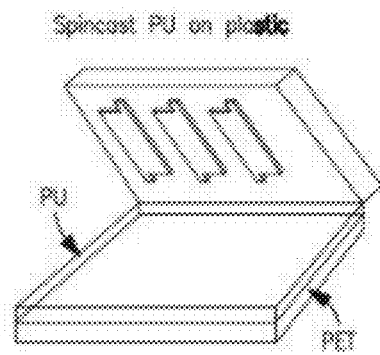
Figure 15C:
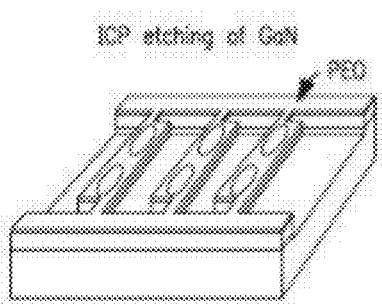
Figure 15G:
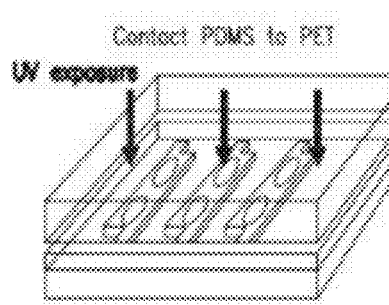
Figure 15D:
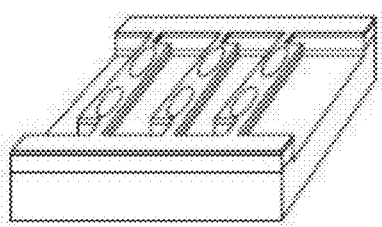
Figure 15H:
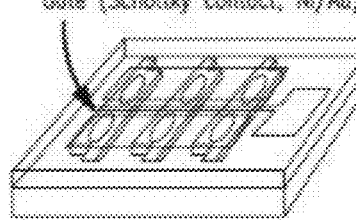
Figure 16A:
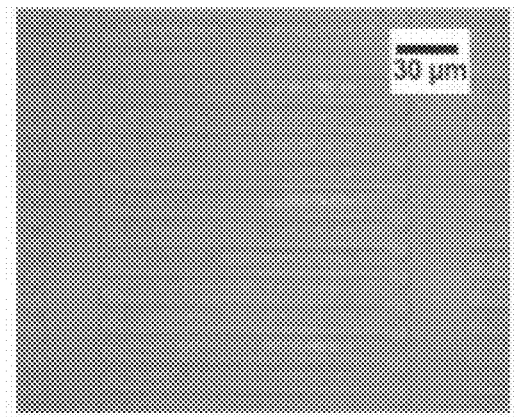
FIG. 16: (a) GaN wafer before TMAH wet etching of underlying Si. (b) Freestanding GaN ribbon after TMAH etching. Note the color difference between the etched and non etched area of sacrificial Si layer. (c-d) SEM images of intermediate step of TMAH anisotropic etching of underlying Si. (e) An SEM image of PDMS slab inked with μs-GaN objects by a van der waals force. (f) An SEM image of μs-GaN transferred to PU coated PET. The metal and polymer areas are artificially colorized for ease of viewing.
Figure 16B:
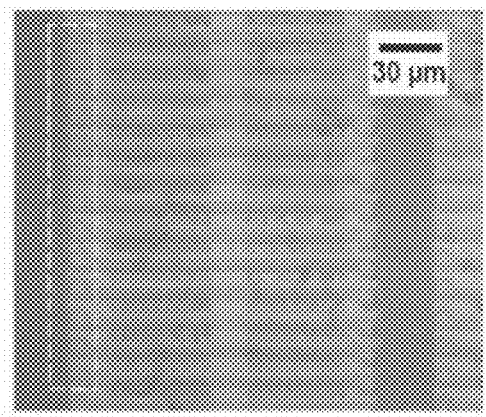
Figure 16C:
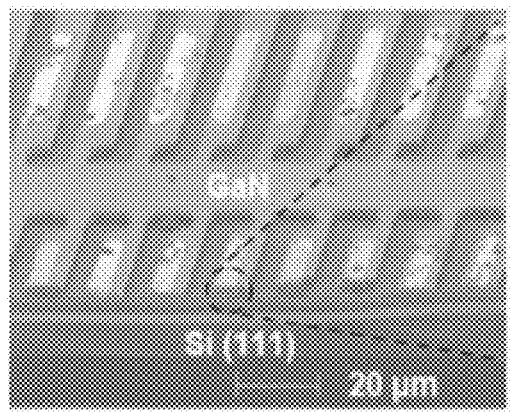
Figure 16D:
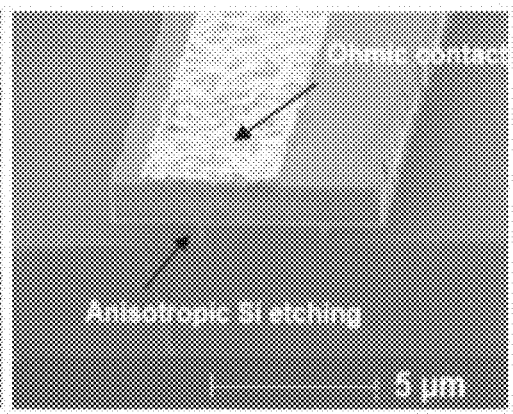
Figure 16E:
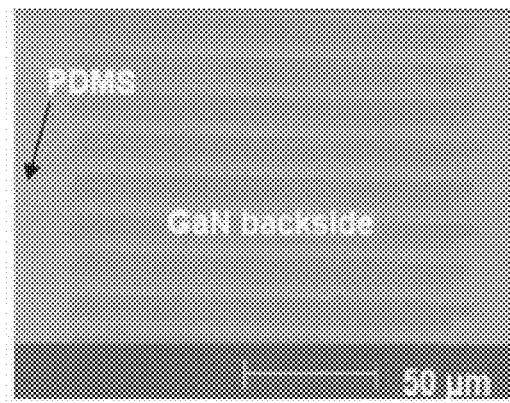
Figure 16F:
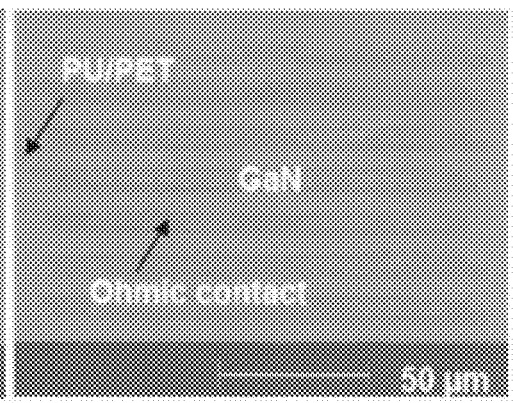

To maintain the original position of the freestanding μs-GaN after removing underlying Si (FIG. 1d), we adopt new geometry of microstructured semiconductor (μs-Sc) as shown in the process outlined in FIG. 14C. The μs-GaN ribbon has two narrow bridges (i.e. two breaking points as indicated as arrows in FIG. 14C) at the ends of the GaN ribbon to facilitate their registered transfer to the PDMS printing tool (FIG. 15E). This architecture represents a significant improvement over the 'peanut' design reported previously. The fracture that mediates the transfer process was found to be vastly efficient with this design. The earlier 'peanut' design requires a strict optimization of etching time and highly uniform etch rates over a large area to generate μs-Sc ribbons suitable for printing. The current 'narrow bridge' design is far less sensitive to etching rate difference. To illustrate this latter point, FIGS. 16A and 16B show optical images of the GaN wafer taken before and after TMAH anisotropic etching step, respectively. The different colors of the freestanding and supported GaN microstructure are easily distinguishable in these images. FIGS. 16C and 16D show scanning electron micrograph (SEM) images taken at intermediate stages of the TMAH etching step that cuts the underlying Si. The magnified image of FIG. 16D and dashed line area of FIG. 16B powerfully illustrate the highly anisotropic nature of this indicate that Si etching process, one propagated essentially only in a direction perpendicular to the orientation of the GaN ribbon. In this particular system, the preferential etching occurs along the (110) direction; the Si (111) surfaces, as noted in FIG. 14C, served as an innate etch blocking mask. FIG. 16E shows an SEM image of an inked PDMS slab where the μs-GaN was transferred with full tension of its on-wafer registration. The image of FIG. 16F shows an SEM micrograph of the printed structures where, the final step, the μs-GaN heterostructure devices are transferred to the PU coated PET substrate. These images demonstrate that transfer based on the 'narrow bridge' μs-GaN motif does not damage heterostructure ribbons.

FIGS. 17A and 17B present representative optical images of μs-GaN based HEMTs after transfer to the PET substrate. The various contrast correspond to the various lends of the cross section schematic of these devices is shown in FIG. 14B. In this geometry, the active electron channel is formed between the two ohmic contacts (Ti/Al/Mo/Au) and the electron flow rate (or current) is controlled by the schottky (Ni/Au) gate contact. The channel length, the channel width, and the gate width of the devices shown in FIG. 17B are 20, 170, and 5 µm respectively. Unlike previous ps-GaAs processes that had inevitable limitation of small filling factor caused by side surface wet etching, the filling factor for these devices is quite high compared to an earlier report for a printed III-V structure (67% vs 13% for µs-GaAs). FIG. 17C shows typical drain current-voltage (I-V) characteristics of the plastic supported GaN HEMT devices; the gate was biased from ~3 to 1 V in steps of 1 V. The device exhibits a maximum drain current of ~5 mA at a gate bias of 1 V and drain bias of 5 V. FIG. 17D shows the transfer characteristics, measured at a constant drain voltage ($V_d$=2 V). The device exhibits threshold voltage ($V_{th}$) of −2.7 V, an on/off ratio of $10^3$, and a transconductance of 1.5 mS. The transconductance of GaN HEMTs with the same device geometry but prior to transfer has a transconductance of 2.6 mS. The transfer process appears to lead to reduction in this value of about 38%.

Figure 18A:
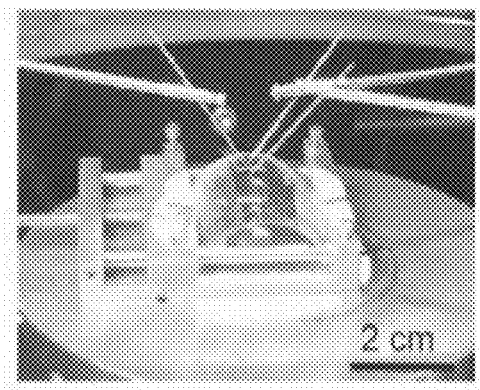
Figure 18B:
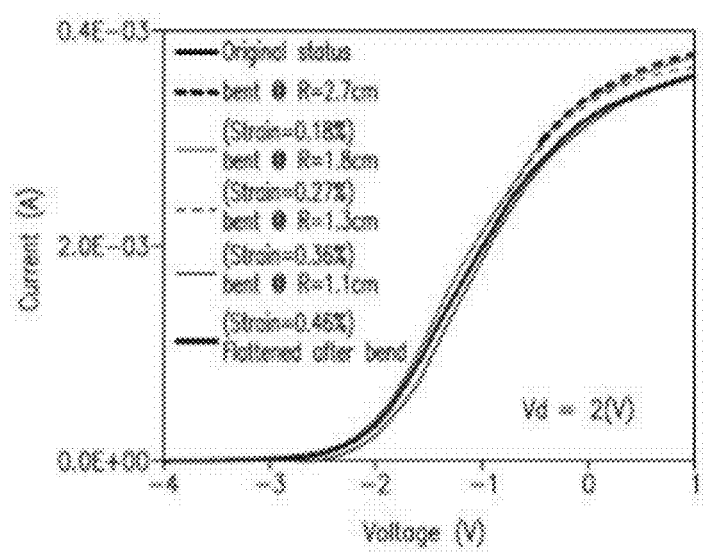
Figure 18C:
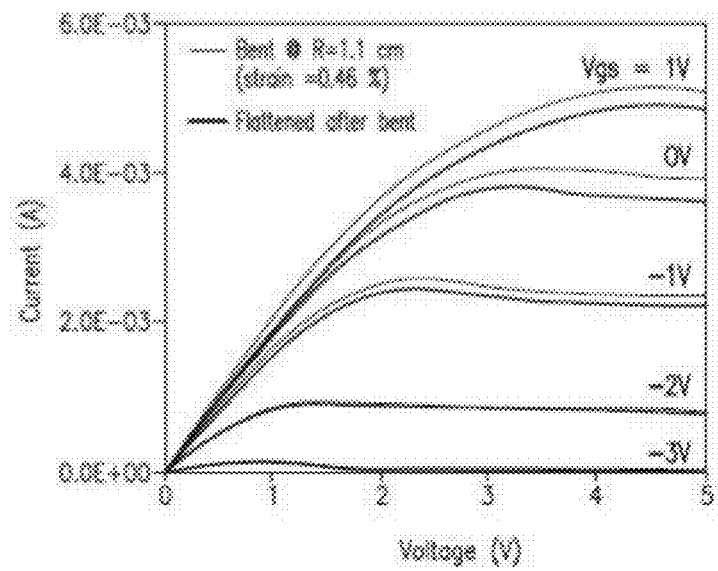

The mechanical flexibility of the GaN HEMTs was investigated using a bending stage, as shown in FIG. 18A. FIG. 18B shows a series of transfer curves measured as a function of bending radius (and its corresponding strain). For bending radii down to 1.1 cm (corresponding to strains of the order of 0.46%), we observe very stable responses in the measured transconductance, threshold voltage, and on/off ratios. FIG. 18C shows a sequence of current-voltage (I-V) curves measured at both the positions of maximum strain and after its release. As noted above, the impacts found are relatively modest and the small differences seen between three I-V curves of FIG. 17B and FIG. 18B suggest that the µs-GaN HEMT devices are not damaged by the harsh bending cycles.

In summary, this example describes a process suitable for printing high performance GaN HEMTs in flexible forms on plastic substrates. We further demonstrate an efficient geometry of µs-Sc that facilitates transfer printing protocols, and smart-material strategies for removing sacrificial layers by anisotropic wet etching. Our results suggest that µs-GaN technology provide interesting opportunities for developing next generation macroelectronic devices, such as high performance mobile computing and high speed communication systems.

Methods: GaN microstructures are fabricated on a heterostructure GaN on silicon (100) wafer (Nitronex) comprised of three layers of III-V semiconductor: AlGaN layer (18 nm, undoped); GaN buffer layer (0.6 µm, undoped); and AlN transition layer (0.6 µm). Using AZ 5214 photoresist, an ohmic contact area is opened and this exposed area is cleaned using an $O_2$ plasma (Plasmatherm, 50 mTorr, 20 sccm, 300 W, 30 sec). In order to achieve low contact resistances, a pretreatment of the ohmic contact area using a $SiCl_4$ plasma in a RIE system is performed prior to the metallization step. A Ti/Al/Mo/Au (15/60/35/50 nm from bottom to top) metal layer is then deposited. Electron-beam evaporation is used to deposit Ti, Al, and Mo, while Au was deposited by thermal evaporation. The contacts are defined using a lift-off process. The contacts are annealed at 850° C. for 30 sec in a rapid thermal annealing system using an $N_2$ ambient. The PECVD oxide (Plasmatherm, 400 nm, 900 mTorr, 350 sccm 2% $SiH_4$/He, 795 sccm $NO_2$, 250° C.) and Cr metal (E-beam evaporator, 150 nm) layers are deposited as the mask materials for subsequent ICP etching. Photolithography, wet etching (Cyantek Cr etchant) and RIE processing (50 mTorr, 40 sccm $CF_4$, 100 W, 14 min) define the ribbon geometries of the GaN. After removing the photoresist with acetone, ICP dry etching (3.2 mTorr, 15 sccm $Cl_2$, 5 sccm Ar, −100V Bias, 14 min) is used to remove the exposed GaN, and the underlying Si is then etched away using a TMAH wet etching solution (Aldrich, 160° C. for 5 min). The sample is dipped in BOE (6:1, $NH_4F$:HF) for 90 sec to remove the PECVD oxide and a new 50 nm e-beam evaporated $SiO_2$ layer deposited on top of the GaN ribbons. The GaN wafer is then contacted with a PDMS slab (Sylgard 184, Dow corning) which is then pealed away at peel rate>0.01 m s$^{-1}$ to pick up the ps-GaN elements. The PDMS slab inked with the ps-GaN is then laminated to a poly(ethyleneterepthalate) sheet (PET, 100 µm in thickness, Glafix Plastics) coated with polyurethane (PU, Norland optical adhesive, No. 73). The sample is exposed to UV light (homebuilt ozone active mercury lamp, 173 µW cm$^{-2}$) from the top to cure the PU. Peeling back the PDMS and removing the e-beam oxide by immersion in BOE for 30 sec results in the transfer of the ps-GaN elements onto the plastic substrate. A negative photoresist (AZ nLOF2020) is used to pattern the Schottky contact area and a Ni/Au (80/100 nm) layer is then deposited by ebeam evaporation. The PR is removed using a lift off process in conjunction with an AZ stripper (KWIK for 5 hours).

EXAMPLE 5

Printable Semiconductor Elements Derived from Bulk Wafer of GaAs with Multiple Epitaxial Layers The present invention include methods of making printable semiconductor ribbons using bulk wafers of GaAs as starting materials. In one embodiment, the ribbons are generated from a high-quality bulk wafer of GaAs with multiple epitaxial layers. The wafer is prepared by growing a 200-nm thick AlAs layer on a (100) semi-insulating GaAs (SI-GaAs) wafer, followed by sequential deposition of a SI-GaAs layer with thickness of 150 nm and Si-doped n-type GaAs layer with thickness of 120 nm and carrier concentration of $4\times10^{17}$ cm$^{-3}$. A pattern of photoresist lines defined parallel to the ($0\bar{1}\bar{1}$) crystalline orientation serves as masks for chemical etching of the epilayers (including both GaAs and AlAs). Anisotropic etching with an aqueous etchant of $H_3PO_4$ and $H_2O_2$ isolated these top layers into individual bars with lengths and orientations defined by the photoresist, and with side surfaces that form acute angles relative to the wafer surface. Removing the photoresist after the anisotropic etching and then soaking the wafer in an ethanol solution of HF (2:1 in volume between ethanol and 49% aqueous HF) removes the AlAs layer and released ribbons of GaAs (n-GaAs/SI-GaAs). The use of ethanol, instead of water, for this step reduces cracking that can occur in the fragile ribbons due to the action of capillary forces during drying. The lower surface tension of ethanol compared to water also minimizes drying-induced disorder in the spatial layout of the GaAs ribbons.

GaAs wafers with customer-designed epitaxial layers are purchased from IQE Inc., Bethlehem, Pa. The lithographic processes employed AZ photoresist, i.e., AZ 5214 and AZ nLOF 2020 for positive and negative imaging, respectively. The GaAs wafers with photoresist mask patterns are anisotropically etched in the etchant (4 mL $H_3PO_4$ (85 wt %), 52 mL $H_2O_2$ (30 wt %), and 48 mL deionized water) that is cooled in the ice-water bath. The AlAs layers are dissolved with a diluted HF solution (Fisher® Chemicals) in ethanol (1:2 in volume). The samples with released ribbons on mother wafers are dried in a fume hood. The dried samples are placed in the chamber of electron-beam evaporator (Temescal FC-1800) and coated with sequential layers of 2-nm Ti and 28-nm $SiO_2$.

EXAMPLE 6

Figure 19:
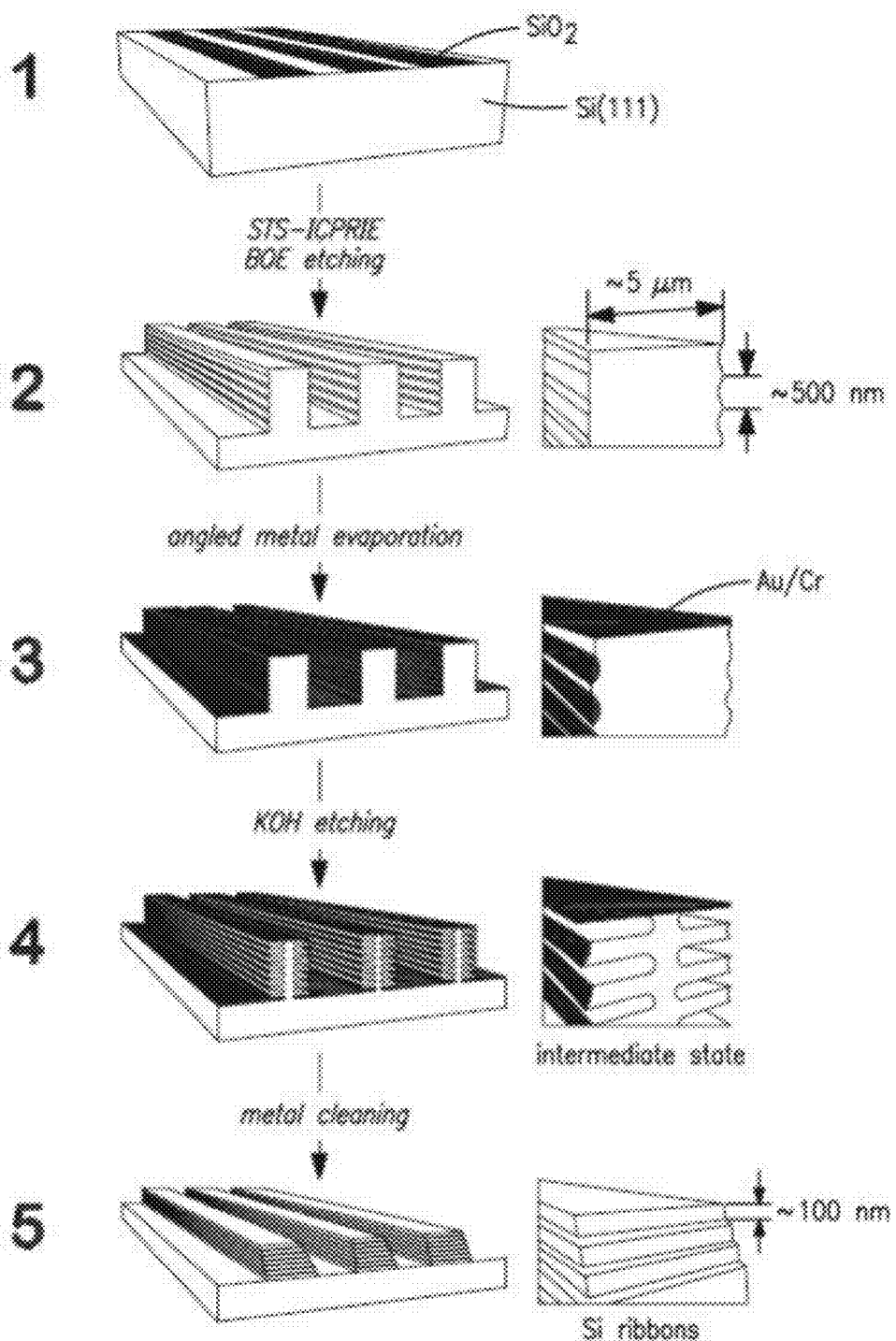
FIG. 19 provides a process flow schematic illustrating a method of the present invention for making multilayer arrays of printable semiconductor elements.
Figures 20A, 20B:
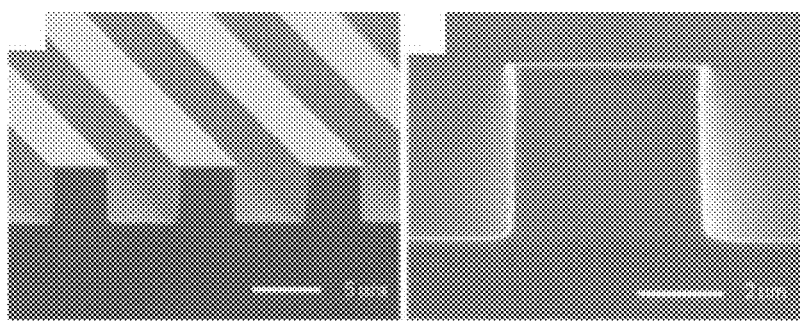
FIG. 20 provides SEM images of Si (111) in angled-view (a, c, e, g) and cross-sectional view (b, d, f, h): (a and b) after STS-ICPRIE and BOE etching, (c and d) after metal protection on the side surfaces, (e through h) after KOH etching for 2 min (e and f) and 5 min (g and h) followed by metal cleaning.
Figures 20C, 20D:
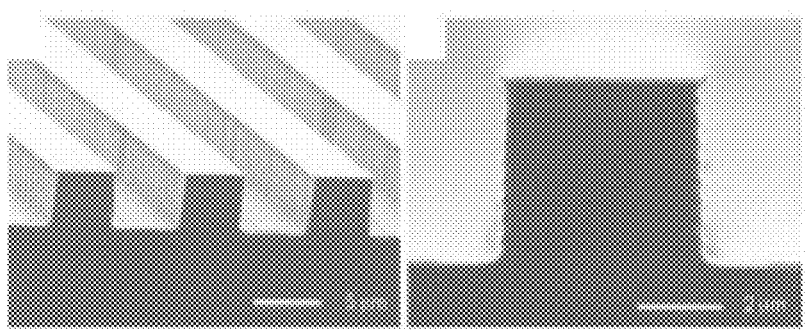
Figures 20E, 20F:
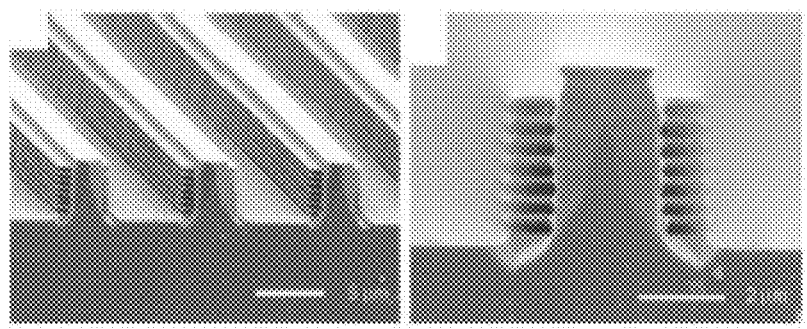
Figures 20G, 20H:
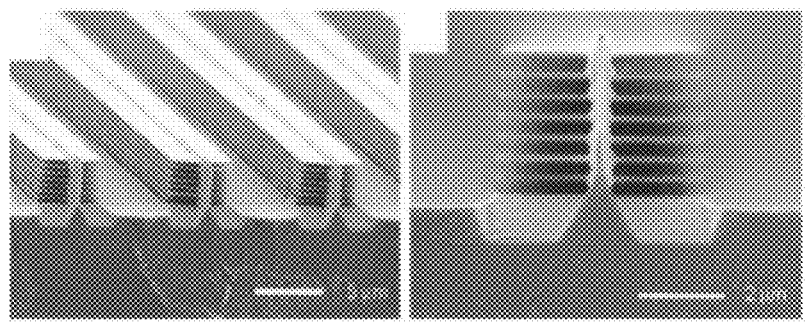

Multi-Layer Arrays Printable Semiconductor Elements Derived from Si (111) Wafers The present invention also includes methods and compositions providing multilayer arrays printable semiconductor elements derived from Si(111) wafer precursor materials. FIG. 19 provides a process flow schematic illustrating a method of the present invention for making multilayer arrays of printable semiconductor elements. As shown in panel 1 of FIG. 19, a silicon wafer having a (111) orientation is provided. An external surface of the wafer is patterned with an etch resistant mask, thereby generating masked regions having dimensions selected to define the lengths and widths of printable semiconductor ribbon in the multilayer array. In the example shown in FIG. 19, the etch resistant mask is a thermally grown $SiO_2$ layer.

As shown in pane 2, the silicon wafer is etched predominately in a directed orthogonal to the patterned external surface. The etching system employed generates recessed features having contoured side surfaces. In an useful embodiment, the side surfaces of the recessed features have a selected, spatially varying contour profile having a plurality of contour features, such as side surfaces with a periodic scalloped contour profile and/or a contour profile having deep ridges present on the side surfaces of the recessed features.

Exemplary means for generating recessed features having a selected contour profile include STS-ICPRIE and BOE etching systems providing cyclic exposure of the silicon wafer to reactive ion etchant gases and etch resist materials. As shown in panel 3 of FIG. 19, this processing step generates a plurality of silicon structures having selectively contoured side surfaces positioned adjacent to the recessed features.

As shown in panel 3 of FIG. 19, the processed silicon wafer having recessed features and silicon structure is subject to deposition of an etch resistant mask materials such that the contoured side surfaces of the recessed features is only partially coated with deposition material. In this aspect of the invention the selected contour profile of the side surfaces of the recessed features determines, at least in part, the spatial distribution of mask material on the side surfaces. This processing step, therefore, defines the thickness of printable semiconductor elements in the multi layer stack. For example, the wafer may be exposed to angled vapor deposition of a metal or combination of metals resulting in deposition of material predominately on ridges present in the contoured surfaces of the recessed features and substantially no deposition on regions of the contoured surface that are in the "shadows" of the ridges present for example to recessed regions of the side walls. The "shadows" casts by features in the selected contour profile, such as ridges, ripples and scalloped shaped features, therefore, at least in part define the thickness of the printable semiconductor elements in the multilayer array. Use of gold deposition materials is beneficial due to its good adherence to the exposed silicon surface.

As shown in panel 4 of FIG. 19, the wafer is next subjected to anisotropic etching, for example via exposure to a basic solution such as KOH. Regions between the recessed features are etched such that etching occurs along <110> directions of the silicon wafer, thereby fabricating a multilayer array of printable semiconductor elements each of which comprising a partially or entirely undercut silicon structures. The present invention includes methods wherein etching along <110> directions of the silicon wafer proceeds to completion between adjacent recessed features, thereby entirely undercutting the printable semiconductor element(s). As described in detail above, the etching system chosen in combination with the (111) orientation of the silicon wafer results in a faster etch rate along <110> directions than along <111> directions of the wafer. Optionally, the position, shape and spatial orientation of recessed features are selected to form alignment maintenance elements, such as bridge elements connecting the printable semiconductor element to the wafer. In the multilayer structure shown in panel 4, bridge elements are provided that connect the ends of the semiconductor ribbons in the multilayer array to the silicon wafer.

Panel 5 of FIG. 19 shows an optional processing step wherein the bridge elements are released from the silicon wafer, for example via washing, etching or other material removal processes, thereby generating a multilayer stack of printable semiconductor elements. Alternatively, printable semiconductor elements in the array can be released via contact printing methods. In one embodiment, for example, printable semiconductor elements in the multilayer array are sequentially released and transferred from the silicon wafer via repeatedly bringing the printable semiconductor elements in contact with a transfer device, such as an elastomeric stamp.

FIG. 20 provides SEM images of Si (111) in angled-view (a, c, e, g) and cross-sectional view (b, d, f, h): (a and b) after STS-ICPRIE and BOE etching, (c and d) after metal protection on the side surfaces, (e through h) after KOH etching for 2 min (e and f) and 5 min (g and h) followed by metal cleaning.

Figures 21A, 21B, 21C:
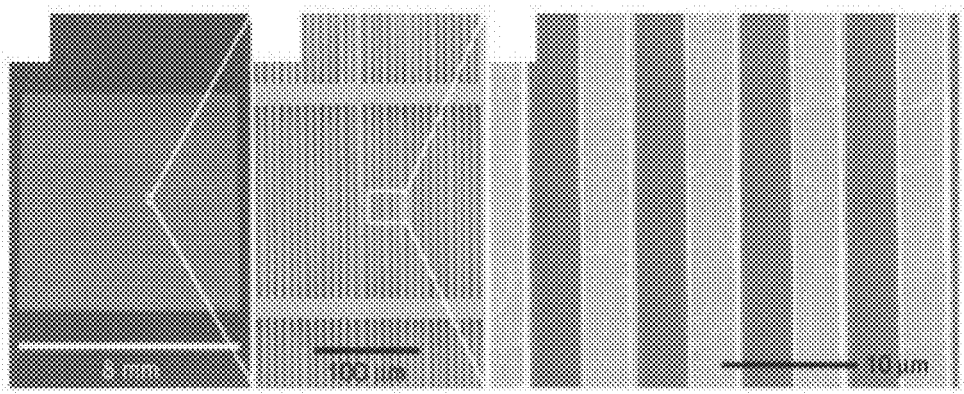
FIG. 21 provides (a) provides a photograph of a large-scale aligned array of four-layered Si (111) ribbons. (b and c) Top-view and (d and e) angled-view SEM images of the four-layered Si (111) shown in (a).
Figure 21D:
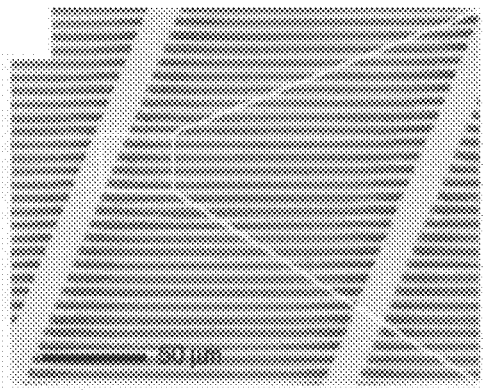
Figure 21E:
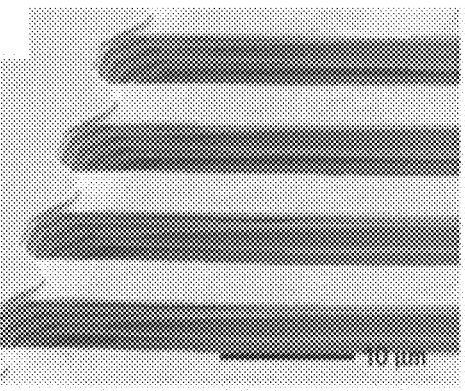

FIG. 21 provides (a) provides a photograph of a large-scale aligned array of four-layered Si (111) ribbons. (b and c) Top-view and (d and e) angled-view SEM images of the four-layered Si (111) shown in (a).

Figures 22A, 22B, 22C:
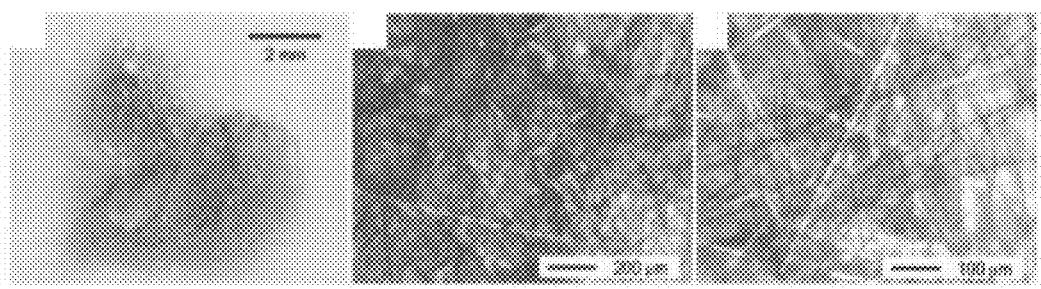
FIG. 22 provides (a) Photograph and (b and c) OM images of released flexible Si (111) ribbons. (d to f) SEM images of the ribbons shown in (a).
Figures 22D, 22E, 22F:
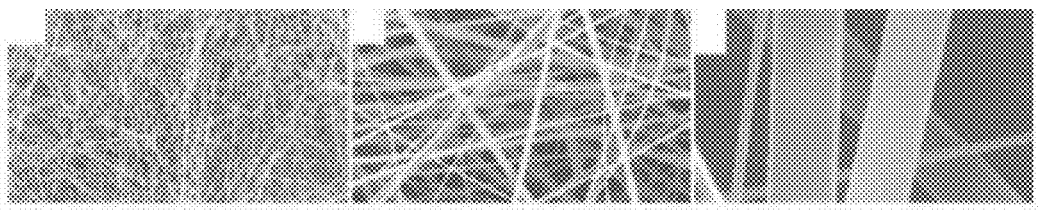

FIG. 22 provides (a) Photograph and (b and c) OM images of released flexible Si (111) ribbons. (d to f) SEM images of the ribbons shown in (a).

Figure 23A:
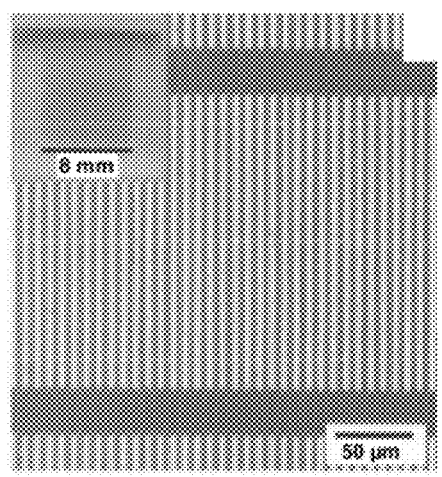
FIG. 23 provides (a) Optical images of aligned Si (111) ribbons transferred on PDMS substrate. (b) AFM image of four ribbons from the array shown in (a). (c) Photograph of a flexible polyester film that houses four patterns of Si (111) arrays from four cycles of transferring from a single Si chip.
Figure 23B:
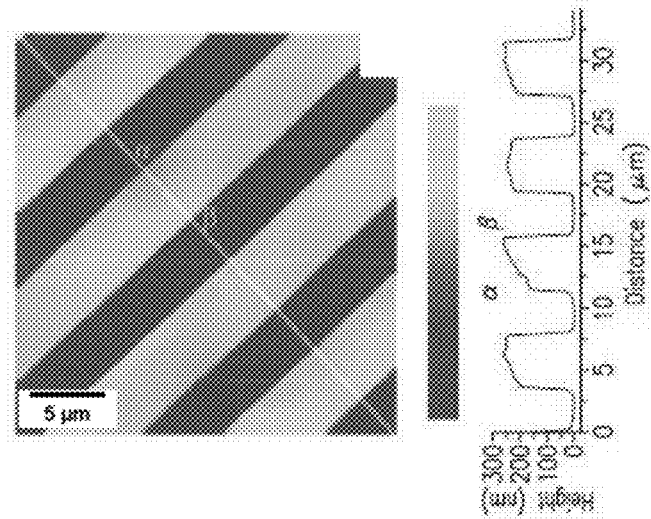
Figure 23C:
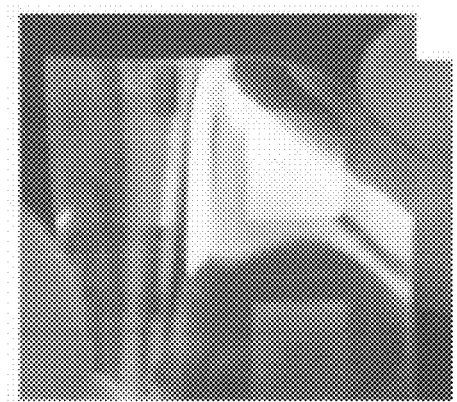

FIG. 23 provides (a) Optical images of aligned Si (111) ribbons transferred on PDMS substrate. (b) AFM image of four ribbons from the array shown in (a). Photograph of a flexible polyester film that houses four patterns of Si (111) arrays from four cycles of transferring from a single Si chip.

REFERENCES

[1] a) Y. Xia, P. Yang, Y. Sun, Y. Wu, B. Mayers, B. Gates, Y. Yin, F. Kim, H. Yan, *Adv. Mater.* 2003, 15, 353. b) C. M. Lieber, *Mater. Res. Soc. Bull.* 2003, 28, 486. c) M. C. McAlpine, R. S. Friedman, C. M. Lieber, *Proc. IEEE* 2005, 93, 1357. d) M. Law, J. Goldberger, P. Yang, *Ann. Rev. Mater. Res.* 2004, 34, 83. e) P. Yang, *Mater. Res. Soc. Bull.* 2005, 30, 85. f) Z. R. Dai, Z. W. Pan, Z. L. Wang, *Adv. Funct. Mater.* 2003, 13, 9. g) special issue on nanostructured advanced materials, *Pure Appl. Chem.* 2002, 74(9).

[2] a) Y. Yin, A. P. Alivisatos, *Nature,* 2005, 437, 664. b) I. Gur, N. A. Fromer, M. L. Geier, A. P. Alivisatos, *Science,* 2005, 310, 462. c) L. Samuelson, M. T. Björk, K. Depper, M. Larsson, B. J. Ohlsson, N. Panev, A. I. Persson, N. Skold, C. Thelander, L. R. Wallenberg, *Physica E* 2004, 21, 560.

[3] a) L. A. Bauer, N. S. Birenbaum, G. J. Meyer, *J. Mater. Chem.* 2004, 14, 517. b) Y. Cui, Q. Wei, H. Park, C. M. Lieber, *Science* 2001, 293, 1289.

[4] Z. Tang, N. A. Kotov, *Adv. Mater.* 2005, 17, 951.

[5] X. Duan, C. Niu, V. Sahi, J. Chen, J. W. Parce, S. Empedocles, J. L. Goldman, *Nature* 2003, 425, 274.

[6] R. S. Friedman, M. C. McAlpine, D. S. Ricketts, D. Ham, C. M. Lieber, *Nature* 2005, 434, 1085.

[7] E. Menard, K. J. Lee, D.-Y. Khang, R. G. Nuzzo, J. A. Rogers, *Appl. Phys. Lett.* 2004, 84, 5398.

[8] a) S. Mack, M. A. Meitl, A. Baca, in preparation. b) Y. Sun, S. Mack, J. A. Rogers, *Proc. Intl. Electron Device Meeting (IEEE)*, 2005, in press.

[9] a) E. Menard, R. G. Nuzzo, J. A. Rogers, *Appl. Phys. Lett.* 2005, 86, 093507. b) Z.-T. Zhu, E. Menard, K. Hurley, R. G. Nuzzo, J. A. Rogers, *Appl. Phys. Lett.* 2005, 86, 133507.

[10] a) Y. Sun, J. A. Rogers, *Nano Lett.* 2004, 4, 1953. b) Y. Sun, D.-Y. Khang, F. Hua, K. Hurley, R. G. Nuzzo, J. A. Rogers, *Adv. Funct. Mater.* 2005, 15, 30.

[11] Y. Sun, S. Kim, I. Adesida, J. A. Rogers, *Appl. Phys. Lett.* 2005, 87, 083501.

[12] Y. Sun, H.-S. Kim, E. Menard, S. Kim, G. Chen, I. Adesida, R. Dettmer, R. Cortez, A. Tewksbury, J. A. Rogers, *Appl. Phys. Lett., submitted*.

[13] R. H. Reuss, B. R. Chalamala, A. Moussessian, M. G. Kane, A. Kumar, D. C. Zhang, J. A. Rogers, M. Hatalis, D. Temple, G. Moddel, B. J. Eliasson, M. J. Estes, J. Kunze, E. S. Handy, E. S. Harmon, D. B. Salzman, J. M. Woodall, M. A. Alam, J. Y. Murthy, S. C. Jacobsen, M. Olivier, D. Markus, P. M. Campbell, E. Snow, *Proc. IEEE* 2005, 39, 1239.

[14] D. C. Duffy, C. McDonald, O. J. A. Schueller, G. M. Whitesides, *Anal. Chem.* 1998, 70, 4974.

[15] S. M. Sze, *Semiconductor Devices, Physics and Technology* (Wiley, New York, 1985).

[16] G. Eftekhari, *Phys. Status Solidi A-Appl. Res.* 1993, 140, 189.

[17] H.-I. Chen, C.-K. Hsiung, Y.-I Chou, *Semicond. Sci. Technol.* 2003, 18, 620.

[18] S. Forment, M. Biber, R. L. van Meirhaeghe, W. P. Leroy, A. Türüt, *Semicond. Sci. Technol.* 2004, 19, 1391.

[19] L. Stephen, S. E. Butner, *Gallium Arsenide Digital Integrated Circuit Design*. (McGraw-Hill, New York, 1990).

[1] R. H. Reuss, B. R. Chalamala, A. Moussessian, M. G. Kane, A. Kumar, D. C. Zhang, J. A. Rogers, M. Hatalis, D. Temple, G. Moddel, B. J. Eliasson, M. J. Estes, J. Kunze, E. S. Handy, E. S. Harmon, D. B. Salzman, J. M. Woodall, M. A. Alam, J. Y. Murthy, S. C. Jacobsen, M. Olivier, D. Markus, P. M. Campbell, and E. Snow, Proc. IEEE 39, 1239 (2005).

[2] K. Nomura, H. Ohta, A. Takagi, T. Kamiya, M. Hirano, and H. Hosono, Nature 432, 488 (2004).

[3] D. B. Mitzi, L. L. Kosbar, C. E. Murray, M. Copel, and A. Afzali, Nature 428, 299 (2004).

[4] S. Ucjikoga, MRS Bull. 27, 881 (2002).

[5] X. Duang, C. Niu, V. Sahi, J. Chen, J. W. Parce, S. Empedocles, and J. L. Goldman, Nature 425, 274 (2003).

[6] R. S. Friedman, M. C. McAlpine, D. S. Ricketts, D. Ham, and C. M. Lieber, Nature 434, 1085 (2005).

[7] E. Menard, K. J. Lee, D.-Y. Khang, R. G. Nuzzo, and J. A. Rogers, Appl. Phys. Lett. 84, 5398 (2004).

[8] E. Menard, R. G. Nuzzo, and J. A. Rogers, Appl. Phys. Lett. 86, 093507 (2005).

[9] Z.-T. Zhu, E. Menard, K. Hurley, R. G. Nuzzo, and J. A. Rogers, Appl. Phys. Lett. 86, 133507 (2005).

[10] Y. Sun, S. Kim, I. Adesida, and J. A. Rogers, Appl. Phys. Lett. 87, 083501 (2005).

[11] Y. Sun, and J. A. Rogers, J. A. Nano Lett. 4, 1953 (2004).

[12] Y. Sun, D.-Y. Khang, F. Hua, K. Hurley, R. G. Nuzzo, and J. A. Rogers, Adv. Funct. Mater. 15, 30 (2005).

[13] A. S. Sedra, and K. C. Smith, *Microelectronic Circuits* (Oxford University Press, New York, 1998).

[14] L. Stephen, and S. E. Butner, *Gallium Arsenide Digital Intergrated Circuit Design* (McGraw-Hill, New York, 1990).

[15] M. C, Lau, *Small Signal Equivalent Circuit Extraction from a Gallium Arsenide MESFET device* (M.S. thesis, Virginia Polytechnic Institution and State University, Blacksburg, Va., 1997).

[16] L. B. Freund, Intl. J. Solids Struct. 37, 185 (2000).

[17] C. P. Kuo, S. K. Vong, R. M. Cohen, and G. B. Stringfellow, J. Appl. Phys. 57, 5428 (1985).

[1] X. Duan, C. Niu, V. Sahi, J. Chen, J. W. Parce, S. Empedocles, J. L. Goldman, Nature 425, 274 (2003).

[2] Y. Huang, X. Duan, Q. Wei, C. M. Lieber, Science 291, 630 (2001).

[3] M. A. Meitl, Y. Zhou, A. Gaur, S. Jeon, M. L. Usrey, M. S. Strano, J. A. Rogers, Nano Lett. 4, No. 9 1643 (2004).

[4] R. S. Friedman, Nature 434, 1085 (2005).

[5] E. Menard, K. J. Lee, D.-Y. Khang, R. G. Nuzzo and J. A. Rogers, Appl. Phys. Lett. 84, 5398 (2004).

[6] E. Menard, R. G. Nuzzo and J. A. Rogers, Appl. Phys. Lett. 86, (2005).

[7] Z.-T. Zhu, E. Menard, K. Hurley, R. G. Nuzzo, J. A. Rogers, Appl. Phys. Lett. 86, 133507 (2005).

[8] Y. Sun, S. Kim, I. Adesida, J. A. Rogers, Appl. Phys. Lett. 87, 083501 (2005).

[9] K. J. Lee, M. J. Motala, M. A. Meitl, W. R. Childs, E. Menard, A. K. Shim, J. A. Rogers, R. G. Nuzzo, Adv. Mater. 17, 2332 (2005).

[10] M. A. Meitl, Z.-T. Zhu, V. Kumar, K. J. Lee, X. Feng, Y. Y. Huang, I. Adesida, R. G. Nuzzo, and J. A. Rogers, Nat. Mater. 5, 33 (2006).

[11] D. Y. Khang, H. Jiang, Y. Huang and J. A. Rogers, Science 311, 208 (2006).

[12] S. R. Forrest, Nature 428, 911 (2004).

[13] J. A. Rogers, K. E. Paul, R. J. Jackman, G. M. Whitesides, Appl. Phys. Lett. 70, 2658 (1997).

[14] S. Sze., Semiconductor Devices: Physics and Technology 2nd ed. (Wiley, New York, 2002), pp. 190-192.

[1] R. Reuss et al. Proc. IEEE. 2005, 39, 1239.

[2] J. A. Rogers, Z. Bao, K. Baldwin, A. Dodabalapur, B. Crone, V. R. Raju, V. Kuck, H. Katz, K. Amundson, J. Ewing, P. Drzaic, Proc. Nat. Acad. Sci. 2001, 98, 4835.

[3] (a) J. H. Schön, S. Berg, C. Kloc, B. Batlogg, Science 2000, 287, 1022. (b) A. Dodabalapur, L. Torsi, H. E. Katz, Science 1995, 268, 270.

[4] B. S. Ong, Y. Wu, P. Liu, S. Gardner, J. Am. Chem. Soc. 2004, 126, 3378.

[5] S. R. Forrest, Nature, 2004, 428, 911.

[6] C. R. Kagan, D. B. Mitzi, C. D. Dimitrakopoulos, Science 1999, 286, 945.

[7] X. Duan, C. Niu, V. Sahi, J. Chen, J. W. Parce, S. Empedocles, J. L. Goldman, Nature, 2003, 425, 274.

[8] J. Kwon, D. Kim, H. Cho, K. Park, J. Jung, J. Kim, Y. Park, T. Noguchi, IEEE Trans. Electron. 2005, 466, 7.

[9] K. Lee, M. J. Motala, M. A. Meitl, W. R. Childs, E. Menard, A. K. Shim, J. A. Rogers, R. G. Nuzzo, Adv. Mater. 2005, 17, 2336.

[10] Z. Zhu, E. Menard, K. Hurley, R. G. Nuzzo, J. A. Rogers, App. Phys. Lett. 2005, 86, 133507.

[11] M. A. Meitl, Z. Zhu, V. Kumar, K. Lee, X. Feng, Y. Huang, R. G. Nuzzo, J. A. Rogers, Nature Mater. 2006, 5, 33.

[12] D. Khang, H. Jiang, Y. Huang, J. A. Rogers, Science, 2006, 311, 208.

[13] Y. Sun, S. Kim, I. Adesida, J. A. Rogers, App. Phys. Lett. 2005, 87, 083501.

[14] K. Lee, Dr. J. Lee, H. Hwang, J. A. Rogers, R. G. Nuzzo, Small 2005, 1, 1164.

[15] (a) GaN and related Materials (Eds.: S. J. Pearton), Gordon and Breach, New York, 1997. (b) Group III Nitride Semiconductor Compounds (Eds.: B. Gil), Clarendon, Oxford, 1998.

[16] (a) U. Mishra, P. Parikh, Y. Wu, Proc. IEEE. 2002, 90, 1022. (b) S. J. Pearton, J. C. Zolper, R. J. Shul, F. Ren, J. Appl. Phys. 1999, 86, 1. (c) S.C. Jain, M. Willander, J. Narayan, R. Van Overstraeten, J. Appl. Phys. 2000, 87, 965.

[17] M. A. Khan, A. Bhattari, J. N. Kuznia, and D. T. Olson, App. Phys. Lett. 1993, 63, 1214.

[18] Typical Si anisotropic etch ratios in TMAH and H2O mixtures are reported from 12 to 50 in the direction <110>/<111>. Please see to the following references; (a) Fundamentals of Microfabrication, (Ed: M. Madou), CRC Press, New York, 1997. (b) D. L. Kendall, Ann. Rev. Mater. Sci. 1979, 9, 373.

[19] V. Kumar, L. Zhou, D. Selvanathan, and I. Adesida, J. Appl. Phys. 2002, 92, 1712.

[20] Silicon Processing for the VLSI Era, Vol. 1: Process Technology, (Ed: S. Wolf, R. N. Tauber) Lattice Press, 1999.

STATEMENTS REGARDING INCORPORATION BY REFERENCE AND VARIATIONS

The following references relate to self assembly techniques which may be used in methods of the present invention to transfer, assembly and interconnect printable semiconductor elements via contact printing and/or solution printing techniques and are incorporated by reference in their entireties herein: (1) "Guided molecular self-assembly: a review of recent efforts", Jiyun C Huie *Smart Mater. Struct.* (2003) 12, 264-271; (2) "Large-Scale Hierarchical Organization of Nanowire Arrays for Integrated Nanosystems", Whang, D.; Jin, S.; Wu, Y.; Lieber, C. M. *Nano Lett.* (2003) 3(9), 1255-1259; (3) "Directed Assembly of One-Dimensional Nanostructures into Functional Networks", Yu Huang, Xiangfeng Duan, Qingqiao Wei, and Charles M. Lieber, *Science* (2001) 291, 630-633; and (4) "Electric-field assisted assembly and alignment of metallic nanowires", Peter A. Smith et al., *Appl. Phys. Lett.* (2000) 77(9), 1399-1401.

All references throughout this application, for example patent documents including issued or granted patents or equivalents; patent application publications; unpublished patent applications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Any appendix or appendices hereto are incorporated by reference as part of the specification and/or drawings.

Where the terms "comprise", "comprises", "comprised", or "comprising" are used herein, they are to be interpreted as specifying the presence of the stated features, integers, steps, or components referred to, but not to preclude the presence or addition of one or more other feature, integer, step, component, or group thereof. Separate embodiments of the invention are also intended to be encompassed wherein the terms "comprising" or "comprise(s)" or "comprised" are optionally replaced with the terms, analogous in grammar, e.g.; "consisting/consist(s)" or "consisting essentially of/consist(s) essentially of" to thereby describe further embodiments that are not necessarily coextensive.

The invention has been described with reference to various specific and preferred embodiments and techniques. However, it should be understood that many variations and modifications may be made while remaining within the spirit and scope of the invention. It will be apparent to one of ordinary skill in the art that compositions, methods, devices, device elements, materials, procedures and techniques other than those specifically described herein can be applied to the practice of the invention as broadly disclosed herein without resort to undue experimentation. All art-known functional equivalents of compositions, methods, devices, device elements, materials, procedures and techniques described herein are intended to be encompassed by this invention. Whenever a range is disclosed, all subranges and individual values are intended to be encompassed as if separately set forth. This invention is not to be limited by the embodiments disclosed, including any shown in the drawings or exemplified in the specification, which are given by way of example or illustration and not of limitation. The scope of the invention shall be limited only by the claims.

We claim:

1. A method for registered assembly of a plurality of printable semiconductor elements on a receiving surface of a substrate, said method comprising the steps of:
    providing a plurality of printable semiconductor structures having preselected spatial orientations relative to each other; wherein each of said printable semiconductor structures comprises a printable semiconductor element, and a bridge element connected to said printable semiconductor element and connected to a mother wafer, wherein each of said printable semiconductor elements and said bridge elements are at least partially undercut from said mother wafer;
    contacting said printable semiconductor elements with a transfer device having a contact surface, wherein contact between said contact surface and said printable semiconductor elements binds at least a portion of said printable semiconductor elements to said contact surface of said transfer device;
    moving said transfer device in a manner resulting in the fracture of at least a portion of said bridge elements, thereby providing for registered transfer of at least a portion of said printable semiconductor elements from said mother wafer to said transfer device, thereby forming said contact surface having at least a portion of said printable semiconductor elements disposed thereon;
    contacting said receiving surface of said substrate with said printable semiconductor elements disposed on said contact surface; and
    separating said contact surface of said transfer device and said printable semiconductor elements, wherein said printable semiconductor elements are transferred onto said receiving surface, thereby providing for registered assembly of said plurality of printable semiconductor elements on said receiving surface of said substrate.

2. The method of claim 1, wherein said relative spatial orientations of said printable semiconductor elements assembled on said receiving surface are maintained to within 5 microns.

3. The method of claim 1, wherein said relative spatial orientations of said printable semiconductor elements assembled on said receiving surface are maintained to within 0.1 microns.

4. The method of claim 1, wherein said printable semiconductor elements are assembled on to specific regions of said receiving substrate preselected to within 5 microns.

5. The method of claim 1, wherein said printable semiconductor elements are assembled on to specific regions of said receiving substrate preselected to within 500 nanometers.

6. The method of claim 1, wherein said steps of contacting said printable semiconductor elements with a transfer device, moving said transfer device, contacting said receiving surface of said substrate with said printable semiconductor elements disposed on said contact surface and separating said contact surface of said transfer device and said printable semiconductor elements are carried out using dry transfer printing.

7. The method of claim 1, wherein conformal contact is established between said contact surface having said printable semiconductor elements disposed thereon and said receiving surface of said substrate.

8. The method of claim 1, wherein said transfer device is a conformable transfer device.

9. The method of claim 1, wherein said bridge elements, said printable semiconductor elements and said mother wafer comprise a unitary structure.

10. The method of claim 1, wherein said bridge elements are connected to said printable semiconductor elements via an adhesive.

11. The method of claim 1, wherein said bridge elements are connected to said mother wafer via an adhesive.

12. The method of claim 1, wherein said bridge elements are connected to said printable semiconductor elements via an adhesive and wherein said bridge elements are connected to said mother wafer via an adhesive.

13. The method of claim 1, wherein a plurality of said bridge elements are connected to each of said printable semiconductor elements.

14. The method of claim 1, wherein each of said bridge elements has an average width selected from the range of 100 nanometers to 1000 microns, an average thickness selected from the range of 1 nanometers to 1000 microns and an average length selected from the range of 100 nanometers to 1000 microns.

15. The method of claim 1, wherein each of said bridge elements has an average width that is at least 2 times smaller than the average width of the printable semiconductor element to which it is connected.

16. The method of claim 1, wherein each of said bridge elements has an average width that is at least 10 times smaller than the average width of the printable semiconductor element to which it is connected.

17. The method of claim 1, wherein each of said bridge elements has an average thickness that is 1.5 times smaller than the average thickness of the printable semiconductor element to which it is connected.

18. The method of claim 1, wherein said printable semiconductor elements are functionalized to enhance said registered transfer to said transfer device.

19. The method of claim 1, wherein each of said printable semiconductor elements comprises a semiconductor ribbon extending a length along a principle longitudinal axis terminating in a first end and a second end, wherein said bridge element is connected to said first end and an additional bridge element is connected to said second end and to said mother wafer.

20. The method of claim 1 comprising a method of making an array of light emitting diodes or an array of solar cells.

21. The method of claim 1 comprising a method of making an array of diodes, an array of transistors or an integrated electronic circuit.

22. The method of claim 8, wherein said transfer device is an elastomeric stamp.

23. The method of claim 8, wherein said transfer device is a PDMS stamp.

24. The method of claim 18, wherein hydrophilic groups are added to the surfaces of the printable semiconductor elements or wherein the surfaces of the printable semiconductor elements are coated with a metal to enhance bonding to the contact surface of said transfer device.

* * * * *